United States Patent
Harada et al.

(10) Patent No.: US 6,417,575 B2
(45) Date of Patent: Jul. 9, 2002

(54) SEMICONDUCTOR DEVICE AND FABRICATION PROCESS THEREFOR

(75) Inventors: Shigeru Harada; Takeru Matsuoka; Hiroki Takewaka, all of Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 3 days.

(21) Appl. No.: 09/726,599

(22) Filed: Dec. 1, 2000

(30) Foreign Application Priority Data

Jun. 7, 2000 (JP) ........................................ 2000-170332

(51) Int. Cl.⁷ ..................... H01L 23/48; H01L 23/52; H01L 29/40
(52) U.S. Cl. .................. 257/784; 257/758; 257/786
(58) Field of Search ............................... 257/758, 784, 257/786, 737

(56) References Cited

U.S. PATENT DOCUMENTS

| 5,939,790 A | * | 8/1999 | Gregoire et al. | ............ 257/784 |
| 5,986,343 A | * | 11/1999 | Chittipeddi et al. | ......... 257/758 |
| 6,229,221 B1 | * | 5/2001 | Kloen et al. | ................. 257/784 |
| 2001/0010408 A1 | * | 8/2001 | Ker et al. | .................... 257/786 |

FOREIGN PATENT DOCUMENTS

JP      2-285649     * 11/1990

OTHER PUBLICATIONS

"VLSI Technology", edited by S.M. Sze, pp. 554–571.

"Sub–0.25µm CMOS ULSI Technology with Multilevel Copper Interconnections" by Edelstein et al., Latest Development in Cu Interconnect Technology, May 30, 1998, pp. 207–219.

"Outline of Manufacturing Steps Related to Cu Process" by Hoshino, Latest Development in Cu Interconnect Technology, May 30, 1998, pp. 220–223.

* cited by examiner

Primary Examiner—Phat X. Cao
(74) Attorney, Agent, or Firm—McDermott, Will & Emery

(57) ABSTRACT

A semiconductor device includes a pad electrode and a main electrode layer of the pad electrode has a plan view shape of one selected from the group consisting of a near circle, a near ellipse, a near polygon with at least one internal angle larger than 90 degrees and a near polygon with at least one corner chamfered or rounded. The main electrode layer is connected to a lower electrode layer beneath the man electrode layer via a connection hole interposed therebetween and a lower protruding section is provided beneath the lower electrode layer. A stress buffer insulating partition and a stress buffer protruding section are more preferably provided at corners of the layers, connection hole and lower protruding section.

12 Claims, 73 Drawing Sheets

SEMICONDUCTOR DEVICE AND FABRICATION PROCESS THEREFOR

BACKGROUND OF THE INVENTION

1. Field of the Invention

This invention relates to a semiconductor device and a fabrication process therefor and particularly, to a semiconductor device having a structure of a pad electrode used as an electrode to connect a semiconductor element on a semiconductor substrate to an external terminal and a fabrication process therefor.

2. Description of the Background Art

In a semiconductor device, wiring made of copper (Cu) as a main ingredient with lower resistivity and higher reliability has been adopted instead of conventional wiring made of aluminum (Al) as a main ingredient for purposes of reduction in wiring delay (reduction in wiring resistance) and increase in a wiring allowable current density such that a high speed operation and high performance of the device are realized.

A pad electrode is generally formed using a metal wiring in the uppermost layer simultaneously with when the wiring is formed, and a wire is directly bonded to the pad electrode for connection to an external terminal by means of a wire bonding method, or alternatively with a flip-chip mounting method, after a connection electrode such as a bump electrode is formed, connection is made from the pad electrode to an external terminal through the connection electrode. Since copper in use as wiring material is poor in adaptation to microfabrication in dry etching, a buried wiring (Damascene) technique adopting a chemical mechanical polishing (CMP) process has mainly employed in formation of an wiring. Therefore, a bonding pad electrode is also generally formed using the buried wiring method.

FIGS. 122A and 122B, show an example of a sectional structure of a conventional semiconductor device using such a copper wiring.

As shown in FIG. 122B, on a semiconductor substrate 1, an element isolation insulating film 2, a gate insulating film 3, a gate electrode 4 and an impurity diffused layer 5 are formed to construct a MOS (metal oxide semiconductor) transistor 6. A bottom insulating film 7 is formed on the MOS transistor 6 and a contact hole 8 is formed in the bottom insulating film 7 so as to penetrate through the bottom insulating film 7 from a first metal (W) wiring layer 10 including a first wiring trench 9 downward. A first interlayer insulating film 11 is further formed on the bottom insulating film 7 and a first via hole 12 is formed in the first interlayer insulating film 11 so as to penetrate through the first interlayer insulating film 11 from a second metal (Cu) wiring layer 14 including a second wiring trench 13 downward. A second interlayer insulating film 15 is formed on the first interlayer insulating film 11 and a second via hole 16 is still further formed in the second interlayer insulating film 15 so as to penetrate through the second interlayer insulating film 15 from a third metal (Cu) wiring layer 18 including a third wiring trench 17 downward. Part of the third metal (Cu) wiring layer 18 serves as a pad electrode 19. While on the second interlayer insulating film 15, a protective insulating film 20 and a buffer coat film 21 are formed to cover the second interlayer insulating film 15, the pad electrode 19 is exposed in a pad electrode opening 22 at a site corresponding to the electrode 19.

Description will be given of a fabrication process for a conventional semiconductor device shown in FIGS. 122A and 122B with reference to FIGS. 123 to 132.

In this example, an wiring layer has a three-layer metal wiring structure stacked with a tungsten (W) wiring and two copper layers, and a pad electrode is formed with a copper wiring in the uppermost layer. Please note that in this case, a process called Dual Damascene process is adopted as example, in which each metal wiring layer has a connection hole and an wiring trench formed in advance and after the hole or the trench is filled with a metal film, unnecessary portions of the metal film are removed by chemical mechanical polishing (CMP) process.

As shown in FIG. 123, on a semiconductor substrate 1, fabricated is a semiconductor element 6 such as a MOS transistor composed of an element isolation insulating film 2, a gate insulating film 3, a gate electrode 4 and an impurity diffused layer 5. Then, bottom insulating film 7 of a three-layer structure is formed over all the surface of the semiconductor element 6 by stacking sequentially films to be included in the bottom insulating film 7: a silicon oxide film (SiO), an insulating film 7a made of a silicon oxide film or the like including impurity such as phosphorus (P) or boron (B); a silicon nitride film (SiN) 7b as an etching stopper layer used in wiring trench processing, and an insulating film 7c such as a silicon oxide film (SiO) for forming an wiring trench therein by means of a method such as a thermal CVD (Chemical Vapor Deposition) method, a plasma CVD method or the like.

As shown in FIG. 124, a contact hole 8 and a first wiring trench 9 are formed in the bottom insulating film 7 at a desired site thereon using photolithography and an etching technique. At this time, the silicon nitride film (SiN) 7b works as a stopper film when the first wiring trench 9 is processed since a etching selectivity to the silicon oxide film 7c is higher than that to the silicon nitride (SiN) 7b.

As shown in FIG. 125, a barrier metal film 10a and a tungsten (W) film 10b are deposited over all the surface such that the contact hole 8 and the first wiring trench 9 are filled with the films 10a and 10b. As the barrier metal film 10a, for example, a stacked layer including a titanium (Ti) film of 5 to 50 nm thick and a titanium nitride film (TiN) film of 10 to 100 nm thick is employed in order to attain a good ohmic contact with the impurity diffused layer 5 of the semiconductor element 6 and the stacked layer is deposited by a PVD (Physical Vapor Deposition) method or a CVD method. On the other hand, the tungsten (W) film 10b is deposited by a thermal CVD method using a reduction reaction between tungsten hexafluoride (WFG) and hydrogen ($H_2$).

As shown in FIG. 126, the tungsten film 10b and the barrier metal (TiN/Ti) film 10a other than those in the contact hole 8 and the first wiring trench 9 are removed by means of, for example, a chemical mechanical polishing (CMP) process using an alumina polishing agent with hydrogen peroxide ($H_2O_2$) as a base to form a first buried metal (W) wiring layer 10. A thickness of the tungsten wiring layer 10 generally ranges approximately from 100 to 300 nm.

As shown in FIG. 127, on the first metal (W) wiring layer 10, a first interlayer insulating film 11 of a three-layer structure is formed by stacking sequentially films to be included in the first interlayer insulating film 11: an insulating film 11a such as silicon oxide film (SiO), a silicon nitride film (SiN) 11b and an insulating film 11c such as a silicon oxide film (SiO) using a plasma CVD method or the like. Moreover, photolithography and an etching technique are adopted to form a first via hole 12 and a second wiring trench 13 in the first interlayer insulating film 11 at a desired site thereon As shown in FIG. 128, an underlying film 14a and copper (Cu) films 14b and 14c are deposited over all the surface such that the first via hole 12 and the second interconnect trench 13 are filled with the films 14a, 14b and 14c. The underlying film 14a has a function to prevent copper (Cu) from diffusing into a silicon oxide film or the like adjacent to the copper (Cu) films 14b and 14c and is generally formed by stacking a tantalum (Ta) film, a Tantalum nitride (TaN) film, a stacked film of tantalum and tantalum nitride (TaN/Ta), a Titanium nitride (TiN) film, or a stacked film of titanium and titanium nitride (TiN/Ti) to a thickness approximately in the range of 10 to 100 nm using a PVD method or a CVD method. Then, a copper seed film 14b as an underlying film for electroplating is deposited over all the surface using a PVD method or a CVD method and thereafter, an electroplated Cu film 14c is formed to a thickness approximately of 500 to 1000 nm by means of an electroplating method with, for example, a plating solution including copper sulfate as a main ingredient.

As shown in FIG. 129, the copper (Cu) films 14c and 14b and the underlying film 14a other than those in the first via hole 12 and the second wiring trench 13 are removed by: a chemical mechanical polishing (CMP) method using, for example, an alumina polishing agent including hydrogen peroxide ($H_2O_2$) as a base to form a second buried metal (Cu) wiring layer 14. A thickness of a copper wiring layer is generally on the order of from 300 to 500 nm, though depending on a kind of application.

As shown in FIG. 130, on the second metal wiring layer 14, a second interlayer insulating film 15 of a four-layer structure is formed by stacking sequentially films to be included in the second interlayer insulating film 15: a silicon nitride 15a as a copper-diffusion preventive film, an insulating film 15b such as a silicon oxide film, a silicon nitride film 15c and an insulating film 15d such as silicon oxide film, using a plasma CVD method or the like. A second via hole 16 and a third wiring trench 17 are formed in the second interlayer insulating film 15 at a desired site thereon using photolithography and an etching technique. An underlying film 18a and a copper seed film 18b, and a copper plated film 18c are deposited over all the surface to a thickness of the order in the range of 1.5 to 3.0 $\mu$m such that the second via hole 16 and the third wiring trench 17 are filled with the films 18a, 18b and 18c using a similar method of the above described method and thereafter, the copper films 18c and 18b and the underlying film 18a other than those in the second via hole 16 and the third wiring trench are removed using a chemical mechanical polishing process to form a third buried metal (Cu) wiring layer 18. Herein, please note that a pad electrode 19 for connection to an external terminal in a metal wiring layer as the uppermost layer is also simultaneously formed. As the metal wiring layer as the uppermost layer, a metal (Cu) wiring of a relatively thick film of the order of from 0.8 to 1.5 $\mu$m is adopted taking wire bondability into consideration.

As shown in FIG. 131, on the third metal (Cu) wiring 18, a dense silicon nitride film (SiN) 20a as a copper (Cu)-diffusion preventive layer 20a is deposited and thereafter, a protective insulating film 20b, such as a silicon nitride film (SiN), a silicon oxide film (SiO), a silicon oxynitride film (SiON) or a stacked structure film thereof, is stacked to a thickness of the order of 1.0 $\mu$m. Please note that since a silicon nitride film used as the protective insulating film 20b is required to reduce a film stress in order to decrease bowing of the semiconductor substrate and prevent an excessive load from being imposed on a metal wiring, therefore a film density is smaller than that of the silicon-nitride film (SiN) 20a used as the copper-diffusion preventive layer. Then, on the protective insulating film 20b, a buffer coat film 21 such as made of polyimide is formed to a thickness of the order of from 5 to 10 $\mu$m as a second protective insulating film depending on a necessity and an opening 22 is formed in the films at a desired site thereon for the pad electrode 19 in order to form connection to an external terminal (not shown) using a wire boding method or the like method.

The semiconductor substrate 1 is divided into chips and the back side of each chip is forced to adhere to a lead frame or a mounting substrate with resin or solder (not shown). As shown in FIG. 132, a gold (Au) or copper (Cu) wire 23 is bonded to an exposed portion of a copper wiring layer in the pad electrode opening 22 using a method of ultrasonic wave or thermo-compression to form an intermetallic compound layer (in a case of Cu pad electrode and an Au wire), or alternatively, an interdiffusion film (in a case of a Cu pad electrode and a Cu wire) 24 at a connection interface between the pad electrode 19 and the bonding wire 23. At the final stage; the entire structure is sealed in a mold resin 25, thereby enabling a conventional semiconductor device.

In a case where a pad electrode is formed in the buried wiring structure fabricated using the above described process, however, a hard underlying film 61a is present at the bottom and side walls of the pad electrode 61 and strongly adheres to an insulating film surrounding the pad electrode 61 and therefore, as shown in FIGS. 134 and 135, a problem has arisen in that a load or an impact force acting when the wire bonding is performed is transmitted directly to the surrounding insulating film, resulting in easy production of cracks in the insulating film.

In a case where a pad electrode 51, as shown in FIG. 133, is formed using a method in which to pattern with a dry etching method, for example, no hard underlying film 51a is present on the side walls of the pad electrode 51 and a thickness of a protective insulating film 52 covering the side walls of the pad electrode 51 is also relatively small. Moreover, a mechanical elasticity of a buffer coat film 53 such as made of polyimide on the protective insulating film 52 is large. Hence, when a wire 55 is bonded to the pad electrode 51, the pad electrode 51 is slightly deformed in a lateral direction and thereby, exerts a buffer action against a load 56 or an impact force 57 even if the force and the load are actually imposed, such that no cracking occurs in an interlayer insulating film 50 and a protective insulating film 52.

On the other hand, in a case of a pad electrode 61, as shown in FIG. 134, which is formed using a buried wiring process such as the Damascene method, a hard underlying film 61a is present at both of the bottom and side walls of the pad electrode 61 and strongly adheres to an interlayer insulating film 60 covering all the surrounding region of the pad electrode 61. Hence, if a load 66 or impact force 67 is imposed on the pad electrode 61 when a wire 65 is bonded to the pad electrode 61, the load or impact force is transmitted directly to the interlayer insulating film 60 thereround. In this case, a problem has arisen in that a stress (impact force) is concentrated especially at a corner 68 of the pad electrode 61 and a crack 69 occurs in the interlayer insulating film 60, which in turn causes separation of or reduction in a strength of a bonding wire 65, or alternatively, produces inconvenience such as a loss of reliability.

Even in a case where a connection electrode such as a bump electrode is provided on a pad electrode, a load or impact force is imposed through the bump electrode when bonding with an external terminal is effected and therefore, a problem has again arisen in that cracks are produced in an interlayer insulating film, in a manner similar to the above described case.

It is accordingly an object of the present invention is to provide a semiconductor device having a pad electrode hard to cause cracks in an insulating film therearound even when a load or impact force is imposed on the pad electrode through a bump electrode in a case where an external terminal is bonded to the pad electrode.

SUMMARY OF THE INVENTION

In order to achieve the above described object, an aspect of the invention is directed to a semiconductor device including: a pad electrode including: a pad section made of substantially a conductive electrode material; and an underlying film covering at least part of the pad section at least at a bottom and a side wall of the pad section, wherein a material of the underlying film is harder than the electrode material and at least part of an upper surface of the pad section is exposed for connection to a wire, a shape of a plan view of the pad electrode is one selected from the group consisting of a near circle, a near ellipse, a near polygon with at least one internal angle larger than 90 degrees and a near polygon with at least one corner chamfered or rounded, the pad electrode includes a lower protruding section protruding downward from the pad electrode, the lower protruding section having a cross-sectional area smaller than the pad electrode and a shape of a plan view of the lower protruding section is one selected from the group consisting of a near circle, a near ellipse, a near polygon with at least one internal angle larger than 90 degrees and a near polygon with at least one corner chamfered or rounded.

With the above described structure adopted, the lower protruding section is added to the pad electrode and thereby, an effective thickness of the pad electrode is larger, such that an impact force produced when wire boding is effected can be alleviated. Moreover, since the lower protruding section has the above described shape of a plan view, stress concentration at a corner of the lower protruding section is also alleviated. Accordingly, wire boding can be effected in a stable manner under a condition to enable a strength required for connection with an external terminal to be ensured.

Another aspect of the invention is directed to a semiconductor device including: a pad electrode including: a pad section made of substantially a conductive electrode material; and an underlying film covering at least part of the pad section at least at a bottom and a side wall of the pad section, wherein a material of the underlying film is harder than the electrode material and at least part of an upper surface of the pad section is exposed for connection to a wire, a shape of a plan view of the pad electrode is one selected from the group consisting of a near circle, a near ellipse, a near polygon with at least one internal angle larger than 90 degrees and a near polygon with at least one corner chamfered or rounded, the pad electrode includes a main electrode layer made of the electrode material and an upper electrode layer contacting an upper surface of the main electrode layer, and a shape of a plan view of the upper electrode layer is one selected from the group consisting of a near circle, a near ellipse, a near polygon with at least one internal angle larger than 90 degrees and a near polygon with at least one corner chamfered or rounded.

With the above described structure adopted, the pad electrode has a two-layer superimposing structure composed of the main electrode layer and the upper electrode layer and thereby, an effective thickness of the pad electrode is larger, such that an impact force produced when wire boding is effected can be alleviated. Moreover, since the main electrode layer and the upper electrode layer have both the above described shape of a plan view, stress concentration at corners thereof is also alleviated. Accordingly, cracking can be prevented from occurring in the interlayer insulating film.

Still another aspect of the invention is directed to a semiconductor device including: a pad electrode including: a pad section made of substantially a conductive electrode material; and an underlying film covering at least part of the pad section at least at a bottom and a side wall of the pad section, wherein a material of the underlying film is harder than the electrode material and at least part of an upper surface of the pad section is exposed for connection to a wire, a shape of a plan view of the pad electrode is one selected from the group consisting of a near circle, a near ellipse, a near polygon with at least one internal angle larger than 90 degrees and a near polygon with at least one corner chamfered or rounded, the pad electrode includes a main electrode layer made of the electrode material and a lower electrode layer connected to the main electrode layer, on the lower side of the main electrode layer, with a connection hole interposed therebetween, the connection hole having an outer periphery of a shape along and in the inside vicinity of the outer periphery of the shape of a plan view of the main electrode layer, and a shape of a plan view of at least one of the lower electrode layer, and the connection hole is one selected from the group consisting of a near circle, a near ellipse, a near polygon with at least one internal angle larger than 90 degrees and a near polygon with at least one corner chamfered or rounded.

With the above described structure adopted, an effective thickness of the pad electrode is larger, such that an impact force produced when wire boding is effected can be alleviated. Moreover, stress concentration at corners of the lower electrode layer and the connection hole where stress is concentrated with ease is reduced by a great margin compared with a tetragon having a sharp corner. Accordingly, cracking can be prevented from occurring in the interlayer insulating film.

In the above described aspect of the invention, preferably, the lower electrode layer includes a lower protruding section protruding downward from the lower electrode layer, said lower protruding section having a cross-sectional area smaller than the lower electrode layer and a shape of a plan view of the lower protruding section is one selected from the group consisting of a near circle, a near ellipse, a near polygon with at least one internal angle larger than 90 degrees and a near polygon with at least one corner chamfered or rounded.

With the above described structure adopted, an effective thickness of the pad electrode is larger, such that stress concentration at a corner of the lower protruding section can be alleviated when wire boding is effected. Accordingly, cracking can be prevented from occurring in the interlayer insulating film.

A still another aspect of the present invention is directed to a semiconductor device including: a pad electrode including: a pad section substantially made of a conductive electrode material; and an underlying film covering at least part of the pad section at least at a bottom and a side wall of the pad section, wherein a material of the underlying film is harder than the electrode material and at least part of an upper surface of the pad section is exposed for connection to a wire, and the pad electrode includes a stress buffer insulating partition dividing the pad section in a corner region thereof.

With the above described structure adopted, the stress buffer insulating partition 301 receives a small elastic deformation and thereby a stress is buffered at a corner of the pad electrode where stress concentration occurs with ease, even when a load or impact force is imposed when wire boding is effected, with the result that only a small stress (impact force) is imposed in the interlayer insulating film around the corner of the pad electrode. Accordingly, cracking can be prevented from occurring in the interlayer insulating film around the corner of the pad electrode.

In an aspect described above of the present invention, the lower protruding section preferably includes a stress buffer insulating partition dividing the pad section in a corner region thereof.

With the above described structure adopted, the stress buffer insulating partition receives a small elastic deformation and thereby a stress is buffered at a corner of the lower protruding section where stress concentration occurs with ease, even when a load or impact force is imposed when wire boding is effected, with the result that only a small stress (impact force) is imposed in the interlayer insulating film around the corner of the lower protruding section. Accordingly, cracking can be prevented from occurring in the interlayer insulating film around the corner of the lower protruding section.

In an aspect described above of the present invention, the main electrode layer preferably includes a stress buffer insulating partition dividing the pad section in a corner region thereof.

With the above described structure adopted, the stress buffer insulating partition receives a small elastic deformation and thereby a stress is buffered at a corner of the main. electrode layer where stress concentration occurs with ease, even when a load or impact force is imposed when wire boding is effected, with the result that only a small stress (impact force) is imposed in the interlayer insulating film around the corner of the main electrode layer. Accordingly, cracking can be prevented from occurring in the interlayer insulating film around the corner of the main electrode layer.

In an aspect described above of the present invention, at least one of the lower electrode layer and the connection hole preferably includes a stress buffer insulating partition dividing the pad section in a corner region thereof.

With the above described structure adopted, the stress buffer insulating partition receives a small elastic deformation and thereby a stress is buffered at corners of the lower:electrode layer and the connection hole where stress concentration especially occurs with ease, with the result that only a small stress (impact force) is imposed in the interlayer insulating film around the corners of the lower electrode layer and the connection hole. Accordingly, cracking can be prevented from occurring in the interlayer insulating film around the corners of the lower electrode layer and the connection hole.

In an aspect described above of the present invention, the lower protruding section preferably includes a stress buffer insulating partition dividing the pad section in a corner region thereof.

With the above described structure adopted, the stress buffer insulating partition receives a small elastic deformation and thereby a stress is buffered at a corner of the lower protruding section of the lower electrode layer, with the result that only a small stress (impact force) is imposed in the interlayer insulating film around the corner of the lower protruding section. Accordingly, cracking can be prevented from occurring in the interlayer insulating film around the corner of the lower protruding section.

A still another aspect of the present invention is directed to a semiconductor device including: a pad electrode including: a pad section made of substantially a conductive electrode material; and an underlying film covering at least part of the pad section at least at a bottom and a side wall of the pad section, wherein a material of the underlying film is harder than the electrode material and at least part of an upper surface of the pad section is exposed for connection to a wire, and the pad electrode includes a stress buffer protruding section protruding at a corner of the pad electrode.

With the above described structure adopted, the stress buffer protruding section receives a small elastic deformation and thereby a stress (impact force) is buffered at a corner of the pad electrode where stress concentration especially occurs with ease, even when a load or impact force is imposed on the electrode 101 by bonding or the like, with the result that only a small stress (impact force) is imposed in the interlayer insulating film around the corner of the pad electrode. Accordingly, cracking can be prevented from occurring in the interlayer insulating film around the corner of the pad electrode 101.

In an aspect as described above of the invention, the lower protruding section preferably includes a stress buffer protruding section at a corner thereof.

With the above described structure adopted, the stress buffer protruding section receives a small elastic deformation and thereby a stress (impact force) is buffered at a corner of the lower protruding section where stress concentration especially occurs with ease, even when a load or impact force is imposed on the electrode in wire boding, with the result that only a small stress (impact force) is imposed in the interlayer insulating film around the corner of the lower protruding section. Accordingly, cracking can be prevented from occurring in the interlayer insulating film around the corner of the lower protruding section.

In an aspect described above of the invention, the main electrode layer preferably includes a stress buffer protruding section at a corner thereof.

With the above described structure adopted, the stress buffer protruding section receives a small elastic deformation and thereby a stress (impact force) is buffered at a corner of the main electrode layer where stress concentration especially occurs with ease, even when a load or impact force is imposed on the pad electrode in wire boding, with the result that only a small stress (impact force) is imposed in the interlayer insulating film around the corner of the main electrode layer. Accordingly, cracking can be prevented from occurring in the interlayer insulating film around the corner of the main electrode layer.

In an aspect described above of the invention, at least one of the lower electrode layer and the connection hole preferably includes a stress buffer protruding section protruding at a corner thereof.

With the above described structure adopted, the stress buffer protruding section receives a small elastic deformation and thereby a stress (impact force) is buffered at corners of the lower electrode layer and the connection hole where stress concentration especially occurs with ease, even when a load or impact force is imposed on the pad electrode in wire boding, with the result that only a small stress (impact force) is imposed in the interlayer insulating film around the corners of the lower electrode layer and the connection hole. Accordingly, cracking can be prevented from occurring in the interlayer insulating film around the corners of the lower electrode layer and the connection hole.

In an aspect described above of the invention, the lower protruding section preferably includes a stress buffer protruding section protruding at a corner thereof.

With the above described structure adopted, the stress buffer protruding section receives a small elastic deformation and thereby a stress (impact force) is buffered at a corner of the lower protruding section of the lower electrode layer where stress concentration especially occurs with ease, even when a load or impact force is imposed on the pad electrode in wire boding, with the result that only a small stress (impact force) is imposed in the interlayer insulating film around the corner of the lower protruding section of the lower electrode layer. Accordingly, cracking can be prevented from occurring in the interlayer insulating film around the corner of the lower protruding section of the lower electrode layer.

An aspect of the invention is directed to a fabrication process for a semiconductor device includes: a recess forming step of forming a recess whose shape of a plan view is one selected from the group consisting of a near circle, a near ellipse, a near polygon with at least one internal angle larger than 90 degrees and a near polygon with at least one corner chamfered or rounded; an underlying film forming step of forming an underlying film covering at least part of an inner surface of the recess; and pad section forming step of filling the recess covered by the insulating film with a conductive electrode material, wherein the recess forming section includes: a step of forming a first recess; and a step of forming a second recess deeper than the first recess in a part of the first recess.

With the above described procedure adopted, since the pad section having the shape of a plan view and including the lower protruding section is formed, there can be obtained a semiconductor device capable of preventing cracking in the interlayer insulating film from occurring.

Another aspect of the invention is directed to a fabrication process for a semiconductor device includes: a recess forming step of forming a recess whose shape of a plan view is one selected from the group consisting of a near circle, a near ellipse, a near polygon with at least one internal angle larger than 90 degrees and a near polygon with at least one corner chamfered or rounded; an underlying film forming step of forming an underlying film covering at least part of an inner surface of the recess; and a pad section forming step of filling the recess covered by the insulating film with a conductive electrode material, wherein the recess forming section includes: a step of forming a main part of the recess constituting a body of the pad section; and a step of forming an insulating partition recess for forming a stress buffer insulting partition in a corner region of the main part of the recess.

With the above described procedure adopted, since the pad section having the shape of a plan view and including the stress buffer insulating partition is formed, there can be obtained a semiconductor device capable of preventing cracking in the interlayer insulating film from occurring.

Still another aspect of the invention is directed to a fabrication process for a semiconductor device includes: a recess forming step of forming a recess whose shape of a plan view is one selected from the group consisting of a near circle, a near ellipse, a near polygon with at least one internal angle larger than 90 degrees and a near polygon with at least one corner chamfered or rounded; an underlying film forming step of forming an underlying film covering at least part of an inner surface of the recess; and a pad section forming step of filling the recess covered by the insulating film with a conductive electrode material, wherein the recess forming section includes: a step of forming a main part of the recess constituting a body of the pad section; and a step of forming a buffer recess for forming a stress buffer protruding section protruding at a corner of the main part of the recess.

With the above described procedure adopted, since the pad section having the shape of a plan view and including the stress buffer protruding section is formed, there can be obtained a semiconductor device capable of preventing cracking in the interlayer insulating film from occurring.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 86B is a sectional view taken on line LXXXVIB—LXXXVIB of FIG. 86A as viewed in the direction of arrows and FIG. 86C is a sectional view of the semiconductor device;

FIG. 119 is a plan view of a main part of a third other example of the semiconductor device in the fifteenth embodiment according to the invention;

FIG. 120A is a plan view of a main part of a fourth other example of the semiconductor device in the fifteenth embodiment according to the invention and FIG. 120B is a sectional view taken on line CXXB—CXXB of FIG. 120A as viewed in the direction of arrows;

FIG. 121 is a plan view of a main part of a fifth other example of the semiconductor device in the fifteenth embodiment according to the invention;

FIG. 122A is a plan view of a semiconductor device according to a conventional technique and FIG. 122B is a sectional view of the semiconductor device;

FIG. 123 is a sectional view illustrating a first step of a fabrication process for a semiconductor device according to a conventional technique;

FIG. 124 is a sectional view illustrating a second step of the fabrication process for a semiconductor device according to a conventional technique;

FIG. 125 is a sectional view illustrating a third step of the fabrication process for a semiconductor device according to a conventional technique;

FIG. 126 is a sectional view illustrating a fourth step of the fabrication process for a semiconductor device according to a conventional technique;

FIG. 127 is a sectional view illustrating a fifth step of the fabrication process for a semiconductor device according to a conventional technique;

FIG. 128 is a sectional view illustrating a sixth step of the fabrication process for a semiconductor device according to a conventional technique;

FIG. 129 is a sectional view illustrating a seventh step of the fabrication process for a semiconductor device according to a conventional technique;

FIG. 130 is a sectional view illustrating a eighth step of the fabrication process for a semiconductor device according to a conventional technique;

Figure 131:
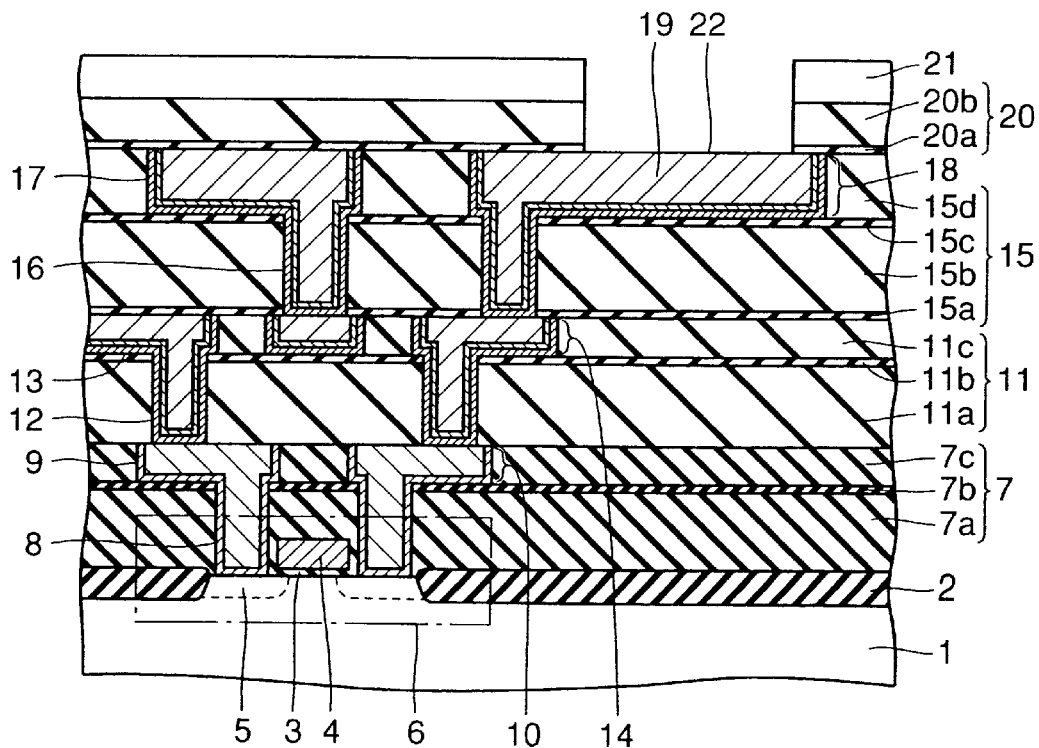
Figure 132:
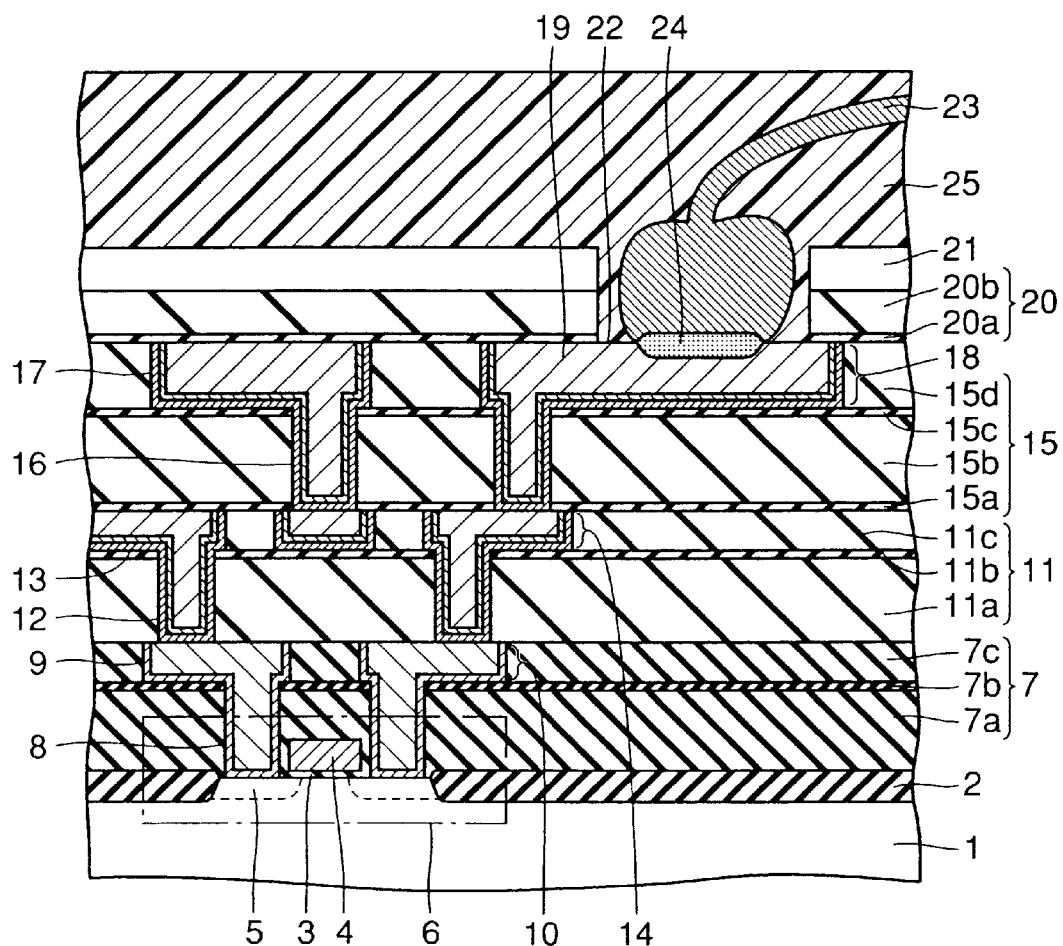
Figure 133:
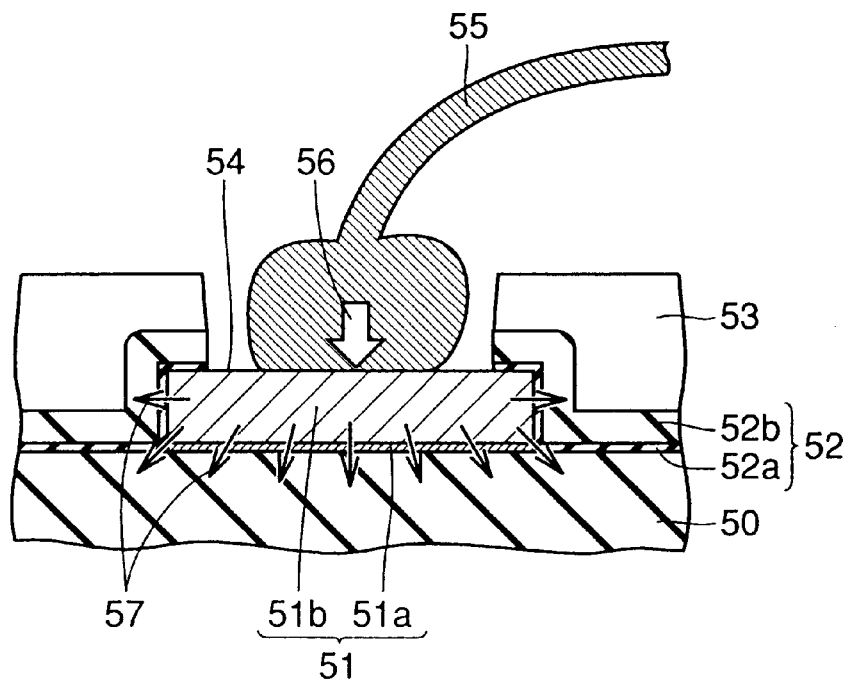
Figure 134:
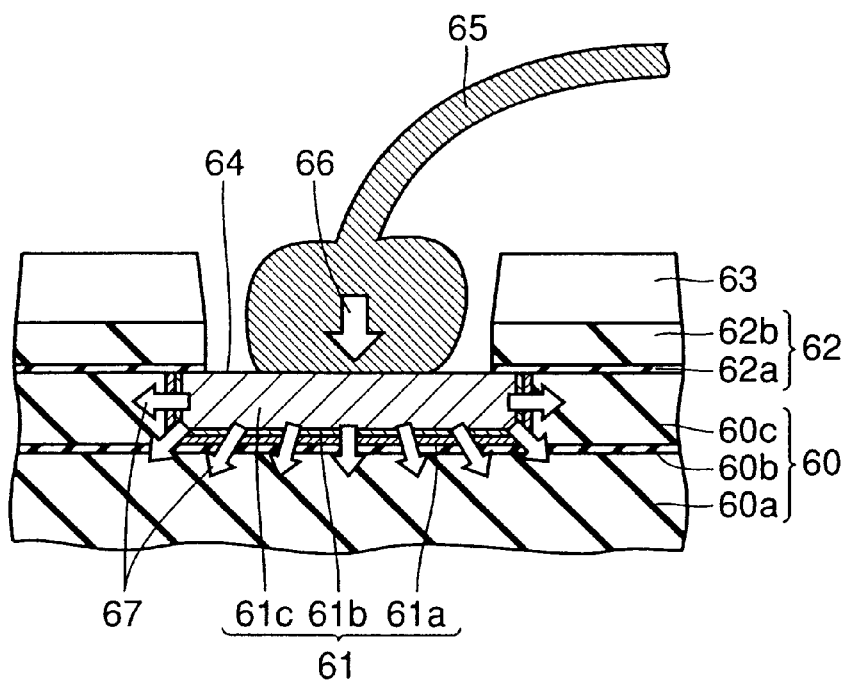
Figure 135:
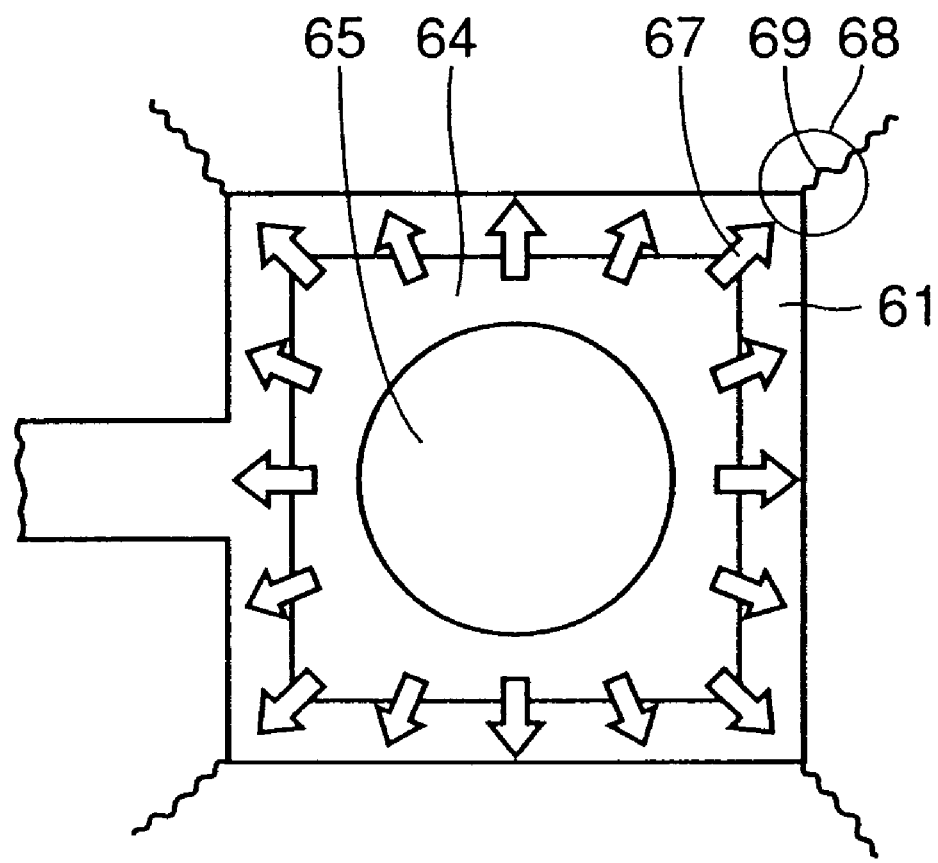

FIG. 131 is a sectional view illustrating a ninth step of the fabrication process for a semiconductor device according to a conventional technique;

FIG. 132 is a sectional view illustrating a tenth step of the fabrication process for a semiconductor device according to a conventional technique;

FIGS. 133 and 134 are sectional views illustrating ways to transmit impact forces to semiconductor devices according to a conventional technique; and FIG. 135 is a plan view illustrating a way to transmit an impact force to a semiconductor device according to a conventional technique.

DESCRIPTION OF THE PREFERRED EMBODIMENTS

The invention is to make cracking occur with difficulty in an insulating film around and at a corner of a pad electrode formed using a buried interconnection method adopted as a forming method for a copper interconnect or the like even when a load or impact force is imposed on the pad electrode in a step of connection to an external terminal using wire bonding or the like.

First Embodiment

Figure 1A:
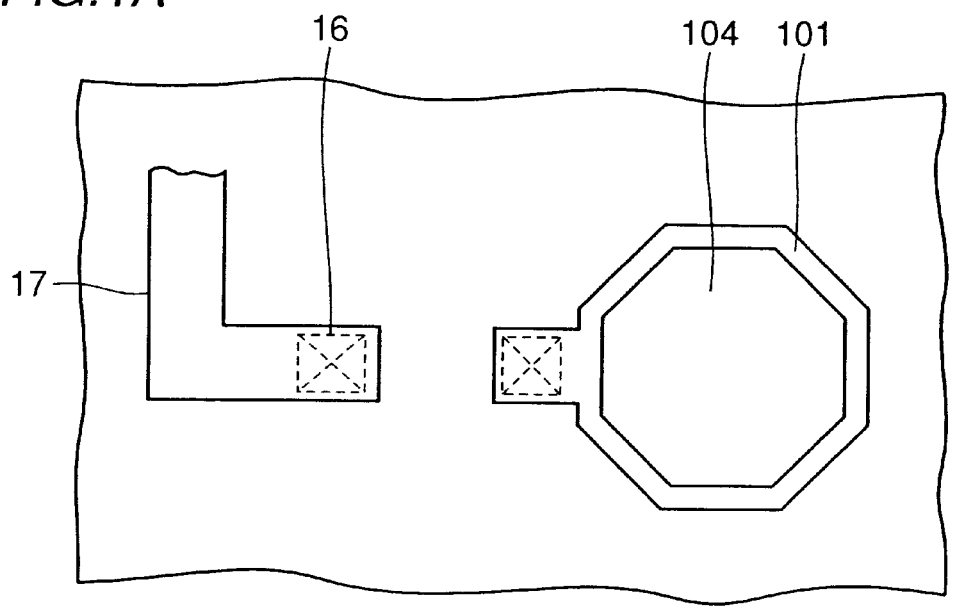
FIG. 1A is a plan view of a semiconductor device in a first embodiment according to the invention and FIG. 1B is a sectional view of the semiconductor device.
Figure 1B:
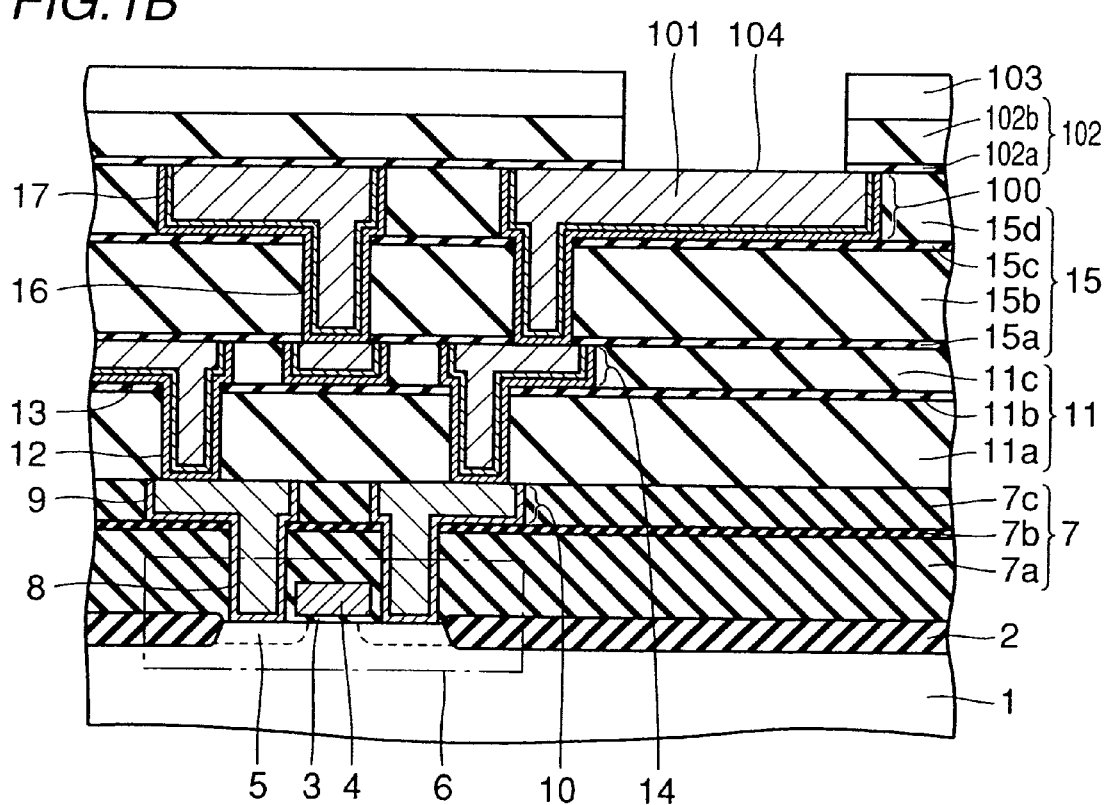

In FIGS. 1A and 1B, shown are sectional structures of a semiconductor device in the first embodiment.

As shown in FIG. 1B, on a semiconductor substrate 1, an element isolation insulating film 2, a gate insulating film 3, a gate electrode 4 and a impurity diffused layer 5 are formed to construct a MOS transistor 6. An bottom insulating film 7 is formed on the MOS transistor 6 and a contact hole 8 is formed in the bottom insulating film 7 so as to penetrate through the bottom insulating film 7 from a first metal (W) interconnect layer 10 including a first interconnect trench 9 downward. A first interlayer insulating film 11 is further formed on the bottom insulating film 7 and a first via hole 12 is formed in the first interlayer insulating film 11 so as to penetrate through the first interlayer insulating film 11 from a second metal (Cu) interconnect layer 14 including a second interconnect trench 13 downward. A second interlayer insulating film 15 is formed on the first interlayer insulating film 11 and a second via hole 16 is still further formed in the second interlayer insulating film 15 so as to penetrate through the second interlayer insulating film 15 from a third metal (Cu) interconnect layer 18 including a third interconnect trench 17 downward. Part of the third metal (Cu) interconnect layer 100 serves as a pad electrode 101. While on the second interlayer insulating film 15, a protective insulating film 102 and a buffer coat film 103 are formed to cover the second interlayer insulating film 15, the pad electrode 101 is exposed in a pad electrode opening 104 formed in the films 102 and 103 at a site corresponding to the pad electrode 101.

Figure 2:
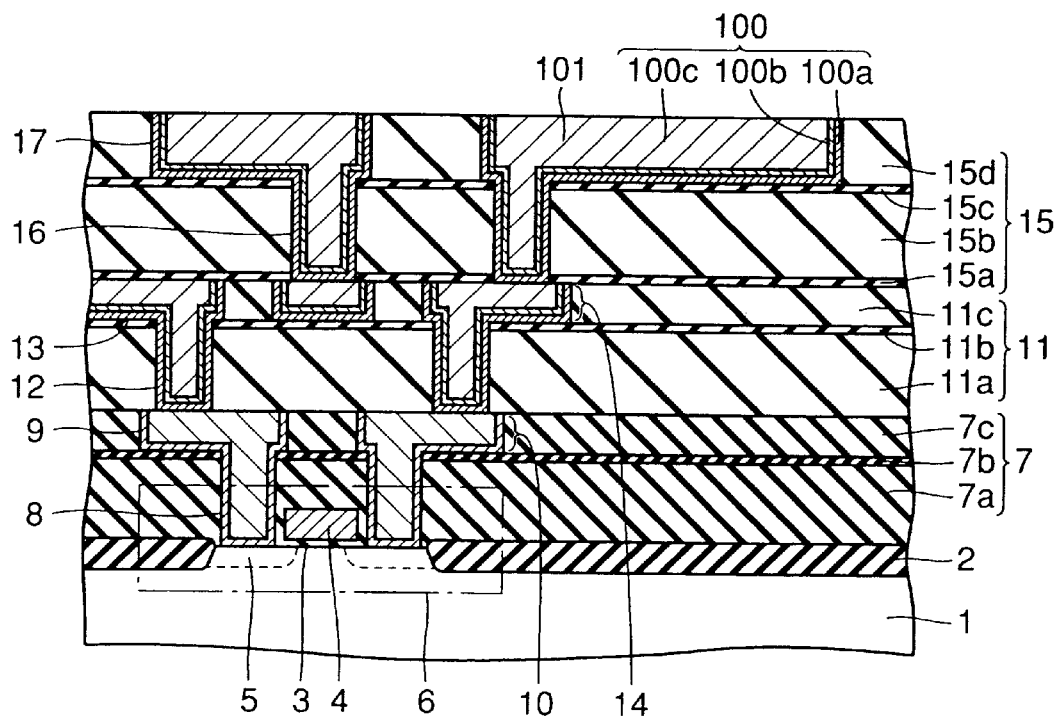
FIG. 2 is a sectional view illustrating a first step of a fabrication process for a semiconductor device in the first embodiment according to the invention.
Figure 3:
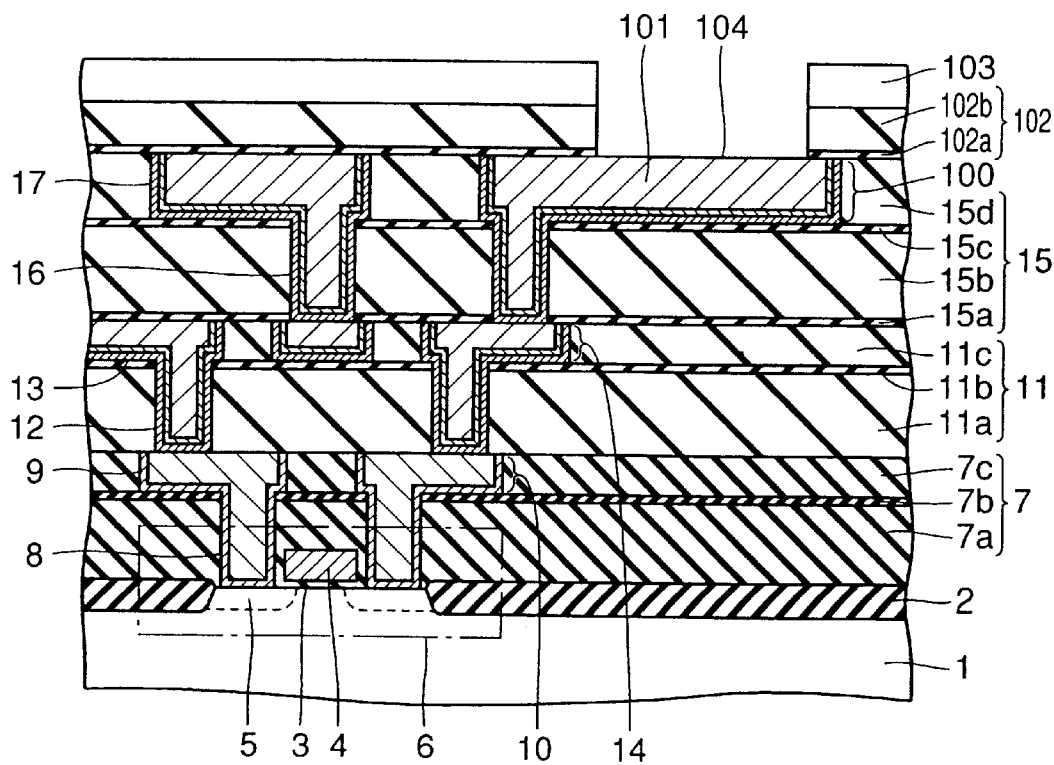
FIG. 3 is a sectional view illustrating a second step of the fabrication process for a semiconductor device in the first embodiment according to the invention.
Figure 129:
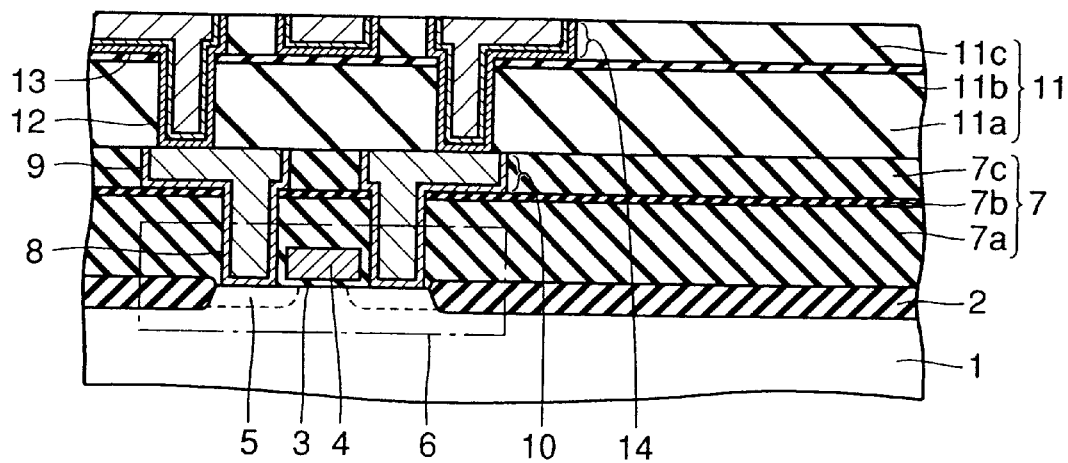
Figure 130:
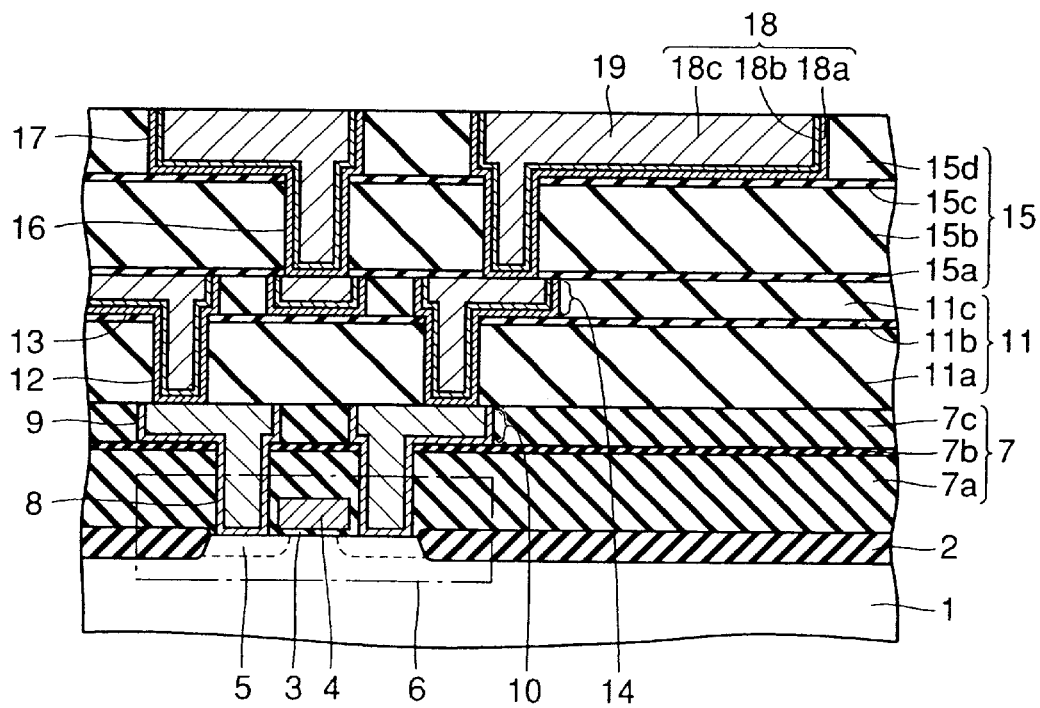

A fabrication process for the semiconductor device in the first embodiment shown in FIGS. 1A and 1B are shown in FIGS. 2 and 3. After the structure shown in FIG. 129 is constructed based on a conventional technique, on the second metal (Cu) interconnect 14, stacked is, as shown in FIG. 2, a second interlayer insulating film 15 of a four-layer structure composed of a silicon nitride film (SiN) 15a as a copper-diffusion preventive layer, an insulating film 15b such as a silicon oxide (SiO) film, a silicon nitride film (SiN) 15c and an insulating film 15d such as a silicon oxide film (SiO) by means of a plasma CVD or the like method.

A recess as the second via hole 16 and the third interconnect trench 17 is formed in the second interlayer insulating film 15 at a desired site thereon using photolithography and an etching technique. At this time, a recess is also formed at a site where a pad electrode is to be provided and a shape of a plan view of the latter recess is selected a polygon with an internal angle thereof larger than 90 degrees, for example an octagon as shown in FIG. 1A, instead of an tetragon used in a conventional practice.

An underlying film 100a, a copper seed film 10b and a copper plated film 100c are deposited over all the surface to a thickness approximately in the range of 1.5 to 3.0 μm, such that the second via hole 16 and the third interconnect trench 17 are filled with the films 100a, 100b and 100c. Thereafter, the copper films 18c and 18b, and the underlying film 18a other than those in the second via hole 16 and the third interconnect trench 17 are removed by means of a chemical mechanical polishing process to form a third buried metal (Cu) interconnect layer 100 and a pad electrode 101.

Please note that as the uppermost metal (Cu) interconnect layer, generally used is a metal interconnect with a relatively large thickness approximately in the range of 0.8 to 1.5 μm, taking into consideration that wire bonding is applied on the uppermost metal (Cu) interconnect layer.

As shown in FIG. 3, on the third metal (Cu) interconnect layer 100, a dense silicon nitride film 102a as a copper-diffusion preventive layer are deposited. Thereafter, a protective insulating film 102b, such as made of a silicon nitride film, a silicon oxide film, a silicon oxynitride film or a stacked structure film thereof is further stacked to a thickness of the order of 1.0 µm. Then, a buffer coat film 103 such as made of polyimide is formed to a thickness approximately in the range of 5 to 10 µm depending on a necessity as a second protective insulating film and then, an opening 104 is formed in the films 102a, 102b and 103 at a site thereon corresponding to the pad electrode 101 for connection to an external terminal (not shown) by means of a wire-boding method or the like.

Figure 4:
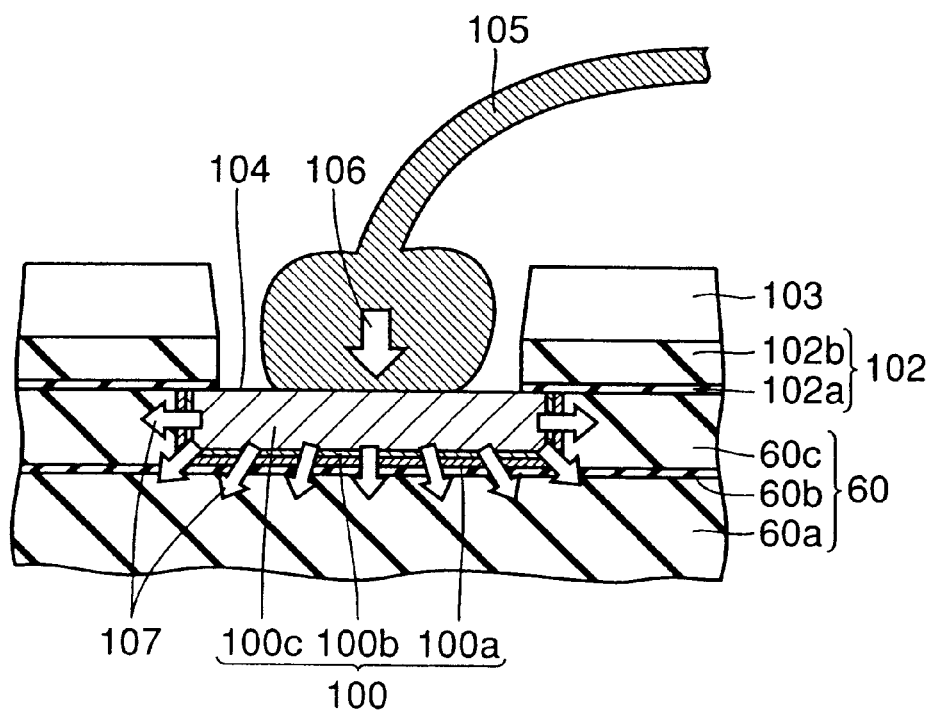
FIG. 4 is a sectional view illustrating the way to transmit an impact force to a semiconductor device in the first embodiment according to the invention.
Figure 5:
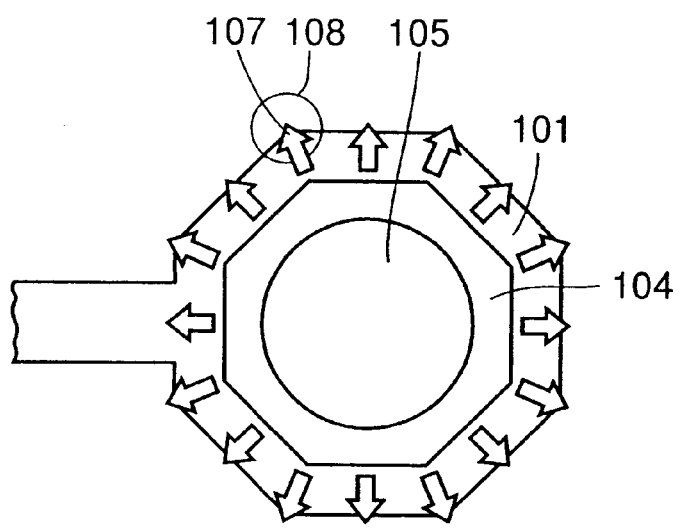
FIG. 5 is a plan view illustrating the way to transmit an impact force to a semiconductor device in the first embodiment according to the invention.
Figure 6A:
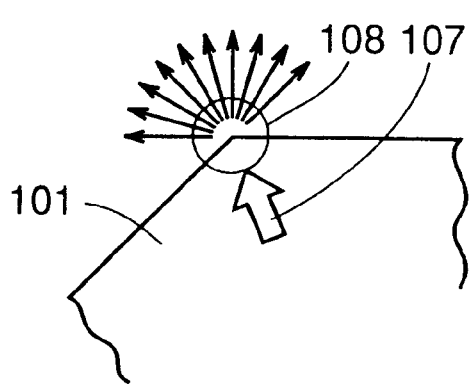
FIGS. 6A and 6B are partially enlarged views illustrating ways to transmit an impact force to a semiconductor device in the first embodiment according to the invention.
Figure 6B:
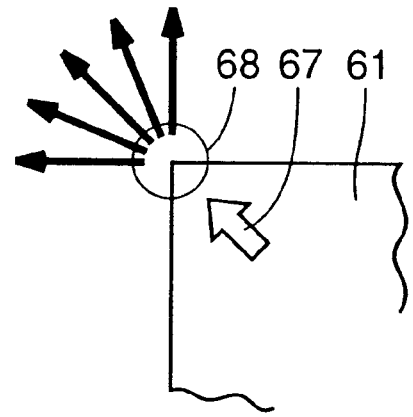

As described above, according to the embodiment of the invention, since a shape of the pad electrode 101 is selected a regular octagon as shown in FIGS. 4 and 5, a stress concentration at a corner 108 of the pad electrode 101, as shown in FIG. 6A, is reduced compared to a case of a tetragon (see FIG. 6B) by a great margin even when a load 106 or impact force 107 is imposed on the pad electrode 101 in bonding of a wire 105. Accordingly, cracking can be prevented from occurring in the interlayer insulating film.

Therefore, since bonding can be performed in a condition in which a strength of connection with the external terminal is sufficiently ensured, the connection can be effected in a stable manner with ease, which leads to an effect to obtain a high quality semiconductor device at a low cost. Moreover, the embodiment of the invention is an effective method when a pad electrode is down scaled, though the pad electrode requires a high allowable setting value of a load or impact force receiving when bonding is effected in the sense of relativity.

While in FIG. 1A, the case where a shape of the pad electrode 101 is a regular octagon is described, the pad electrode 101 having a shape of a polygon, in which an internal angle of a selected corner thereof is larger than 90 degrees, also exerts a similar effect.

Figure 7:
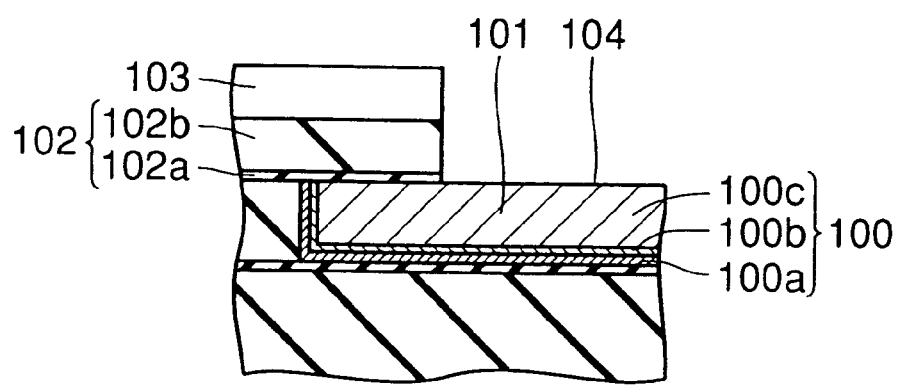
FIG. 7 is a sectional view of a main part of a semiconductor device in the first embodiment according to the invention.
Figure 8:
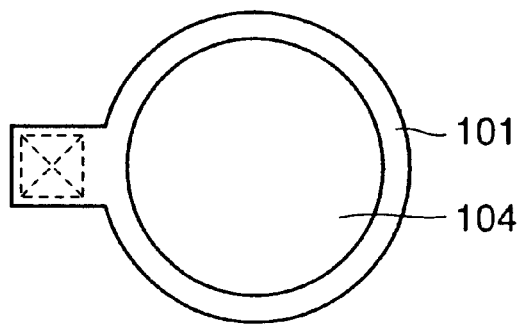
FIG. 8 is a plan view of a main part of a first other example of the semiconductor device in the first embodiment according to the invention.
Figure 9:
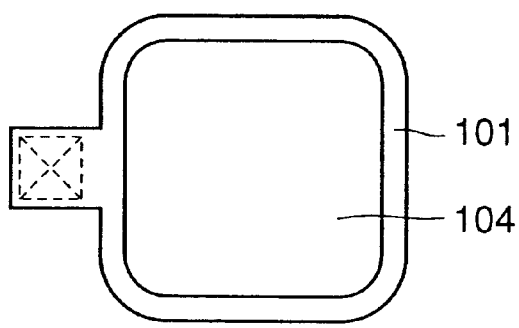
FIG. 9 is a plan view of a main part of a second other example of the semiconductor device in the first embodiment according to the invention.
Figure 10:
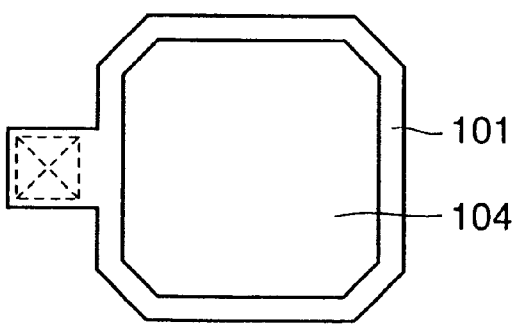
FIG. 10 is a plan view of a main part of a third other example of the semiconductor device in the first embodiment according to the invention.

Further, in a pad electrode 101 with a sectional structure, which is shown in FIG. 7, various shapes of a plan view may be adopted: a circular pad electrode as shown in FIG. 8 or a elliptic pad electrode, and polygons in which selected corners are rounded or chamfered as shown in FIGS. 9 and 10. Moreover, shapes obtained by adopting the shapes as described above partly or in combination thereof may be selected.

While in the above described embodiment, described is the case where a main constituting metal of a metal electrode, which is a bonding pad electrode, is copper, a similar effect is exerted even in a case of a metal electrode of other metals formed by a similar buried interconnect process. For example, the invention may be applied to a metal electrode made of aluminum or an alloy including aluminum, and a metal electrode including any of noble metals such as gold, silver or platinum, as alterations or modifications of the embodiment.

Second Embodiment

Figure 11A:
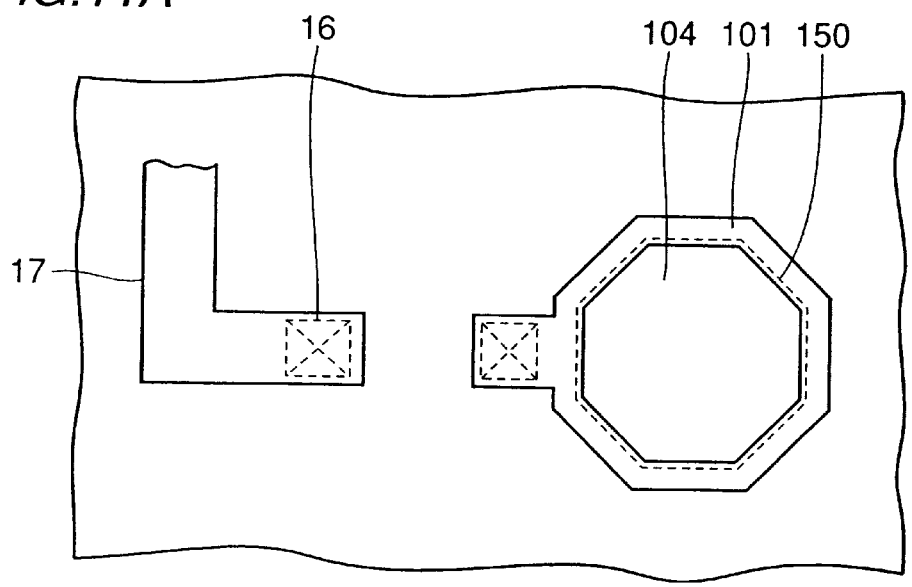
FIG. 11A is a plan view of a semiconductor device in a second embodiment according to the invention and FIG. 11B is a sectional view of the semiconductor device.
Figure 11B:
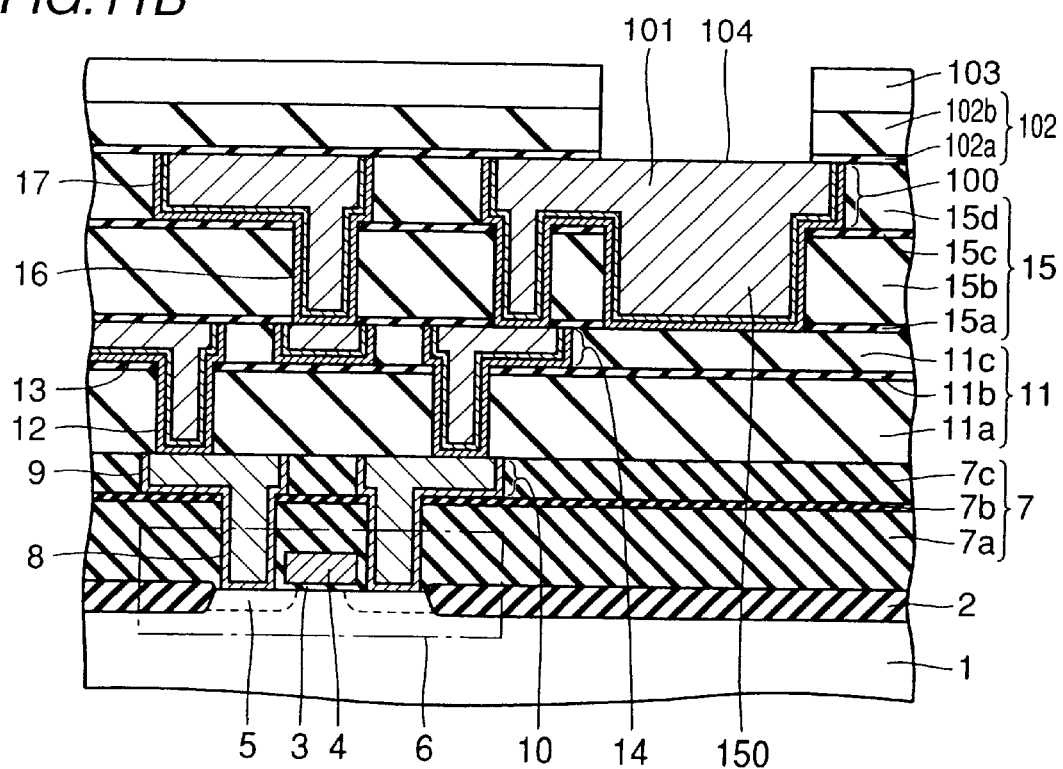

While in the first embodiment, described is the case where a pad electrode is formed in a metal (Cu) interconnect layer as the uppermost layer and has a uniform thickness, a similar effect is exerted in a case where in order to alleviate a load or impact force imposed on the electrode when bonding is effected, a thickness of the pad electrode is partially larger and a shape of a plan view of a thicker portion is, as in the first embodiment, one selected from. the group consisting of a circle, an ellipse, a polygon with at least one internal angle larger than 90 degrees and a polygon with at least one. corner chamfered or rounded, or alternatively, one of shapes obtained by adopting of the shapes as described above partly or in combination thereof. In FIGS. 11A and 11B, shown is the structure of a semiconductor device according to such an embodiment, which different from the above described of the invention.

As shown in FIG. 11B, a pad electrode 101 includes a lower protruding section 150 and the other portion of the structure is similar to that shown in FIG. 1B.

Figure 12:
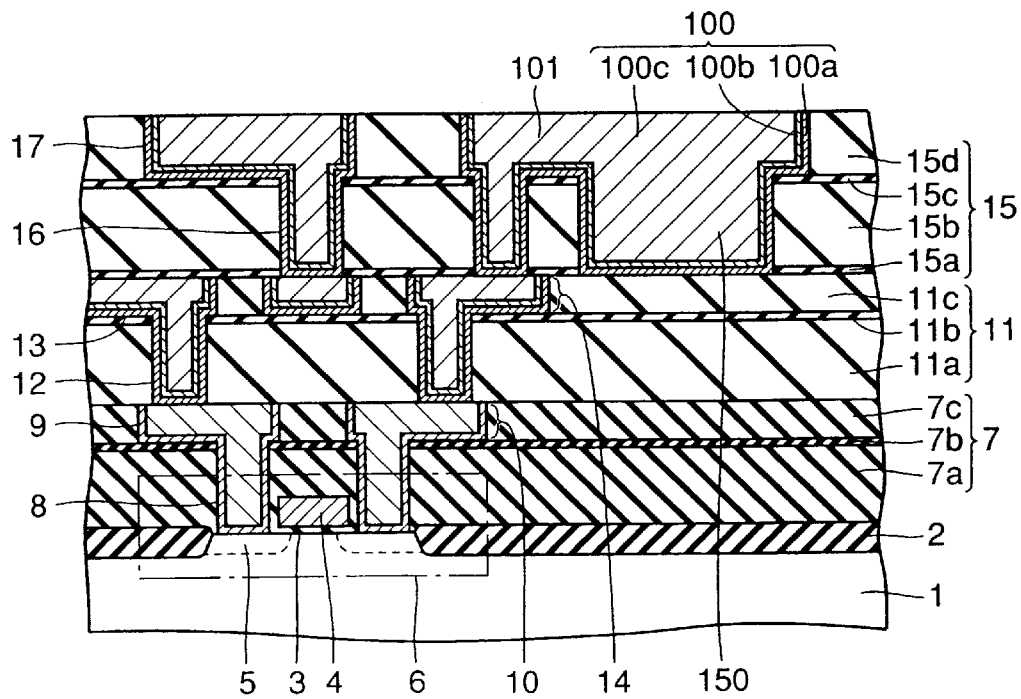
FIG. 12 is a sectional view illustrating a first step of the fabrication process for a semiconductor device in the second embodiment according to the invention.
Figure 13:
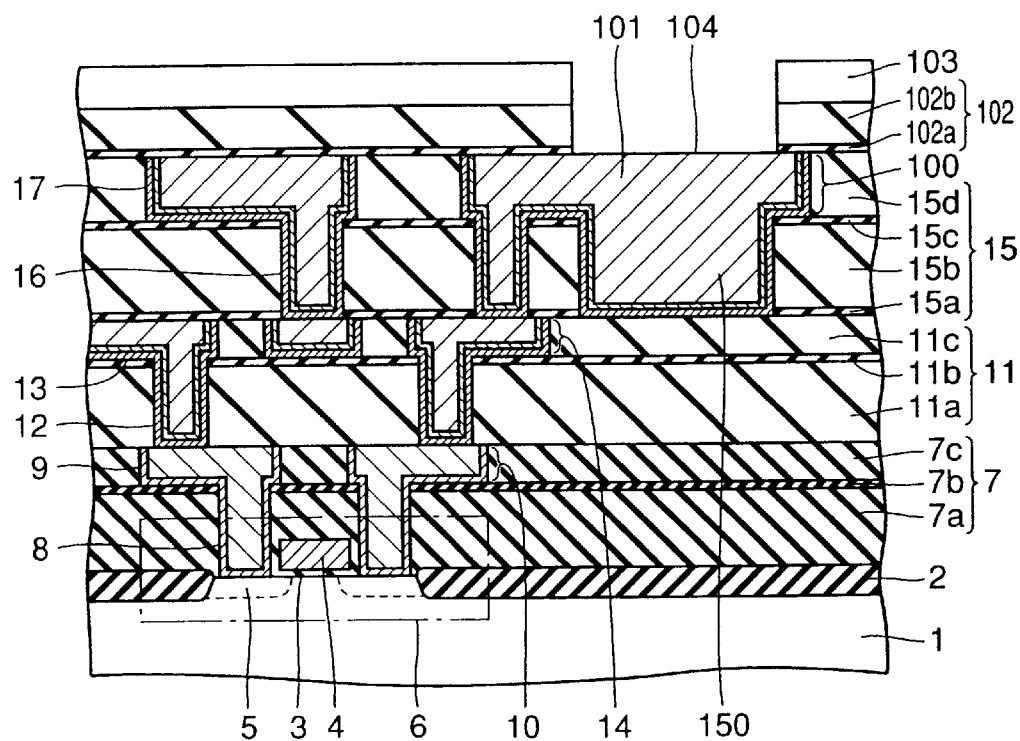
FIG. 13 is a sectional view illustrating a second step of the fabrication process for a semiconductor device in the second embodiment according to the invention.

Further, in FIGS. 12 and 13, shown is a fabrication process for the structure shown in FIGS. 11A and 11B. After the structure shown in FIG. 129 is formed, on the second metal (Cu) interconnect layer 14, as shown in FIG. 12, stacked is a second interlayer insulating film 15 of a four-layer structure composed of a silicon nitride film 15a as a copper-diffusion preventive layer, an insulating film 15b such as a silicon oxide film, a silicon nitride film 15c and an insulating film 15d such as a silicon oxide film by means of a plasma CVD method or the like method.

A second via hole 16 and a third interconnect trench 17 are formed in the second insulating film 15 at a desired site thereon using photolithography and an etching technique. At this time, a recess 150 is formed in a part of a pad electrode forming region simultaneously with when the second via hole is formed and a shape of a plan view of the recess 150 is selected a polygon with an internal angle larger than 90 degrees, for example a regular octagon as shown in FIG. 11A. Moreover, a trench is formed in a region which the pad electrode occupies and a shape thereof is selected a polygon with an internal angle larger than 90 degrees, for example a regular octagon, as in the case of the first embodiment.

By means of a method similar to the described above, an underlying film 100a, a copper seed film 100b and a copper plated film 100c are deposited over all the surface, such that the second via hole 16, the third interconnect trench 17(including that in a pad forming section) and the recess 150 of the pad electrode forming region are filled with the films 100a, 110b and 100c. Thereafter, the copper films 18c and 18b, and the underlying film 18a other than those in the second via hole 16, the third interconnect trench 17 and pat electrode are removed by means of a chemical mechanical polishing (CMP) process to form a third buried metal (Cu) interconnect layer 100 and a pad electrode 101.

Please note that as the uppermost metal (Cu) interconnect layer, generally used is a metal (Cu) interconnect with a relatively large thickness approximately in the range of 0.8 to 1.5 µm, taking wire bondability into consideration.

As shown in FIG. 13, on the third metal (Cu) interconnect layer 100, a dense silicon nitride film 102a as a copper-diffusion preventive layer is deposited. Thereafter, further stacked is a protective insulating film 102b such as made of a silicon nitride film, a silicon oxide film, a silicon oxynitride film or a stacked structure film thereof to a thickness of the order of 1.0 µm. Then, on the protective insulating film 102b, a buffer coat film 103 such as made of polyimide is formed to a thickness approximately in the range of 5 to 10 µm depending on a necessity as a second protective insulating film and then, an opening 104 is formed in the desired site in the pad electrode 101 for connection to an external terminal (not shown) by means of a wire-boding method or the like.

As described above, according to the embodiment of the invention, as shown in FIGS. 11A and 11B, since the pad electrode 101 is selected a structure in which a lower protruding section 150 is integrally included as a part of the pad electrode 101 so as to be an effective thickness larger and the lower protruding section 150 assumes a regular octagon as a shape of a sectional view, a load or impact force imposed on the pad electrode 101 can be alleviated by increase in the effective thickness of the pad electrode corresponding to a magnitude of the increase and stress concentration at a corner of the lower protruding section 150, where a stress is concentrated with ease, is reduced by a great margin compared to a case of a tetragon even when the load or impact force actually occur in bonding of a wire. Accordingly, cracking can be prevented from occurring in the interlayer insulating film. Therefore, since bonding can be performed in a condition in which a strength of connection with the external terminal is sufficiently ensured, the connection can be effected in a stable manner with ease, which leads to an effect to obtain a high quality semiconductor device at a low cost.

Moreover, the embodiment of the invention is an effective method when a pad electrode is down scaled, though the pad electrode requires a high allowable setting value of a load or impact force receiving when bonding is effected in the sense of relativity.

Figure 14:
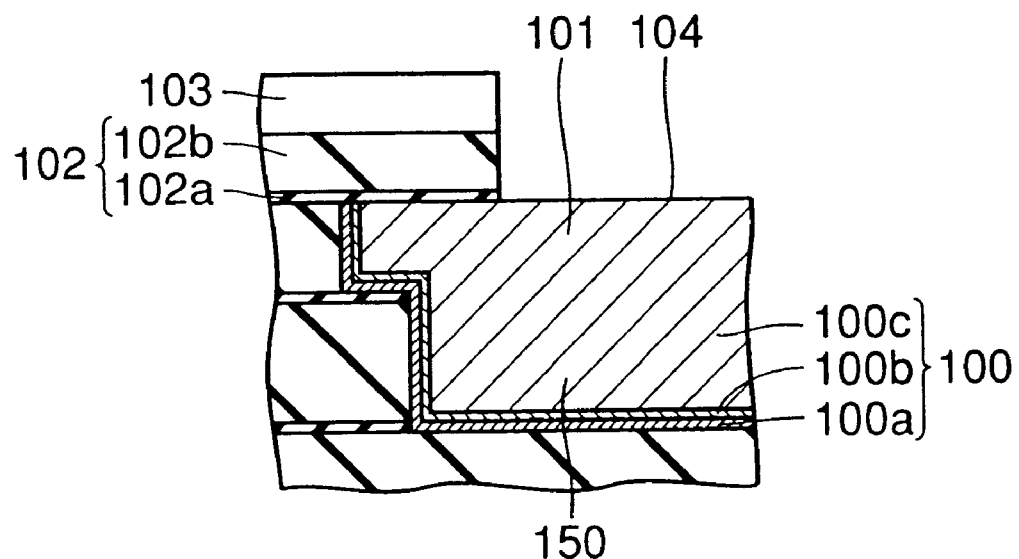
FIG. 14 is a sectional view of a main part of a semiconductor device in the second embodiment according to the invention.
Figure 15:
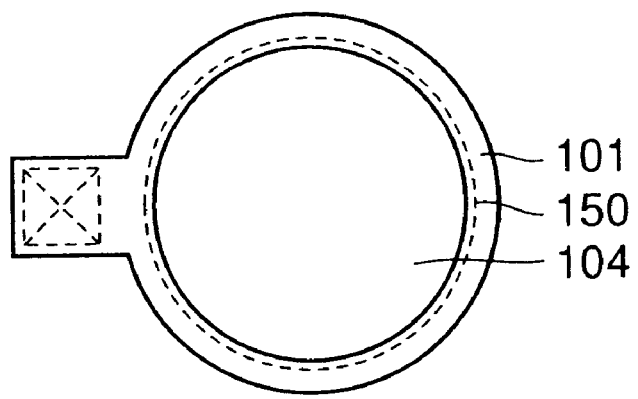
FIG. 15 is a plan view of a main part of a first other example of a semiconductor device in the second embodiment according to the invention.
Figure 16:
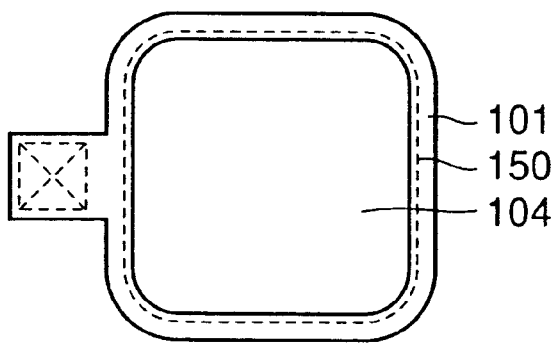
FIG. 16 is a plan view of a main part of a second other example of the semiconductor device in the second embodiment according to the invention.
Figure 17:
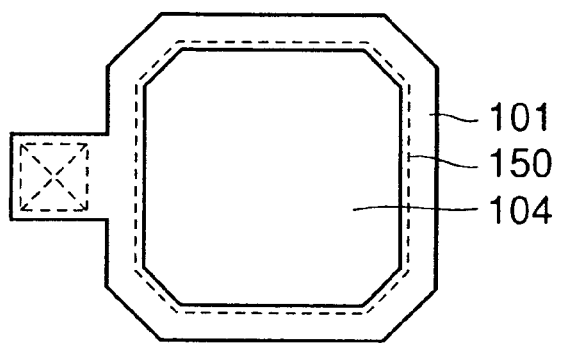
FIG. 17 is a plan view of a main part of a third other example of the semiconductor device in the second embodiment according to the invention.
Figure 18:
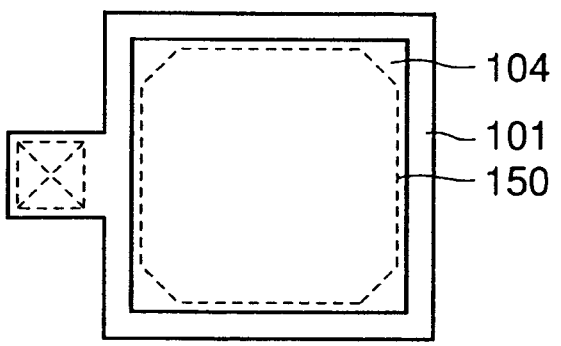
FIG. 18 is a plan view of a main part of a fourth other example of the semiconductor device in the second embodiment according to the invention.

While in FIG. 11, the case where a shape in cross-section of the lower protruding section 150 is a regular octagon, there may be available a variety of choice of shapes with which a similar effect is exerted: a polygon in which a internal angle of a selected corner is larger than 90 degrees, a circular pad electrode as shown in FIGS. 14 and 15 or an elliptic pad electrode and a shape in which a selected corner is rounded or chamfered as shown in FIGS. 16 and 17. Moreover, a pad electrode 101 of a conventional shape, for example a tetragon may be adopted, though with the lower protruding section of a shape as described above, which is shown in FIG. 18. Furthermore, as a shape of the lower protruding section, one obtained by adopting of the shapes as described above partly or in combination thereof may be employed with a similar effect exerted.

Third Embodiment

A similar effect is also exerted in a pad electrode with the following structure and shapes of constituents thereof: A pad electrode is constructed of a first metal electrode and a second metal electrode formed thereon and a shape of a plan view of the first metal electrode is one selected from the group consisting of a circle, an ellipse, a polygon with at least one internal angle larger than 90 degrees and a polygon with at least one corner chamfered or rounded, or alternatively, one of shapes obtained by adopting of the shapes as described above partly or in combination thereof.

Figure 19A:
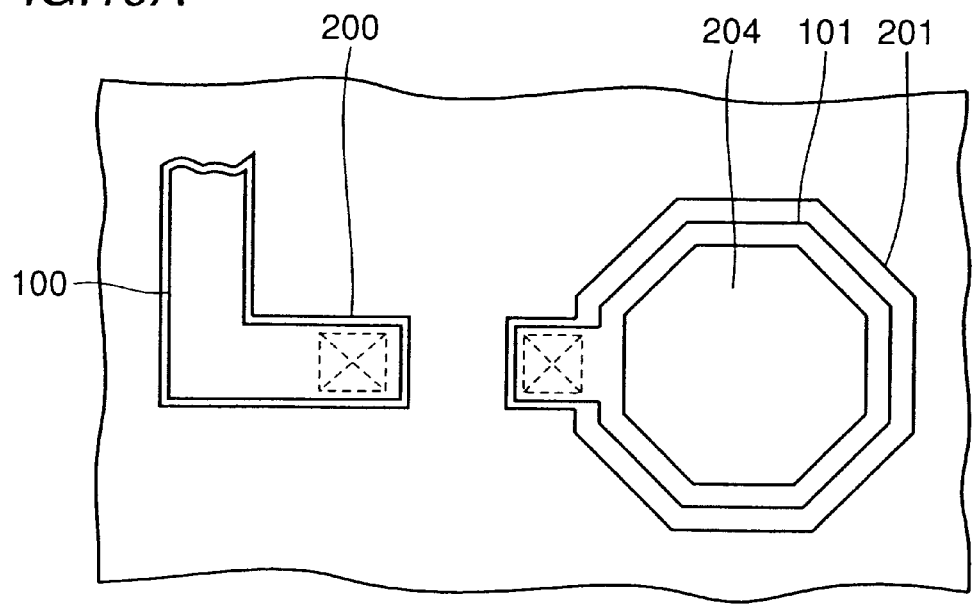
FIG. 19A is a plan view of a semiconductor device in a third embodiment according to the invention and FIG. 19B is a sectional view of the semiconductor device.
Figure 19B:
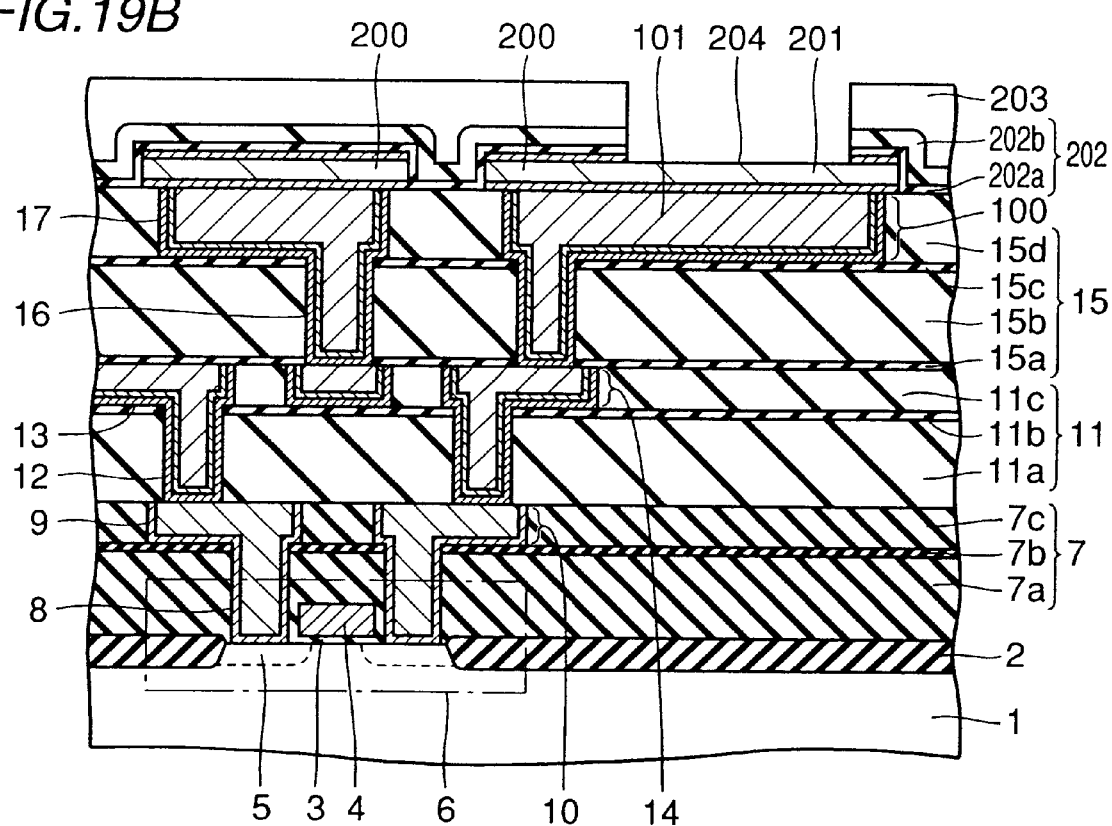

In FIGS. 19A and 19B, shown is the structure of the semiconductor in the embodiment.

As shown in FIG. 19B, an upper electrode layer 201 contacts the upper side of a main electrode layer 101. The upper electrode layer 201 is exposed in a pad electrode opening 204. The other portions of the structure are similar to those shown in FIG. 1B.

Figure 20:
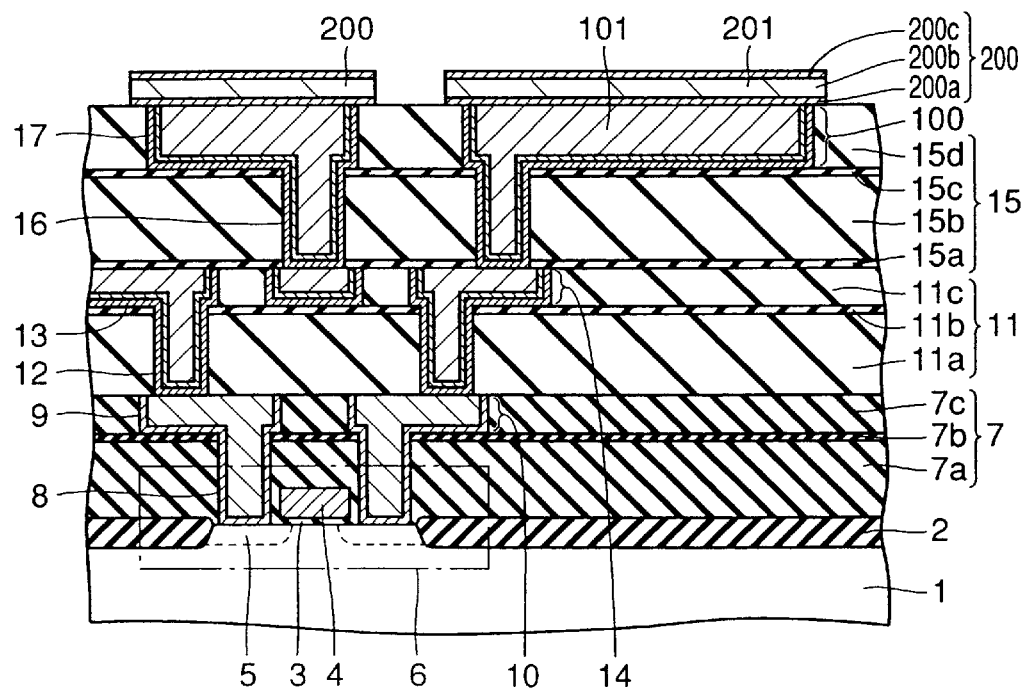
FIG. 20 is a sectional view illustrating a first step of the fabrication process for a semiconductor device in the third embodiment according to the invention.
Figure 21:
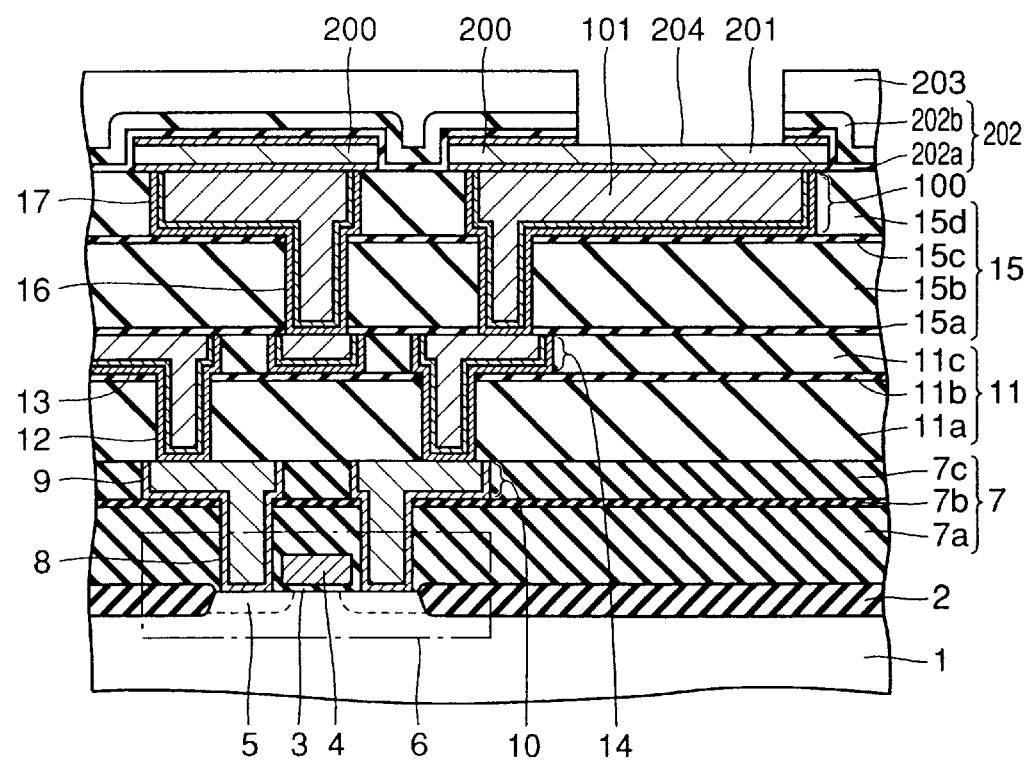
FIG. 21 is a sectional view illustrating a second step of the fabrication process for a semiconductor device in the third embodiment according to the invention.

Further, in FIGS. 20 and 21, shown is the fabrication method for the structure shown in FIGS. 19A and 19B. The procedure up to a step where the structure shown in FIG. 2 is fabricated is the same as that in the first embodiment. While an interconnect trench is formed in a portion where the pad electrode is provided when the third interconnect trench 17 shown in FIG. 2 is formed, a shape of the interconnect trench of the pad electrode is one with an internal angle larger than 90 degrees, for example a regular octagon, similar to in the first embodiment. Thereafter, a third metal (Cu) interconnect layer 100 and the first pad electrode 101 are formed in a method similar to the above described.

As shown in FIG. 20, a fourth metal interconnect layer 200 and a second pad electrode 201 are formed so as to be superimposed on the third metal (Cu) interconnect layer 100 and the first pad electrode 101. As the fourth metal interconnect layer, an interconnect made of, for example, aluminum as a main ingredient, can be adopted. An underlying film 200a composed of a titanium nitride film, a stacked film of titanium and titanium nitride, a tantalum film, a tantalum nitride film, a stacked film of tantalum and tantalum nitride, or the like are deposited over all the surface using a PVD method or a CVD method in order to prevent a mutual reaction between the copper interconnect layer and aluminum thereon from occurring. On the underlying film 200a, sequentially deposited are an aluminum alloy film 200b such as a Al—Cu film and an antireflection film 200c such as a titanium nitride film or a silicon oxynitride film, followed by photolithography and an etching technique to form a fourth metal interconnect layer 200 and the second pad electrode 201. A thickness of the aluminum interconnect layer 200 and the pad electrode 201 may be approximately in the range of 0.3 to 1.0 µm since the second pad electrode is spaced apart from the first pad electrode.

Please note that the fourth metal (Al) interconnect layer 200 and the second pad electrode 201 are desirably formed so as to perfectly cover all of the third metal (Cu) interconnect layer 100 and the first pad electrode 101 as the underlying layer in order to prevent damaging of a surface of the copper interconnect and oxidation thereof from occurring in the aluminum interconnect formation step.

As shown in FIG. 21, a dense silicon nitride film 202a as a copper-diffusion preventive film is deposited on the fourth metal (Al) interconnect layer 200 and the second pad electrode 201. Thereafter, a protective insulating film 202b, such as a silicon nitride film, a silicon oxide film, a silicon oxynitride film or a stacked film composed thereof, is stacked to a thickness of approximately 1.0 µm. Moreover, on the protective insulating film 202b, formed is a buffer coat layer 203 such as made of polyimide depending on a necessity as a second protective insulating layer to a thickness of the order in the range of 5 to 10 µm and an opening 204 is formed in the desired site in the pad electrode 201 for connection to an external terminal (not shown) using a wire bonding method or the like.

As described above, according to such an embodiment of the invention, since as shown in FIGS. 19A and 19B, the pad electrode has a structure in which the first pad electrode 101 formed with a buried interconnect layer and the second pad electrode 201 formed using the etching method are superimposed on each other and a shape of the first pad electrode 101 is a regular octagon, therefore, a load or impact force imposed on the pad electrodes can be alleviated by increase in the effective thickness in a corresponding manner to a magnitude of the increase even when the load or impact force actually occur, and moreover, stress concentration at a corner of the first pad electrode 101 where the stress is concentrated with ease is also greatly reduced compared with a case of a tetragon as a shape. Accordingly, cracking can be prevented from occurring in the interlayer insulating film.

Therefore, since bonding can be performed in a condition in which a strength of connection with the external terminal is sufficiently ensured, the connection can be effected in a stable manner with ease, which leads to an effect to obtain a high quality semiconductor device at a low cost. Moreover, the embodiment of the invention is an effective method when a pad electrode is down scaled, though the pad electrode requires a high allowable setting value of a load or impact force receiving when bonding is effected in the sense of relativity. Furthermore, since a metal interconnect layer as the uppermost layer is constructed such that the third metal interconnect layer 100 and the fourth metal interconnect 200 are superimposed on each other, the effective thickness is larger and thereby: a lower resistivity is realized, with the result that wiring delay or noise margin can be effectively reduced.

While in FIGS. 19A and 19B, described is the case where the first pad electrode and the second pad electrode are superimposed on each other and a shape of the first pad electrode 101 is a regular octagon, a similar effect is exerted even when a polygon in which an internal angle of a selected corner thereof is larger than 90 degrees.

Figure 22:
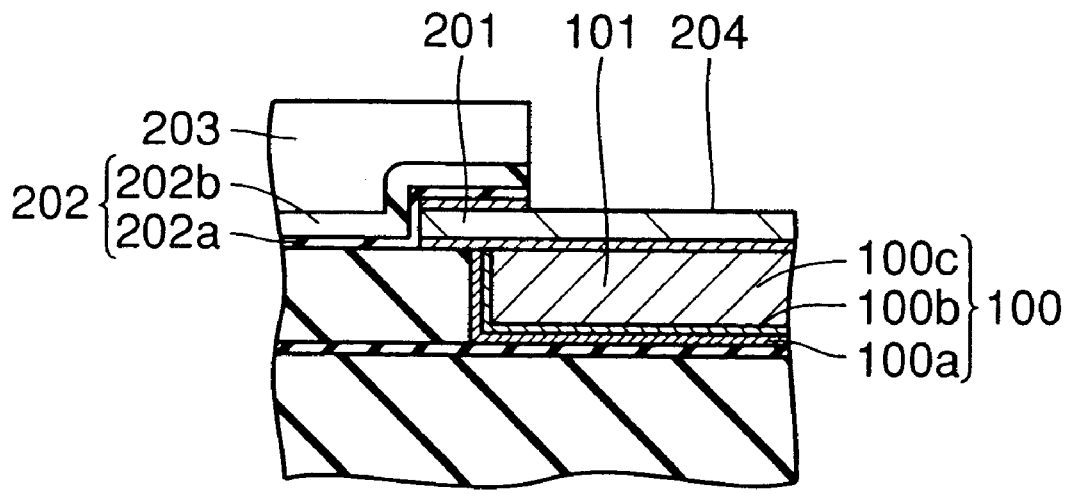
FIG. 22 is a sectional view of a main part of a semiconductor device in the third embodiment according to the invention.
Figure 23:
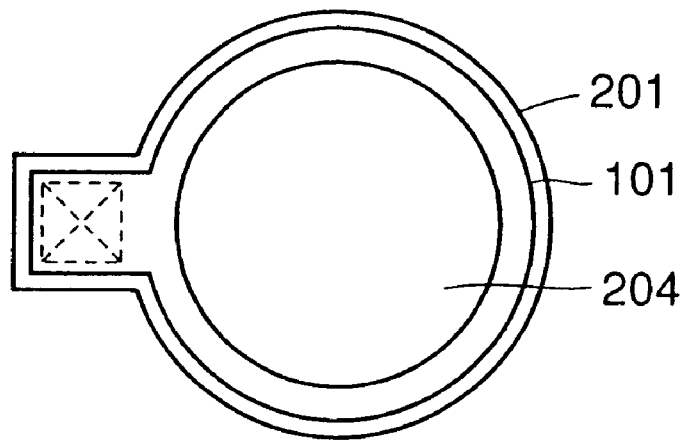
FIG. 23 is a plan view of a main part of a first other example of the semiconductor device in the third embodiment according to the invention.
Figure 24:
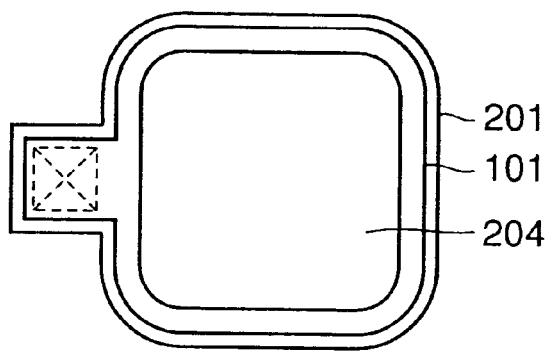
FIG. 24 is a plan view of a main part of a second other example of the semiconductor device in the third embodiment according to the invention.
Figure 25:
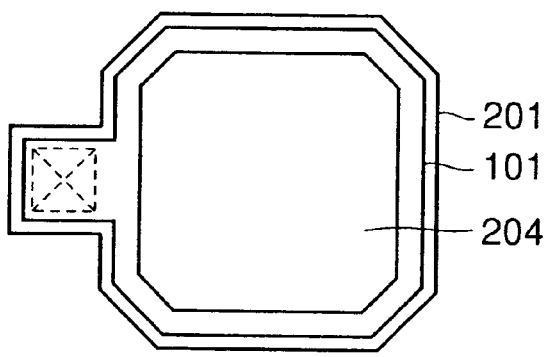
FIG. 25 is a plan view of a main part of a third other example of the semiconductor device in the third embodiment according to the invention.
Figure 26:
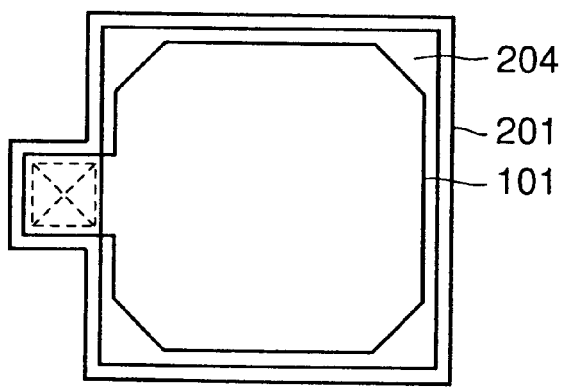
FIG. 26 is a plan view of a main part of a fourth other example of the semiconductor device in the third embodiment according to the invention.

Shapes of a pad electrode may be varied in many ways: a circular pad electrode as shown in FIGS. 22 and 23, or an elliptic pad electrode, or a shape in which a selected corner is rounded or chamfered as shown in FIGS. 24 and 25. Moreover, as shown. in FIG. 26, only the first pad electrode 101 is shaped as described above, but the second pad electrode 201 and the pad electrode opening may be shaped to be conventional, for example of a tetragon. Furthermore, a shape of the first pad electrode may be one obtained by adopting of the shapes as described above partly or in combination thereof.

Fourth Embodiment

Figure 27A:
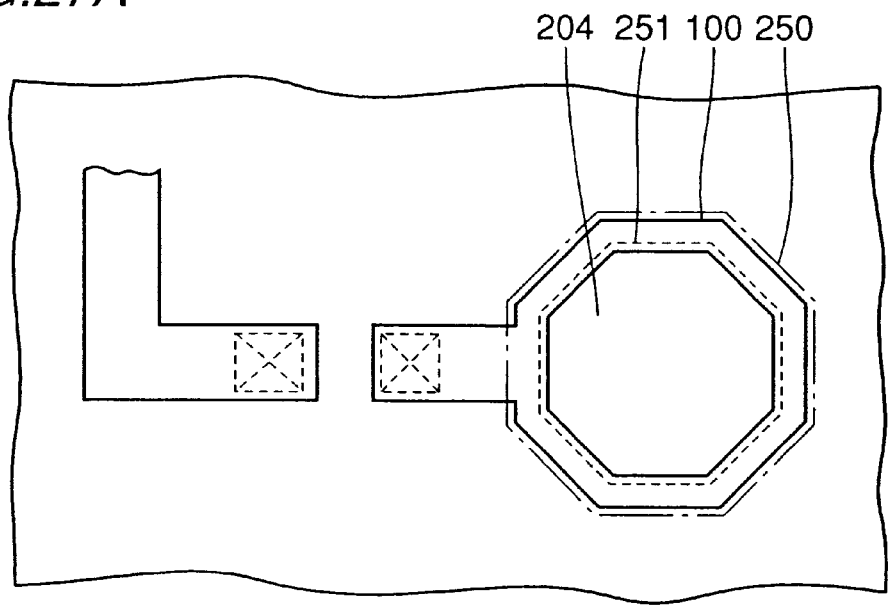
FIG. 27A is a plan view of a semiconductor device in a fourth embodiment according to the invention and FIG. 27B is a sectional view of the semiconductor device.
Figure 27B:
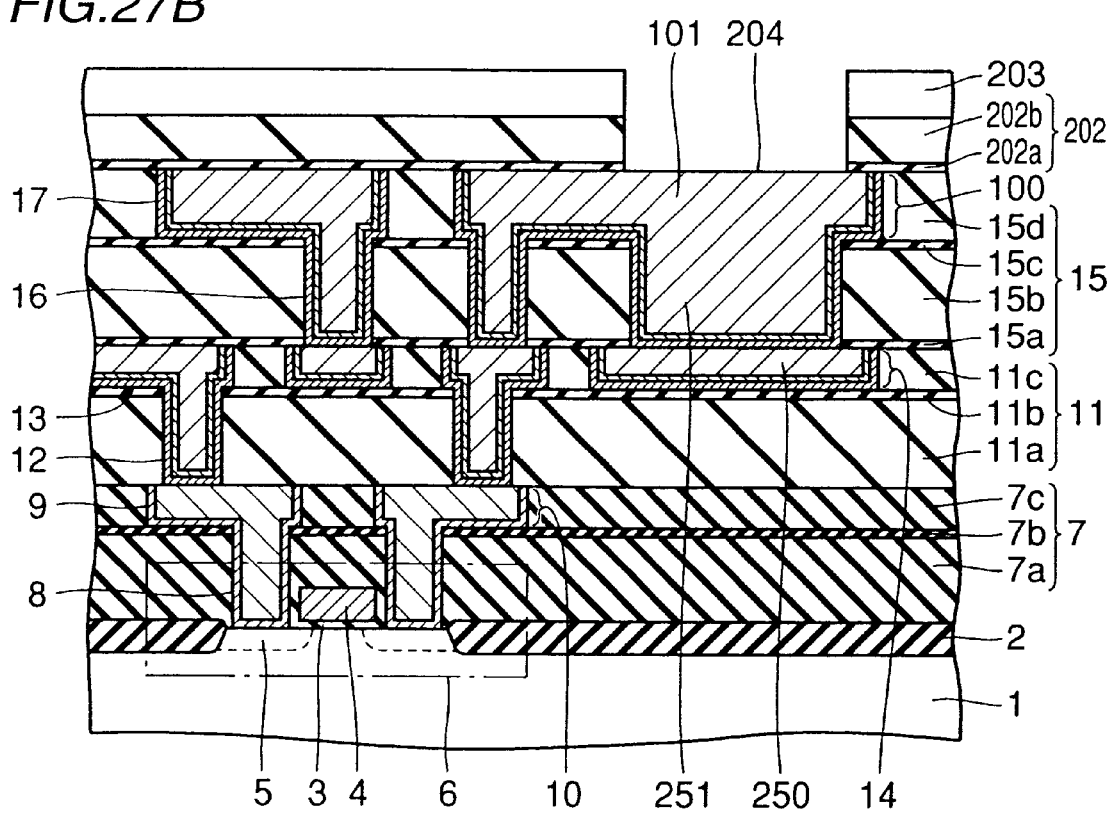

The following structure and shape of a pad electrode have a similar effect to be exerted: A pad electrode has a structure in which a first metal electrode and a second metal electrode are superimposed on each other with a connection hole of a large cross-sectional area interposed therebetween, and a shape of a plan view of a main part of the connection hole may be one selected from the group consisting of a circle, an ellipse, a polygon in which an internal angle of at least one corner thereof is larger than 90 degrees and a polygon in which at least one corner thereof is rounded or chamfered, or a shape obtained by adopting of the shapes as described above partly or in combination thereof. Please note that the term "a connection hole of a large cross-sectional area" means a connection hole having an outer periphery of a shape in the inside vicinity of and along the outer periphery of the shape of a plan view of the main electrode layer. In FIGS. 27A and 27B, shown is the structure of a semiconductor device according to such an embodiment, which different from the above described of the invention.

As shown in FIG. 27B, the pad electrode includes a lower electrode layer 250 beneath the main electrode layer 101. The main electrode layer 101 is exposed in a pad electrode opening 204. The main electrode layer 101 and the lower electrode layer 250 are connected by the connection hole 251 interposed therebetween. The connection hole 251 is a so-called a large area connection hole as shown in FIG. 27A, that is a connection hole having an outer periphery of a shape in the inside vicinity of and along the outer periphery of the shape of a plan view of the main electrode layer 101. The other portions of the structure are similar to those shown in FIG. 11B.

Figure 28:
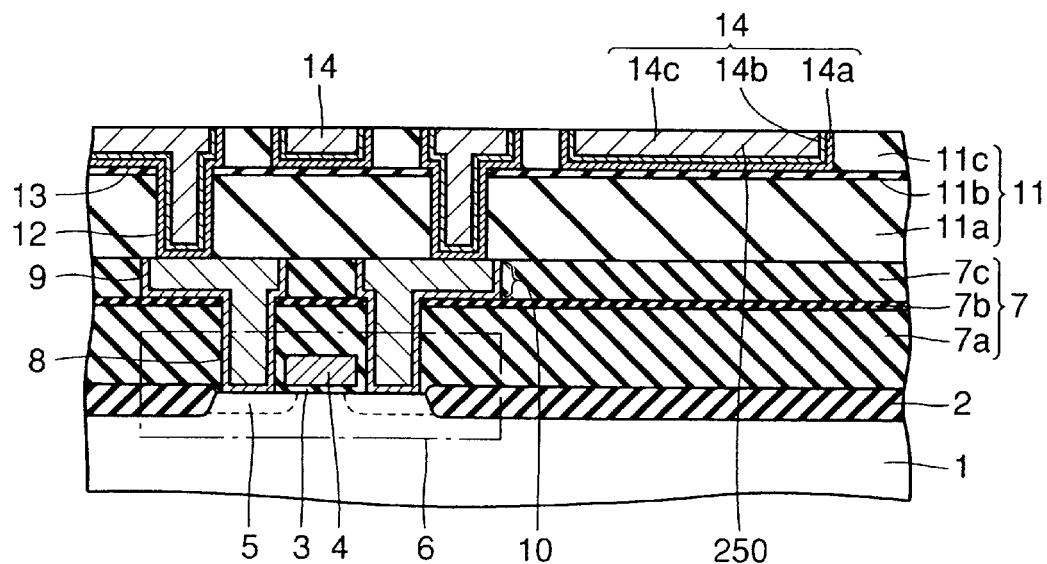
FIG. 28 is a sectional view illustrating a first step of the fabrication process for a semiconductor device in the fourth embodiment according to the invention.
Figure 29:
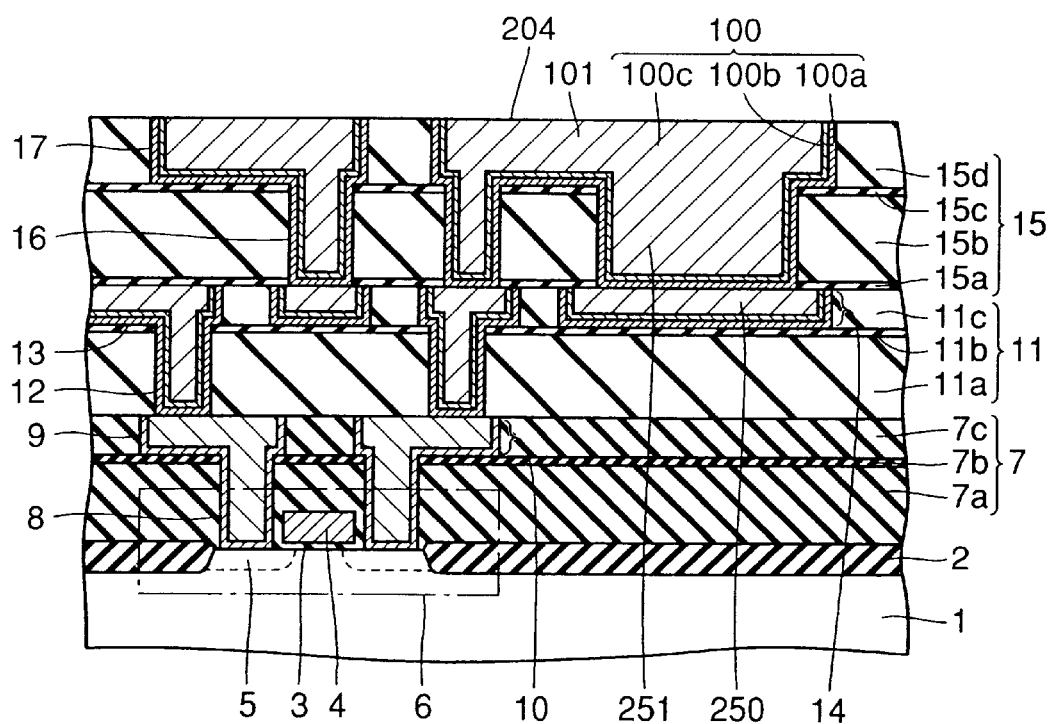
FIG. 29 is a sectional view illustrating a second step of the fabrication process for a semiconductor device in the fourth embodiment according to the invention.
Figure 30:
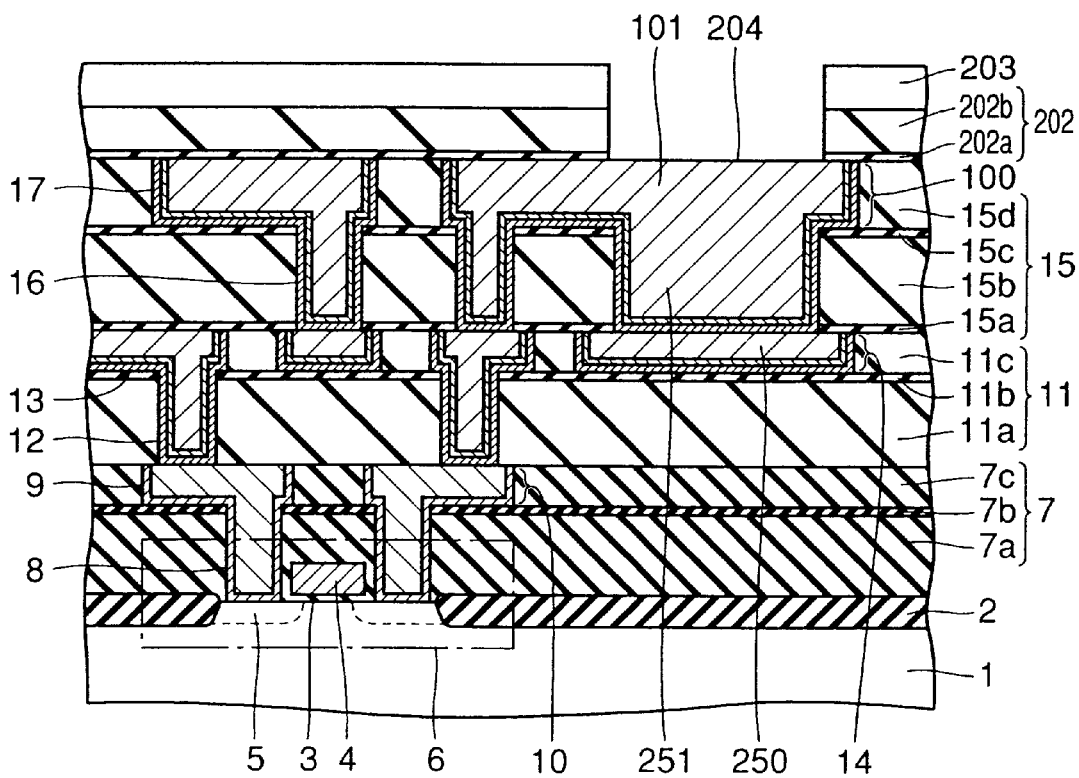
FIG. 30 is a sectional view illustrating a third step of the fabrication process for a semiconductor device in the fourth embodiment according to the invention.

In FIGS. 28 to 30, shown is a fabrication process for the structure shown in FIGS. 27A and 27B.

Figure 122A:
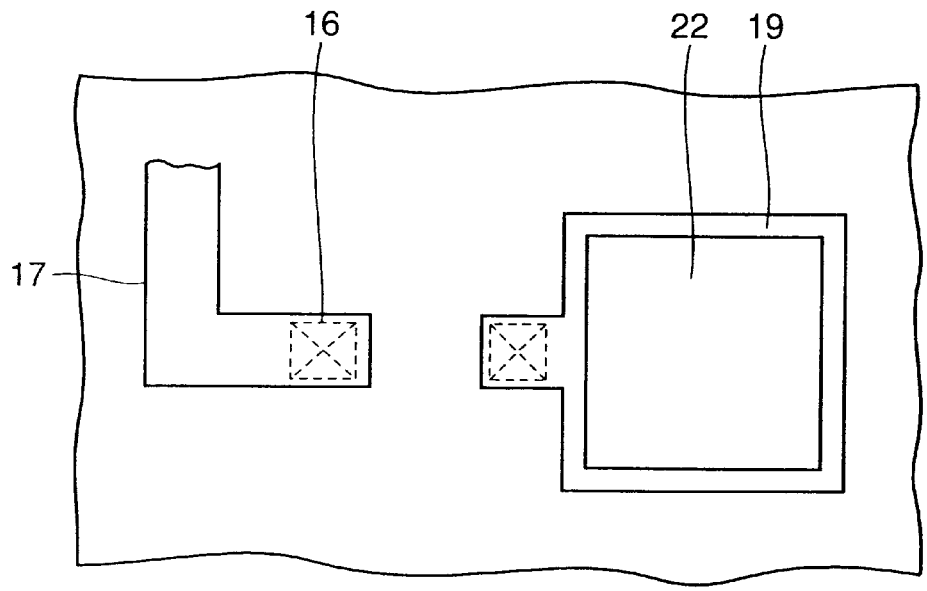
Figure 122B:
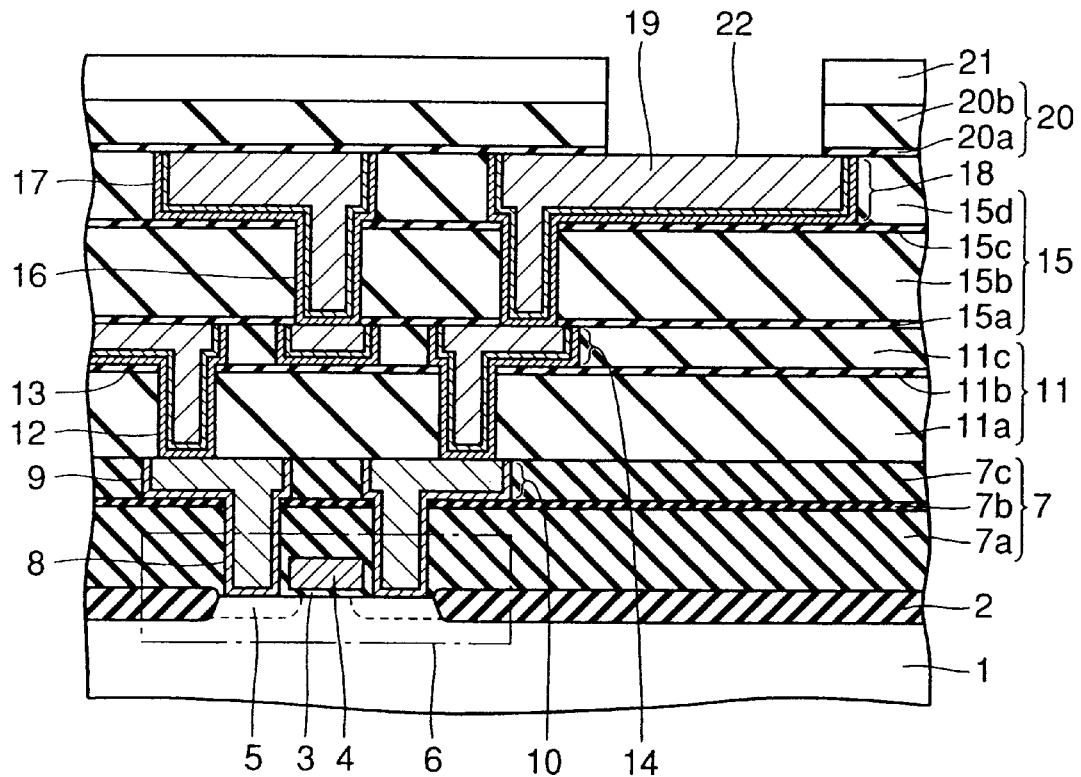
Figure 123:
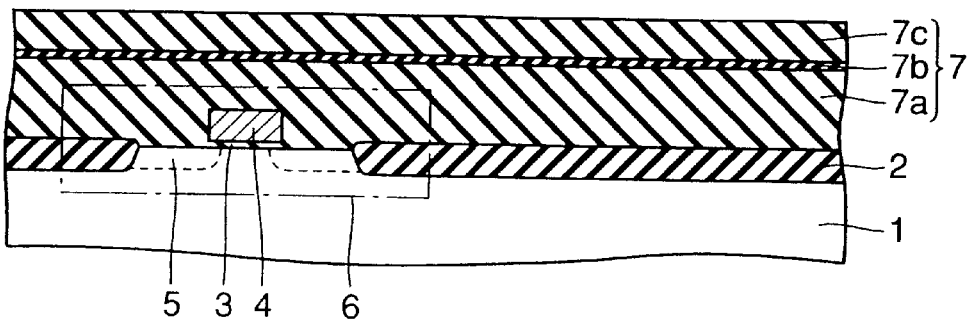
Figure 124:
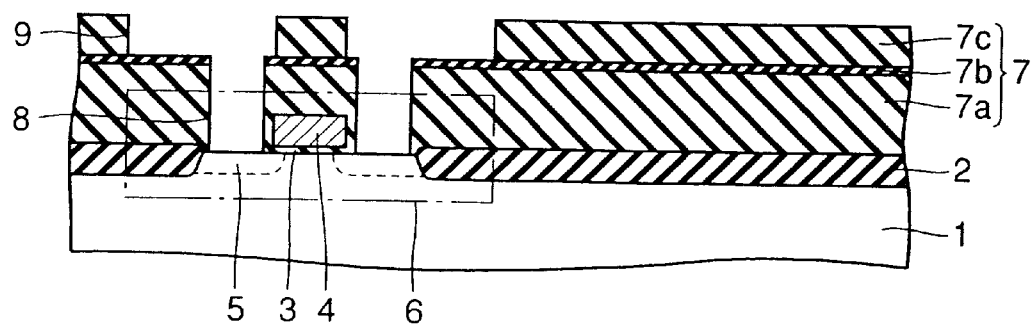
Figure 125:
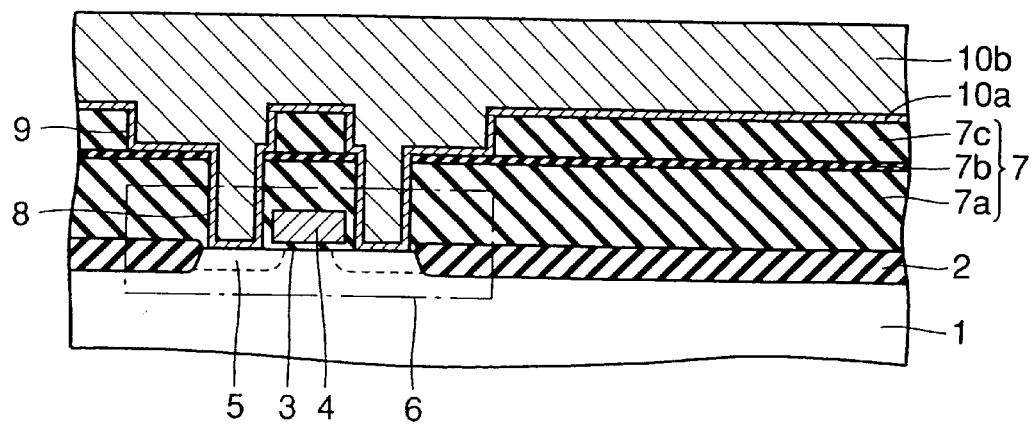
Figure 126:
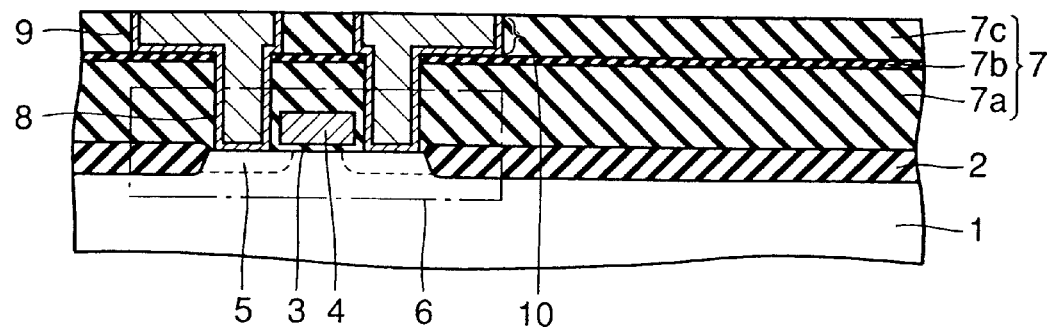
Figure 127:
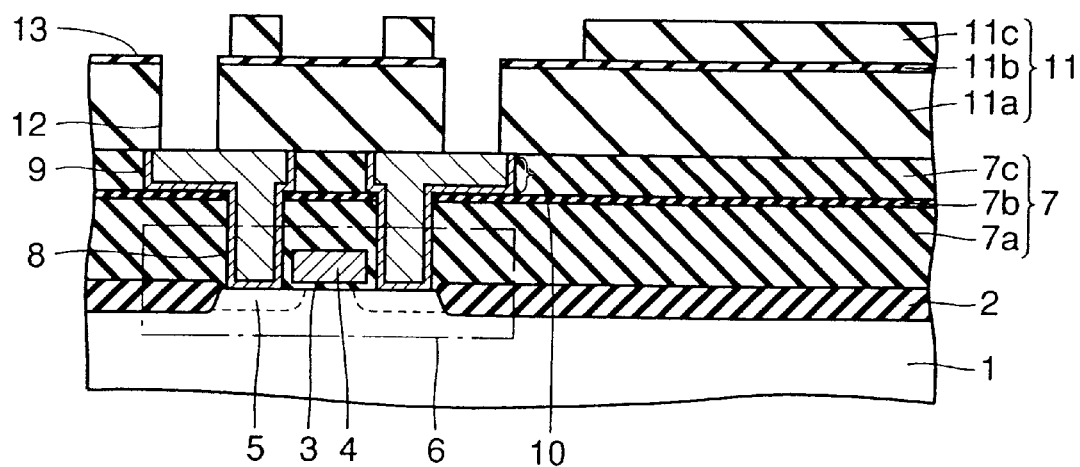
Figure 128:
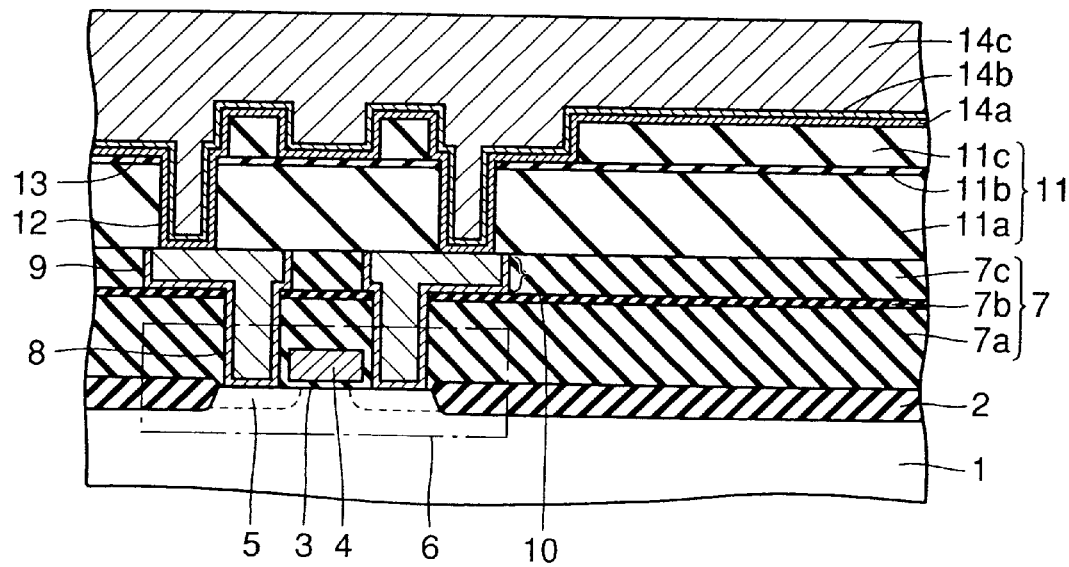

As shown in FIG. 28, the fabrication process is the same as the fabrication process (FIGS. 123 to 126) for the conventional semiconductor device shown in FIGS. 122A and 122B up to a step where the first metal (W) interconnect layer 10 is formed.

On the first metal (W) interconnect 10, stacked is a first interlayer insulating film 11 of a three-layer structure composed of an insulating film 11a such as a silicon oxide film, a silicon nitride film 11b, an insulating film 11c such as a silicon oxide film by means of a plasma CVD method or the like.

Then, a first via hole 12 and a second interconnect trench 13 are formed in the first interlayer insulating film 11 using photolithography and an etching technique at a desired site on a surface thereof. While an interconnect trench is formed at a site where the first pad electrode is provided simultaneously with when the second interconnect trench 13 is formed, a shape of the interconnect trench of the first pad electrode is selected a polygon in which an internal angle of a corner thereof is larger than 90 degrees, for example a regular octagon.

Thereafter, an underlying film 14a and copper film 14b and 14c are deposited over all the surface such that the first via hole 12 and the second interconnect trench 13 (including a section in which the lower electrode layer is formed) are filled with the films 14a, 14b and 14c, and the copper films 14c and 14b and the underlying film 14a other than those in the first via hole 12 and the second interconnect trench 13 are removed by means of a chemical mechanical polishing process to form the second buried metal (Cu) interconnect layer 14 and the lower electrode layer.

As shown in FIG. 29, on the second metal (Cu) interconnect layer 14, stacked is a second interlayer insulating film 15 of a four-layer structure composed of a silicon nitride film 16a, an insulating film 15b such as a silicon oxide film, a silicon nitride film 15c and an insulating film 15d such as a silicon oxide film by means of a plasma CVD method or the like. A second via hole 16 and a third interconnect trench 17 are formed in the second interlayer insulating layer 15 at a desired site on a surface thereof using photolithography and an etching technique. At this time, a connection hole 251 is also formed on the lower electrode layer simultaneously with when the second via hole is formed and a shape of a plan view of the connection hole is selected a polygon in which an internal angle of a corner is larger than 90 degrees, for example a regular octagon.

Further, while when the third interconnect trench is formed, an interconnect trench is also formed in a portion where the main electrode layer is provided, the interconnect trench of the main electrode layer is also of a shape of a polygon with an internal angle lager than 90 degrees, for example a regular octagon.

An underlying film 100a and copper films 100b and 100c are deposited over all the surface such that the second via hole 16, the third interconnect trench 17, the connection hole 251 on the lower electrode layer and the main electrode layer 101 are filled with the films 100a, 100b and 100c using a method similar to the above described. Thereafter, unnecessary portions of the deposited films 100a, 100b and 100c are removed by a chemical mechanical polishing process to form a third buried metal (Cu) interconnect layer 100 and the main electrode layer 101.

As shown in FIG. 30, a dense silicon nitride film 202a as a copper-diffusion preventive layer is deposited on the third metal (Cu) interconnect layer 100 and the second pad electrode 101 and thereafter, a protective insulating film 202b such as a silicon nitride film, a silicon oxide film, a silicon oxynitride film or a stacked structure film thereof is stacked to a thickness of the order of 1.0 μm. Then, on the protective insulating film 202b, a buffer coat layer 203 such as made of polyimide is formed as a second protective insulating film depending a necessity to a thickness approximately in the range of 5 to 10 μm and an opening 204 is further formed in the desired site in the main electrode layer 101 for connection to an external terminal (not shown) using a wire bonding method or the like method.

As described above, according to the embodiment of the invention, since the pad electrode has a structure, as shown in FIGS. 27A and 27B, in which the lower electrode layer 250 formed as a buried metal interconnect layer and the main electrode layer 101 are superimposed on each other with a large area connection hole 251 interposed therebetween and at least one of the lower electrode layer 250 and the connection hole 251 is of a shape of a regular octagon, therefore, a load or impact force imposed on the pad electrode can be alleviated by increase in an effective thickness of the pad electrode in a corresponding manner to the magnitude of the increase when the load or impact force actually occurs in connection to an external terminal using wire bonding or the like and moreover, stress concentration at corners of the lower electrode layer 250 and the connection hole 251, where a stress is concentrated with ease, can greatly decreases compared with a case of a pad electrode with a shape of a tetragon. Accordingly, cracking can be prevented from occurring in the interlayer insulating film.

Therefore, since bonding can be performed in a condition in which a strength of connection with the external terminal is sufficiently ensured, the connection can be effected in a stable manner with ease, which leads to an effect to obtain a high:quality semiconductor device at a low cost.

Moreover, the embodiment of the invention is an effective method when a pad electrode is down scaled, though the pad electrode requires a high allowable setting value of a load or impact force receiving when bonding is effected in the sense of relativity.

Furthermore, since a metal interconnect layer as the uppermost layer is constructed such that the third metal interconnect layer 100 and the fourth metal interconnect 200 are superimposed on each other, the effective thickness is larger and thereby a lower resistivity is realized, with the result that wiring delay or noise margin can be effectively reduced.

Moreover, while a metal (Cu) interconnect layer of a relative large thickness of the order in the range of 0.8 to 1.5 $\mu$m is generally adopted as the uppermost layer taking into consideration reliability of connection with an external terminal using wire bonding or the like, the metal (Cu) interconnect layer as the uppermost layer can be thinner so as to be more suitable for micro-fabrication since an effective thickness of the pad electrode is larger by employing the pad electrode of a superimposing structure with an interposing connection hole of a large cross-sectional area, as adopted in the embodiment.

While in FIGS. 27A and 27B, description is given of the case where the lower electrode layer and the main electrode layer are superimposed on each other with a large-area connection hole interposed therebetween and the lower electrode layer 250 is in the shape of a regular octagon, a similar effect is also exerted in a case of a polygon in which an internal angle of a selected corner is larger than 90 degrees as well.

Figure 31:
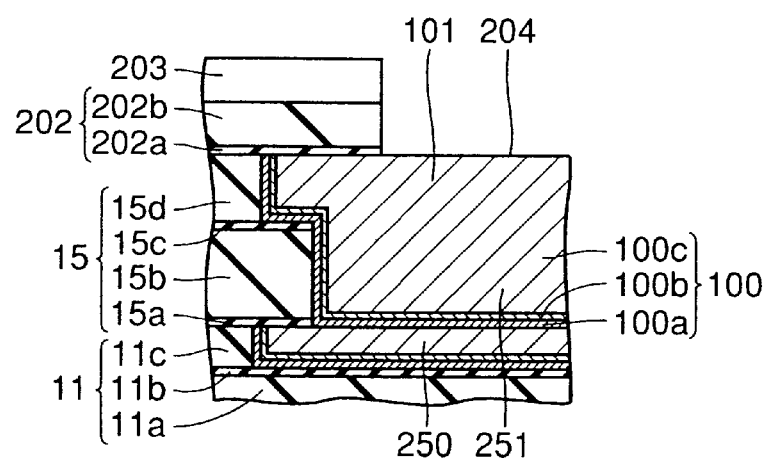
FIG. 31 is a sectional view of a main part of a semiconductor device in the fourth embodiment according to the invention.
Figure 32:
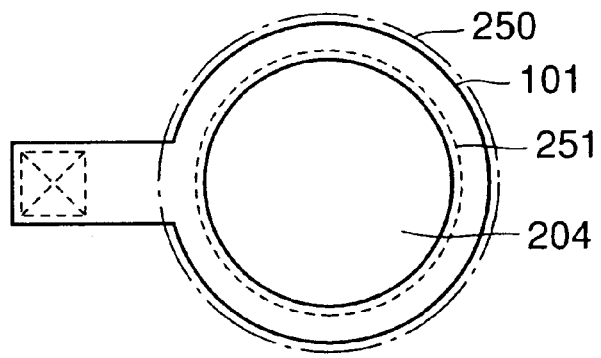
FIG. 32 is a plan view of a main part of a first other example of the semiconductor device in the fourth embodiment according to the invention.
Figure 33:
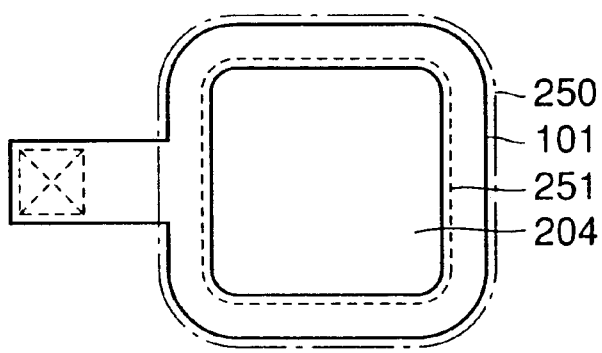
FIG. 33 is a plan view of a main part of a second other example of the semiconductor device in the fourth embodiment according to the invention.
Figure 34:
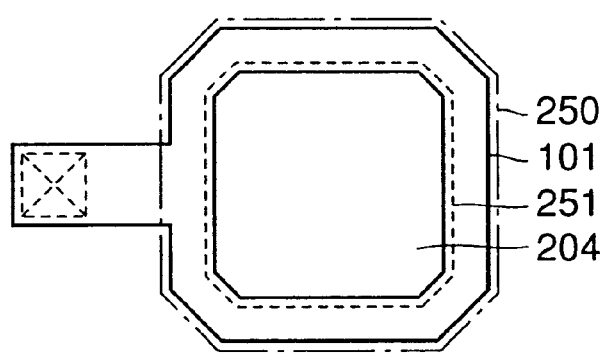
FIG. 34 is a plan view of a main part of a third other example of the semiconductor device in the fourth embodiment according to the invention.
Figure 35:
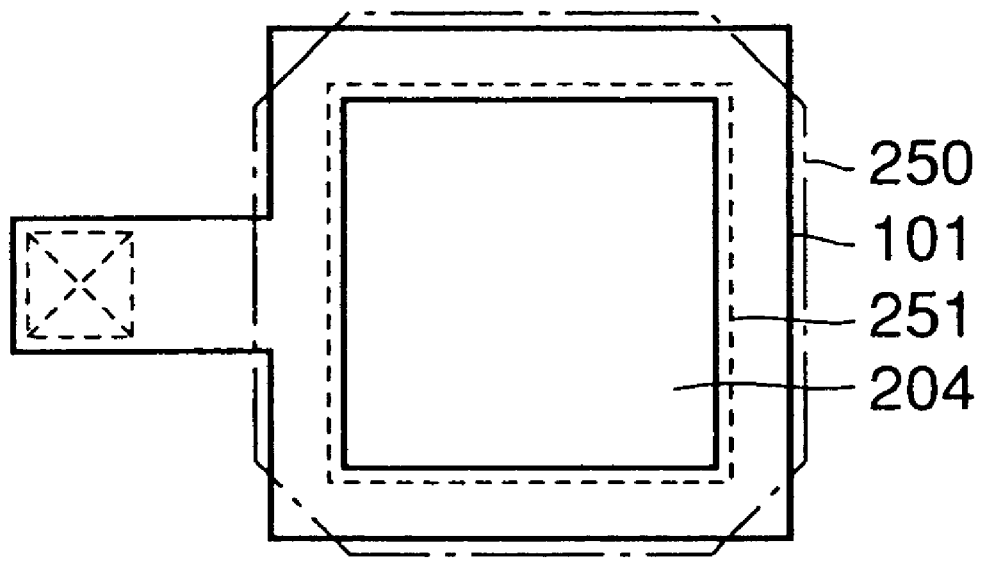
FIG. 35 is a plan view of a main part of a fourth other example of the semiconductor device in the fourth embodiment according to the invention.

Moreover, various shapes of a pad electrode may be available: a pad electrode, whose sectional view is shown in FIG. 31, and in which a plan view of the lower electrode layer 250 is of a shape of a circle as shown in FIG. 32 or an ellipse and a pad electrode having the main electrode layer, large-area connection hole and lower electrode each of a shape of a polygon with a corner of interest rounded or chamfered as shown in FIGS. 33 and 34, Moreover, as shown in FIG. 35, a pad electrode may be adopted in which only the lower electrode layer 250 has a shape as described above, but the connection hole 251, the main electrode layer 101 and the pad electrode opening 204 each have a conventional shape, for example a tetragon. Furthermore, a shape of the lower electrode layer 250 is not limited to the described above variations, but one obtained by adopting of the shapes as described above partly or in combination thereof may be adopted.

Fifth Embodiment

A similar effect is also exerted in a pad electrode with the following structure and shapes of constituents thereof: A pad electrode has a structure in which a lower electrode layer and a main electrode layer are superimposed on each other with a large-area connection hole interposed therebetween, wherein a thickness of the lower electrode layer is partially larger so as to form a lower protruding section. A shape of a plan view of the lower protruding section is one selected from the group consisting of a circle, an ellipse, a polygon with at least one internal angle larger than 90 degrees and a polygon with at least one corner chamfered or rounded, or alternatively, one of shapes obtained by adopting of the shapes as described above partly or in combination thereof. In FIG. 36, shown is the structure of a semiconductor device according to such an embodiment, which different from the above described of the invention.

Figure 36A:
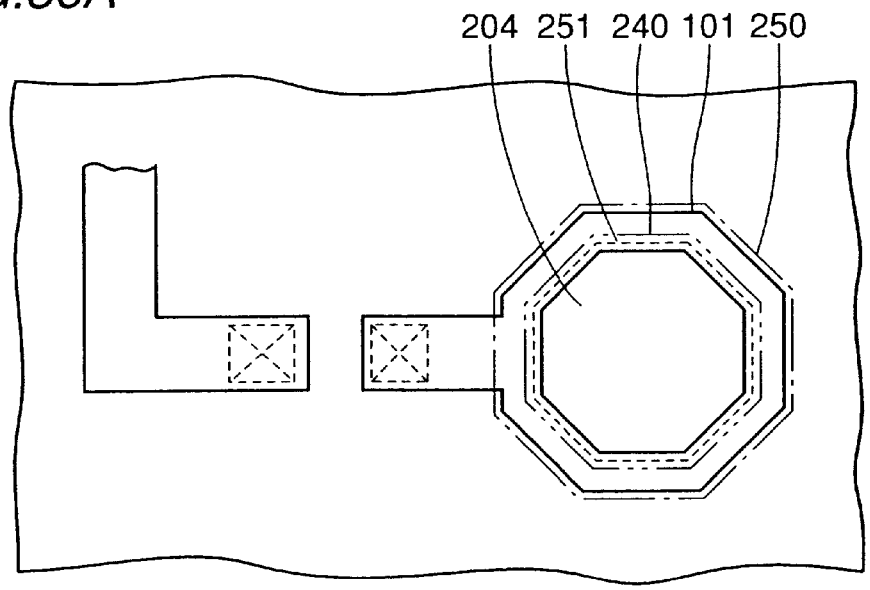
FIG. 36A is a plan view of a semiconductor device in a fifth embodiment according to the invention and FIG. 36B is a sectional view of the semiconductor device.
Figure 36B:
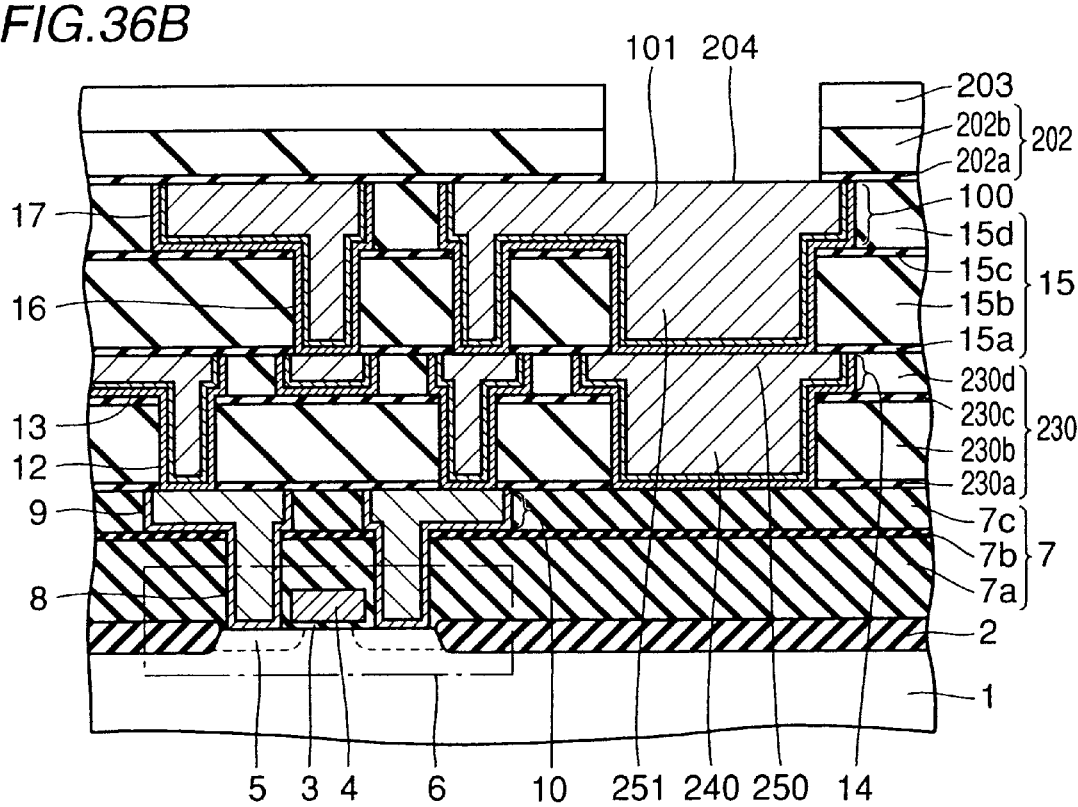

As shown in FIG. 36B, a pad electrode includes a lower protruding section 240 beneath the lower electrode 250. The other portions are similar to those shown in the fourth embodiment.

Figure 37:
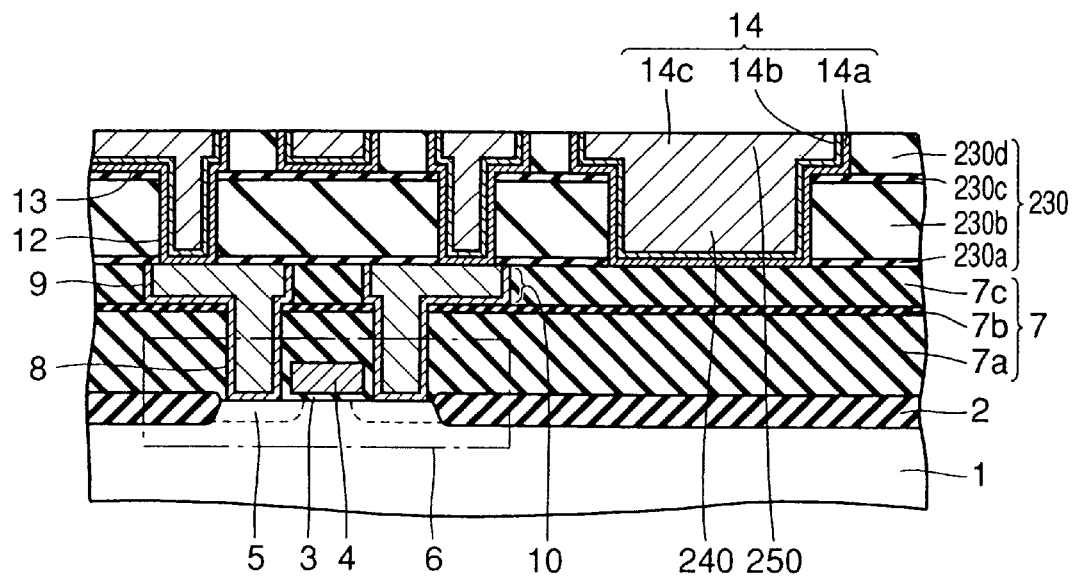
FIG. 37 is a sectional view illustrating a first step of the fabrication process for a semiconductor device in the fifth embodiment according to the invention.
Figure 38:
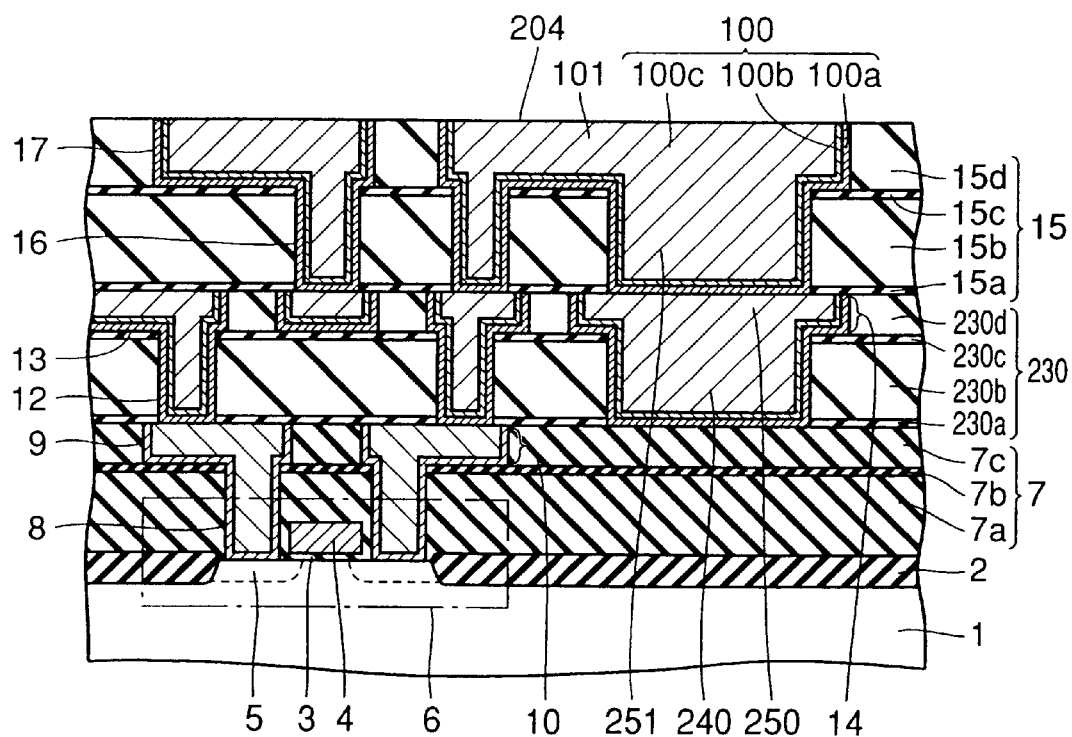
FIG. 38 is a sectional view illustrating a second step of the fabrication process for a semiconductor device in the fifth embodiment according to the invention.
Figure 39:
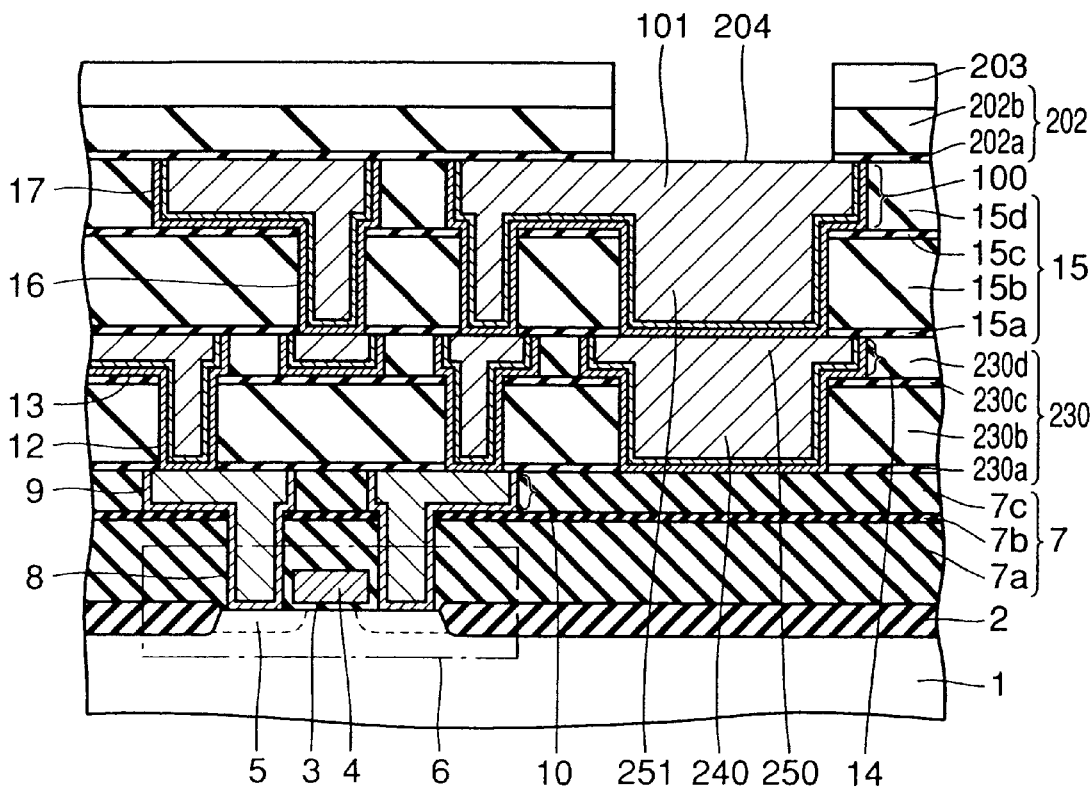
FIG. 39 is a sectional view illustrating a third step of the fabrication process for a semiconductor device in the fifth embodiment according to the invention.

In FIGS. 37 to 39, shown is a fabrication process for the structure shown in FIGS. 36A and 36B.

As shown in FIG. 37, the fabrication process is the same as the fabrication process (FIGS. 123 to 124) for the convention semiconductor device shown in FIGS. 122A and 122B up to a step where the first metal (W) interconnect layer 10 is formed.

On the first metal (W) interconnect 10, stacked is a first interlayer insulating film 230 of a four-layer structure composed of a silicon nitride film 230a, an insulating film 230b such as a silicon oxide film, a silicon nitride film 230c and an insulating film 230d such as a silicon oxide film by means of a plasma CVD method or the like. Then, a first via hole 12 and a second interconnect trench 13 are formed in the desired site in the first interlayer insulating film 11 using photolithography and an etching technique at a desired site on a surface thereof.

While a recess 240 is formed in a part of a lower electrode layer forming region simultaneously with when the first via hole 12 is formed, a shape of the recess 240 is selected a polygon with an internal angle larger than 90 degrees, for example a regular octagon.

Please note that the silicon nitride film 230a is to prevent the recess 240 of the lower electrode layer forming region from being excessively etched when the first via hole 12 is formed and after dry etching is effected with the silicon nitride film 230a as a stopper film, the silicon nitride film 230a is lightly etched and thereby, the recess 240 can be processed with good controllability.

Further, while when the second interconnect trench 13 is formed, an interconnect trench is formed in a region where the lower electrode is provided, a shape of the latter interconnect trench is also selected a polygon with an internal angle larger than 90 degrees, for example a regular octagon.

Thereafter, an underlying film 14a, copper films 14b and 14c are deposited over all the surface such that the first via hole 12, the second interconnect trench 13 and the lower electrode layer forming region are filled with the films 14a and 14b and 14c, and unnecessary portions of the copper films 14c and 14b, and the underlying film 14a are removed by means of a chemical mechanical method or the like to form a second buried metal (Cu) interconnect layer 14 and a lower electrode layer 250 with a section 240 which is part of the lower electrode layer whose thickness is partially larger than the rest of the layer.

As shown in FIG. 38, on the second buried metal (Cu) interconnect layer 14 and the lower electrode layer 250, stacked is a second interlayer insulating film 15 of a four-layer structure composed of a silicon nitride film 15a, an insulating film 15b such as a silicon oxide film, a silicon nitride film 15c and an insulating film 15d such as a silicon oxide film by means of a plasma CVD method or the like. Then, a second via hole 16 and a third interconnect trench 17 are formed in the desired site in the second interlayer insulating film 15 using photolithography and an etching technique at a desired site on a surface thereof.

At this time, a connection hole 251 is also formed on the lower electrode layer simultaneously with when the second via hole is formed, and a shape of a plan view of the connection hole is selected a polygon with an internal angle larger than 90 degrees, for example a regular octagon.

Further, while when the third interconnect trench is formed, an interconnect trench is also formed in a portion where the main electrode layer is provided, the interconnect trench of the main electrode layer is also of a shape of a polygon with an internal angle lager than 90 degrees, for example an octagon.

An underlying film 100a and copper films 100b and 100c are deposited over all the surface such that the second via hole 16, the third interconnect trench 17, the connection hole 251 on the first electrode pad and the second pad electrode forming section 101 are filled with the films 100a, 100b and 100c using a method similar to the above described. Thereafter, unnecessary portions of the deposited films 100a, 100b and 100c are removed by a chemical mechanical polishing process to form a third buried metal (Cu) interconnect layer 100 and the main electrode layer 101.

As shown in FIG. 39, a dense silicon nitride film 202a as a copper-diffusion preventive layer is deposited on the third metal (Cu) interconnect layer 100 and the main electrode layer 101 and thereafter, a protective insulating film 202b such as a silicon nitride film, a silicon oxide film, a silicon oxynitride film or a stacked structure film thereof is stacked to a thickness of the order of 1.0 μm. Then, on the protective insulating film 202b, a buffer coat layer 203 such as made of polyimide is formed as a second protective insulating film depending a necessity to a thickness approximately in the range of 5 to 10 μm and an opening 204 is further formed in the desired site in the pad electrode 101 for connection to an external terminal (not shown) using a wire bonding method or the like.

As described above, according to the embodiment of the invention, since the pad electrode has a structure, as shown in FIGS. 36A and 36B, in which the lower electrode layer 250 and the main electrode layer 101, both being formed in respective buried metal interconnect layers, are superimposed on each other with the large area insulating film hole 251 interposed therebetween, a thickness of the lower electrode layer 250 is partially larger downward to form the lower protruding section 240 and the lower protruding section 240 is of a plan view shape of a regular octagon; therefore, a load or impact force imposed on the pad electrode can be alleviated by increase in an effective thickness of the pad electrode in a corresponding manner to the magnitude of the increase even when the load or impact force actually occurs in connection to an external terminal using wire bonding or the like method and moreover, stress concentration at a corner of the lower protruding section 240 of the lower electrode layer, where stress is concentrated with ease, can greatly decreases compared with a case of a lower protruding section with a tetragonal shape. Accordingly, cracking can be prevented from occurring in the interlayer insulating film.

Therefore, bonding can be performed in a condition in which a strength of connection with the external terminal is sufficiently ensured, the connection can be effected in a stable manner with ease, which leads to an effect to obtain a high quality semiconductor device at a low cost.

Further, the embodiment of the invention is an effective method when a pad electrode is down scaled, though the pad electrode requires a high allowable setting value of a load or impact force receiving when bonding is effected in the sense of relativity.

Moreover, while a metal (Cu) interconnect layer of a relative large thickness of the order in the range of 0.8 to 1.5 μm is generally adopted as the uppermost layer taking into consideration reliability of connection with an external terminal by wire bonding or the like, the metal (Cu) interconnect layer as the uppermost layer in the embodiment can be thinner so as to be more suitable for micro-fabrication since an effective thickness of the pad electrode is larger by employing the pad electrode of a superimposing structure with an interposing connection hole of a large cross-sectional area.

While in FIGS. 36A and 36B, description is given of the case where the lower electrode layer and the main electrode layer are superimposed on each other with a large-area connection hole interposed therebetween and the lower protruding section 240 of the lower electrode layer is in the shape of a regular octagon, a similar; effect is exerted in a case of a polygon in which an internal angle of a selected corner is larger than 90 degrees as well.

Figure 40:
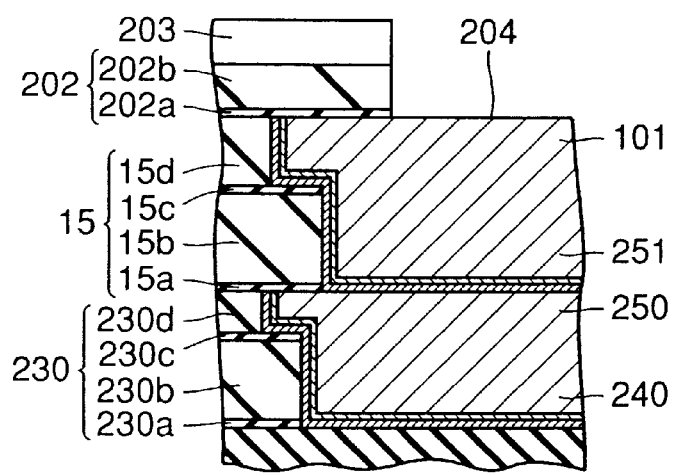
FIG. 40 is a sectional view of a main part of a semiconductor device in the fifth embodiment according to the invention.
Figure 41:
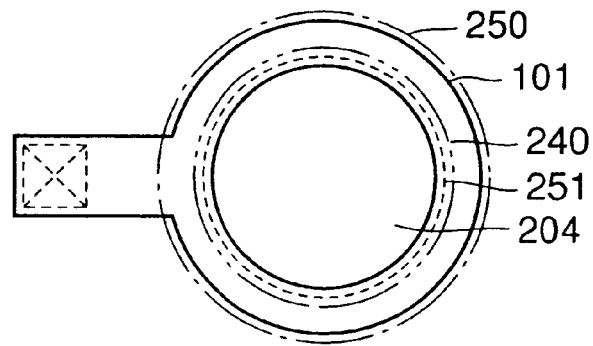
FIG. 41 is a plan view of a main part of a first other example of the semiconductor device in the fifth embodiment according to the invention.
Figure 42:
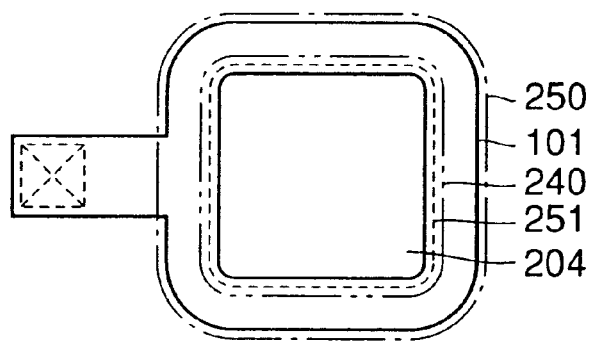
FIG. 42 is a plan view of a main part of a second other example of the semiconductor device in the fifth embodiment according to the invention.
Figure 43:
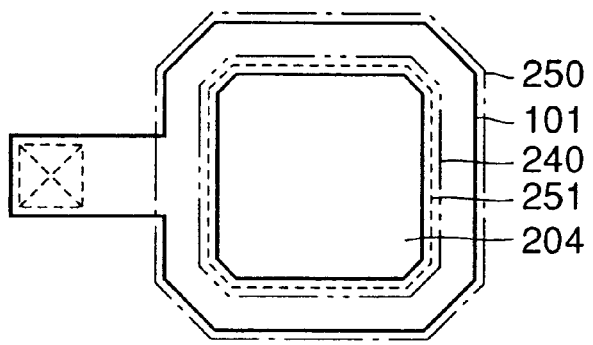
FIG. 43 is a plan view of a main part of a third other example of the semiconductor device in the fifth embodiment according to the invention.

Moreover, various shapes of a lower protruding section of the lower electrode layer electrode may be available: a lower protruding section 240, whose sectional view is shown in FIG. 40, and whose plan view is of a shape of a circle as shown in FIG. 41 or an ellipse; and a lower protruding section 240 with a selected corner rounded or chamfered as shown in FIGS. 42 and 43.

Figure 44:
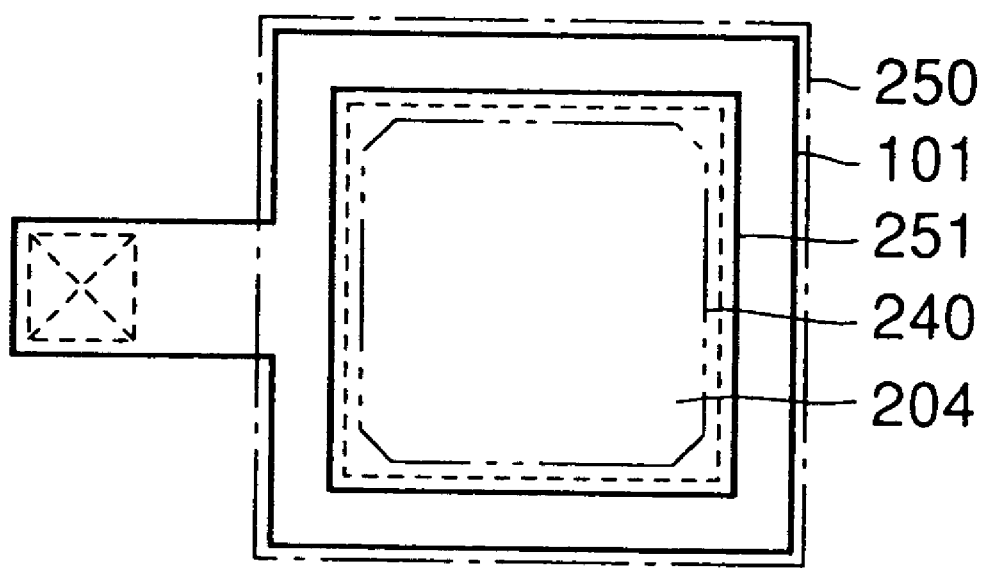
FIG. 44 is a plan view of a main part of a fourth other example of the semiconductor device in the fifth embodiment according to the invention.

Furthermore, as shown in FIG. 44, a pad electrode may be adopted in which only the lower protruding section 240 of the lower electrode layer has a shape as described above, but the lower electrode layer 250, the connection hole 251, the main electrode layer 101 and the pad electrode opening 204 each have a conventional shape, for example a tetragon.

In addition, a shape of the lower protruding section 240 of the lower electrode layer is not limited to the described above variations, but one obtained by adopting of the shapes as described above partly or in combination thereof.

Sixth Embodiment

A similar effect is also exerted in a structure of a pad electrode in which at least part is made of a buried metal interconnect layer and a stress buffer insulating partition is provided at a corner of the pad electrode.

Figure 45A:
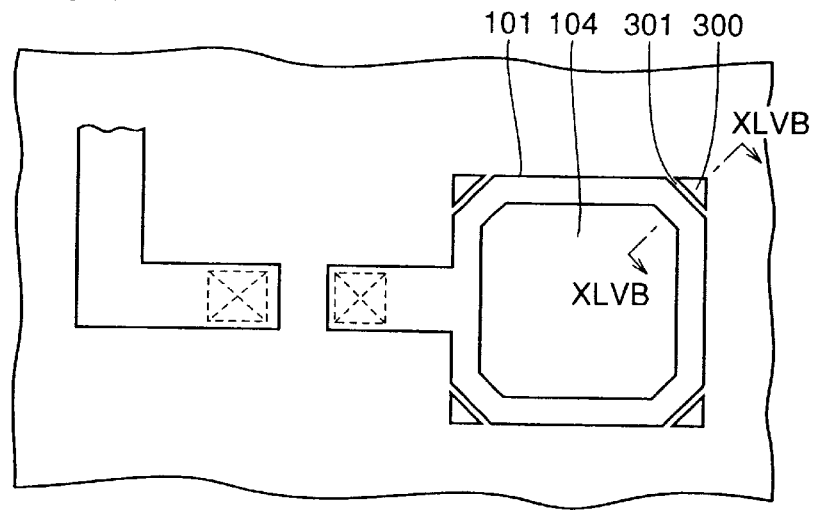
FIG. 45A is a plan view of a semiconductor device in a sixth embodiment according to the invention.
Figure 45B:
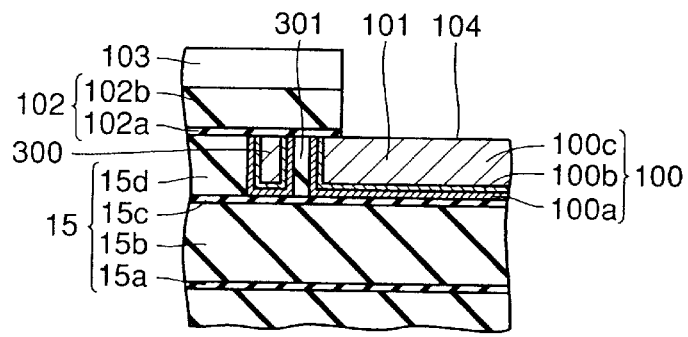
FIG. 45B is a sectional view taken on line XLVB—XLVB of FIG. 45A as viewed in the direction of arrows and FIG. 45C is a sectional view of the semiconductor device.
Figure 45C:
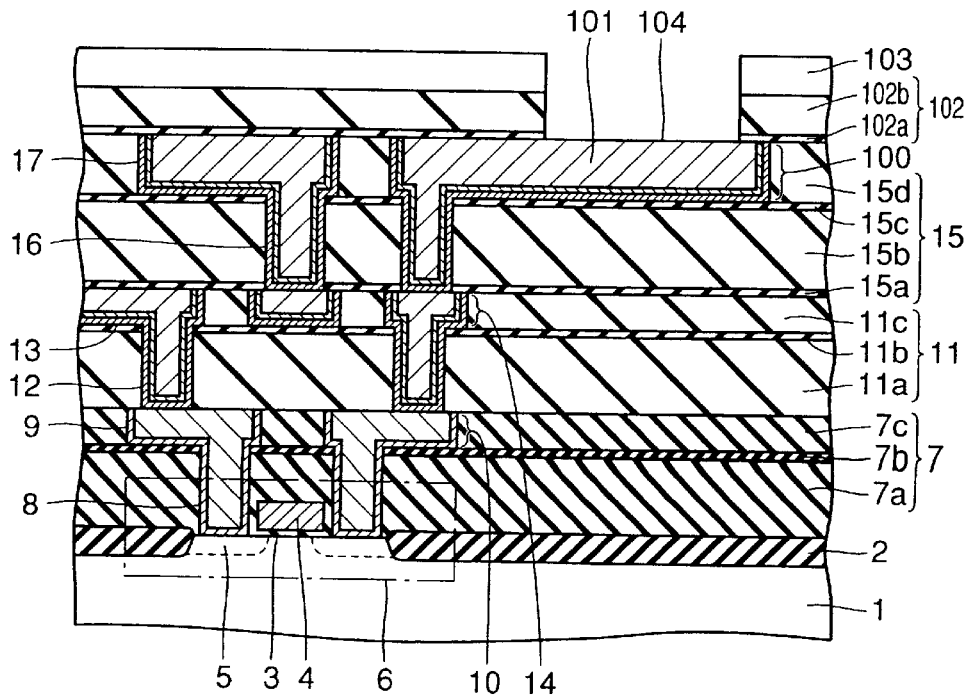

In FIGS. 45A to 45C, shown is a structure of the semiconductor device according to the sixth embodiment.

As shown in FIG. 45A, a stress buffer insulating partition 301 is provided in a corner region of a pad electrode such that a corner portion is divided and separated as a buffer metal (Cu) layer 300. The other portions of the structure are similar to those shown in FIG. 1.

A fabrication method for the semiconductor device shown in FIGS. 45A to 45C is similar to that in the first embodiment shown in FIGS. 1A and 1B.

That is, after the structure shown in FIG. 129 is formed based on a conventional technique, on the second metal (Cu) interconnect layer 14, as shown in FIG. 2, stacked is a second interlayer insulating film 15 of a four-layer structure composed of a silicon nitride film (SiN) 15a as a copper (Cu)-diffusion preventive layer, an insulating film 15b such as a silicon oxide film (SiO), a silicon nitride film (SiN) 15c and an insulating film 15d such as a silicon oxide film (SiO) by means of a plasma CVD method or the like.

Figure 48:
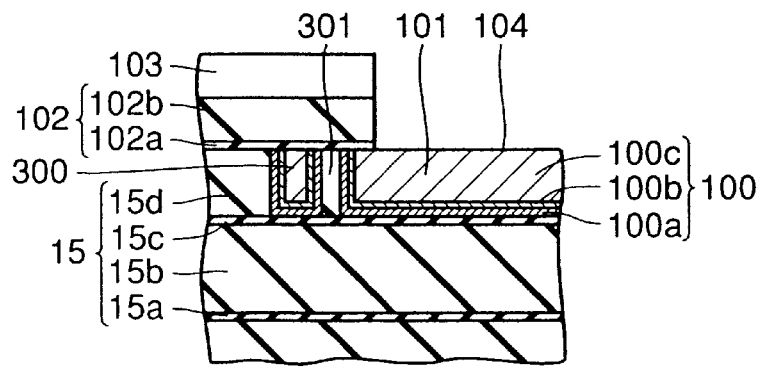
FIG. 48 is a sectional view, taken on line XLVIII—XLVIII of FIG. 49 as viewed in the direction of arrows, of a main part of the semiconductor device in the sixth embodiment according to the invention.
Figure 49:
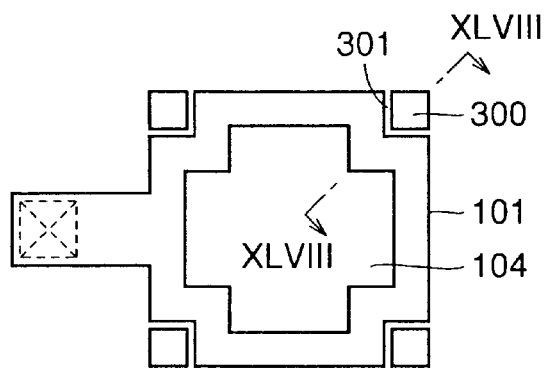
FIG. 49 is a plan view of a main part of a first other example of the semiconductor device in the sixth embodiment according to the invention.
Figure 50:
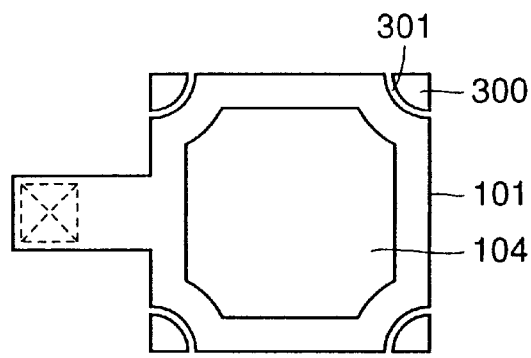
FIG. 50 is a plan view of a main part of a second other example of the semiconductor device in the sixth embodiment according to the invention.
Figure 51:
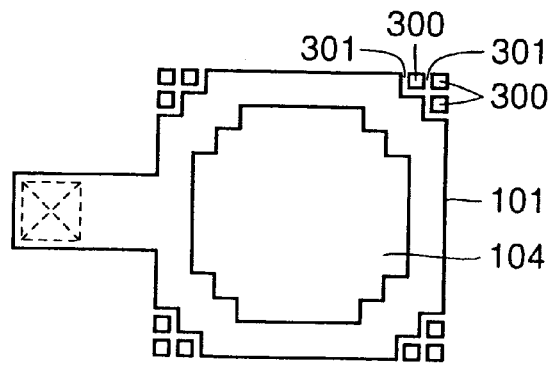
FIG. 51 is a plan view of a main part of a third other example of the semiconductor device in the sixth embodiment according to the invention.
Figure 52A:
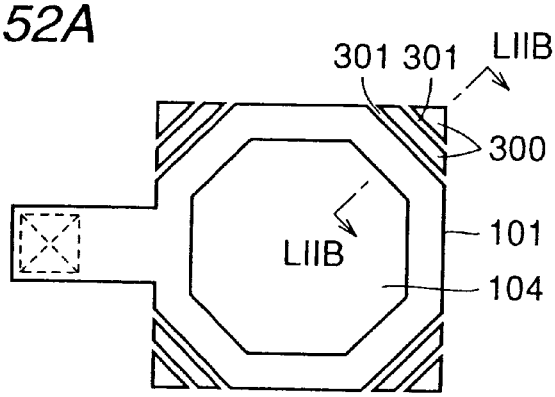
FIG. 52A is a plan view of a main part of a fourth other example of the semiconductor device in the sixth embodiment according to the invention and FIG. 52B is a sectional view taken on line LIIB—LIIB of FIG. 52A as viewed in the direction of arrows.
Figure 52B:
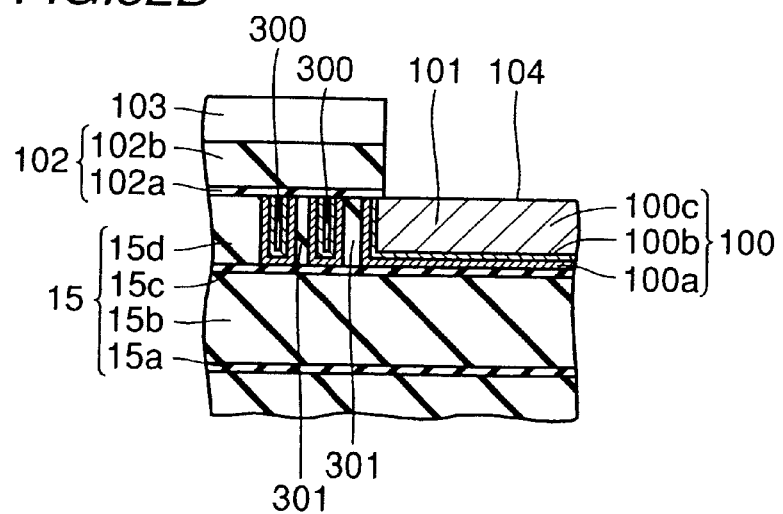

A recess as a second via hole 16 and a third interconnect trench 17 is formed in the second interlayer insulating film 15 at a desired site on a surface thereon using photolithography and an etching technique. At this time, simultaneously, a recess is also formed at a site where a pad electrode is provided, and an insulating partition recess for forming a stress buffer insulating partition is formed in a corner region of the pad electrode recess. The insulating partition recess is to form a stress buffer metal layer 300 of FIG. 48 and a plan view shape thereof is one like stress buffer metal layers 300 exemplified in FIGS. 45A, 49 to 51, 52A and 53A.

An underlying film 100a, a copper seed film 100b and a copper plated film 100c are deposited over all the surface such that the second via hole 16 and the third interconnect trench 17 are filled with the films 100a, 100b and 100c to a thickness approximately in the range of 1.5 to 3 μm using a method similar to the above described. Thereafter, unnecessary portions of the copper films 100c and 100b and the underlying film 100a are removed by means of a chemical mechanical polishing processing to form a third buried metal (Cu) interconnect layer 100, a pad electrode 101 and a stress buffer metal layer 300.

Process steps following the last step in the above described procedure are the same as those described in the first embodiment.

Figure 46:
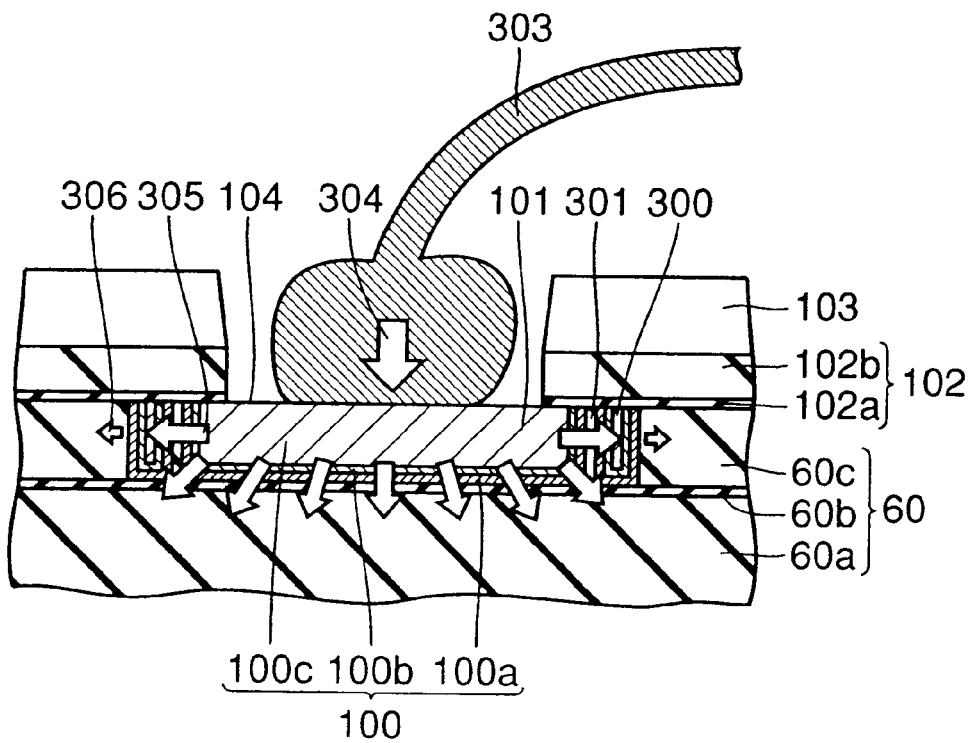
FIG. 46 is a sectional view illustrating the way to transmit an impact force to a semiconductor device in the sixth embodiment according to the invention.
Figure 47:
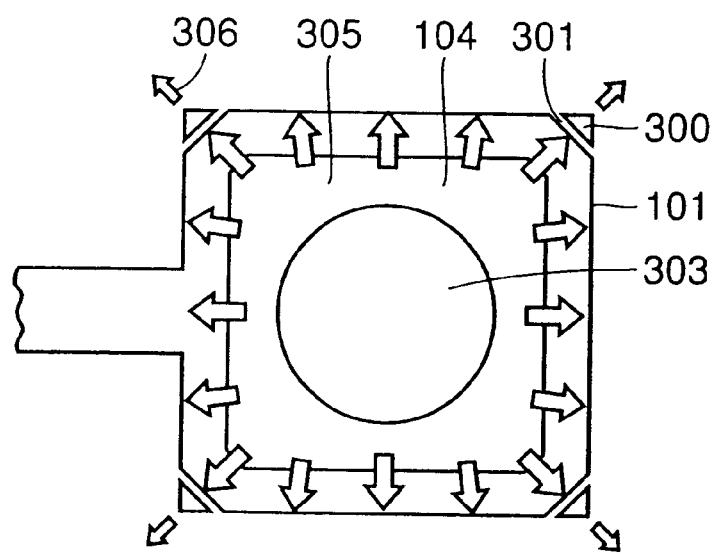
FIG. 47 is a plan view illustrating the way to transmit an impact force to the semiconductor device in the sixth embodiment according to the invention.

According to the embodiment of the invention, as shown in FIGS. 46 and 47, the stress buffer metal layer 300 is placed at a corner of the pad electrode and the stress buffer insulating partition 301 is interposed between the pad electrode 101 and the stress buffer metal layer 300. With such a structure adopted, when a load 304 or impact force 305 is imposed on the pad electrode 101 in connection to an external terminal by means of wire bonding or the like, a stress is buffered at a corner of the pad electrode where the stress is especially concentrated with ease by a slight elastic deformation of the stress buffer insulating partition 301, such that only a small stress (impact force) 306 acts on the interlayer insulation film around the corner of the pad electrode. Accordingly, cracking can be prevented from occurring in the interlayer insulating film around the corner of the pad electrode 101.

While in FIGS. 45A to 45C, the stress buffer insulating partition 301 is formed by providing the stress buffer metal (Cu) layer 300 of a shape of a triangle at an corner of the pad electrode 101, insulating partitions of another shape also exerts a similar effect. A plurality of stress buffer partitions may be formed.

Figure 53A:
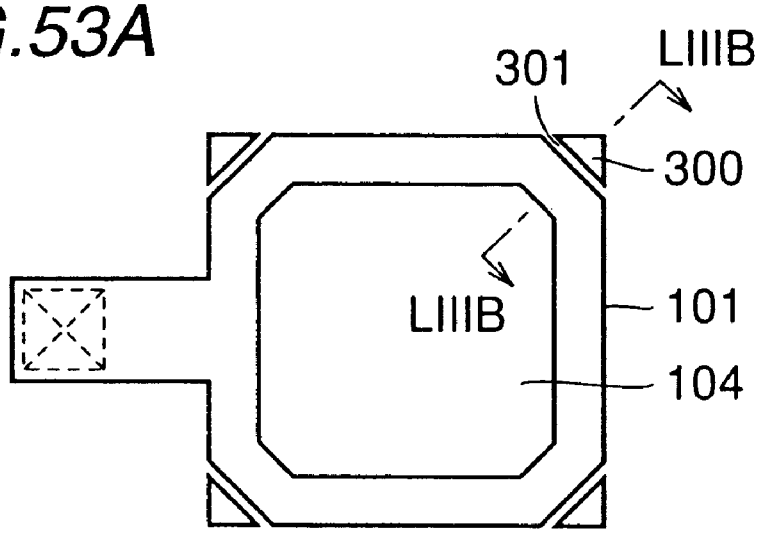
FIG. 53A is a plan view of a main part of a fifth other example of the semiconductor device in the sixth embodiment according to the invention and FIG. 53B is a sectional view taken on line LIIIB—LIIIB of FIG. 53A as viewed in the direction of arrows.
Figure 53B:
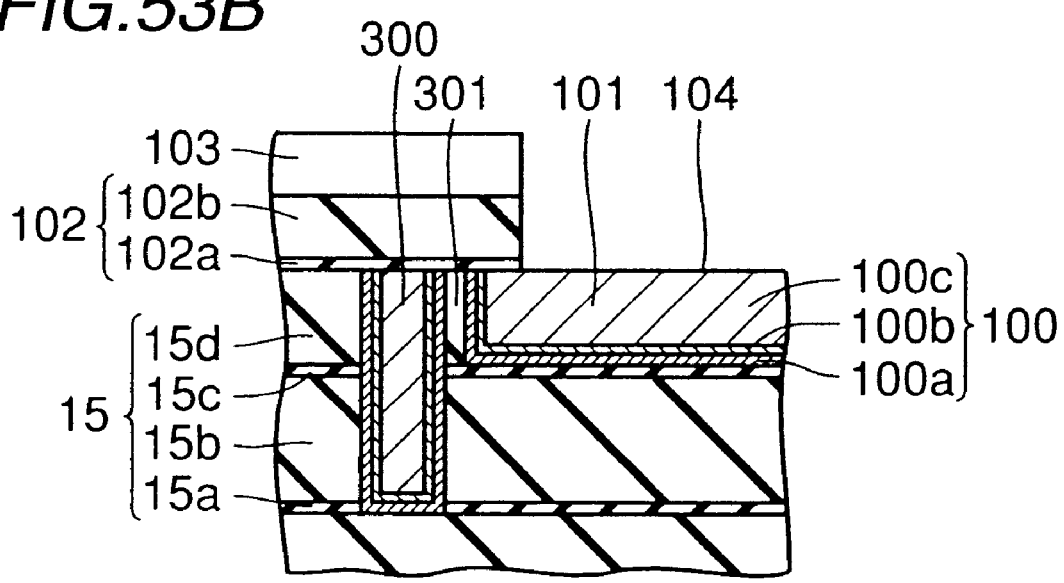

For example, the following case also exerts more of the effect: A plurality of stress buffer insulating partitions 301 are formed by providing a plurality of stress buffer metal layers 300 at corners of the pad electrode 101, as shown in a sectional view of FIG. 48 and in plan views of FIGS. 49 to 52B. Further, alterations in structure and shape may be available: As shown in FIGS. 53A and 53B, a thickness of the stress buffer metal layer 300, which is located at a corner of the pad electrode 101, may be changed so as to be different from the other parts of the pad electrode.

Seventh Embodiment

A similar effect is also exerted in a structure of a pad electrode in which at least part is made of a buried metal interconnect layer, a thickness of a metal electrode is partially larger downward than the rest thereof and a stress buffer insulating partition is provided at a corner of the metal electrode.

Figure 54A:
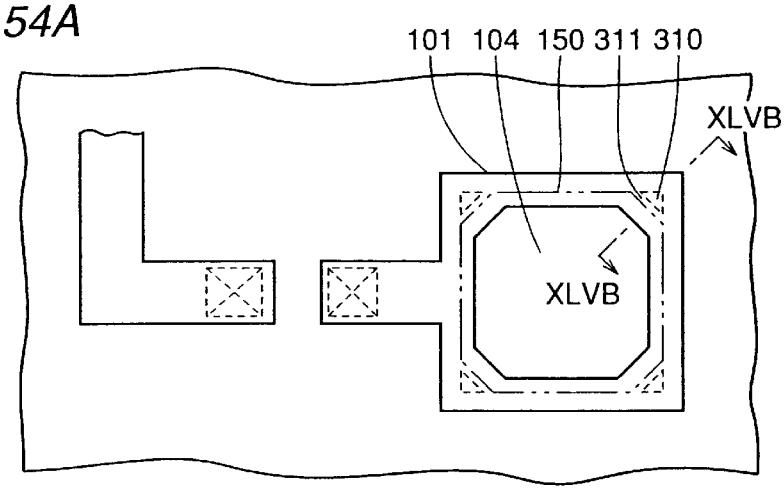
FIG. 54A is a plan view of a semiconductor device in a seventh embodiment according to the invention.
Figure 54B:
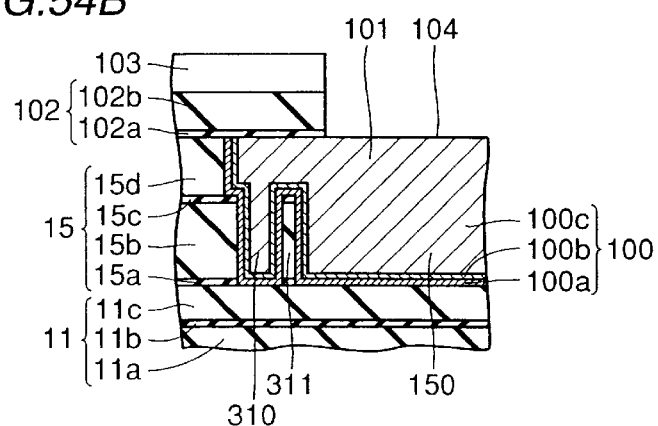
FIG. 54B is a sectional view taken on line XLVB—XLVB of FIG. 54A as viewed in the direction of arrows and FIG. 54C is a sectional view, of the semiconductor device.
Figure 54C:
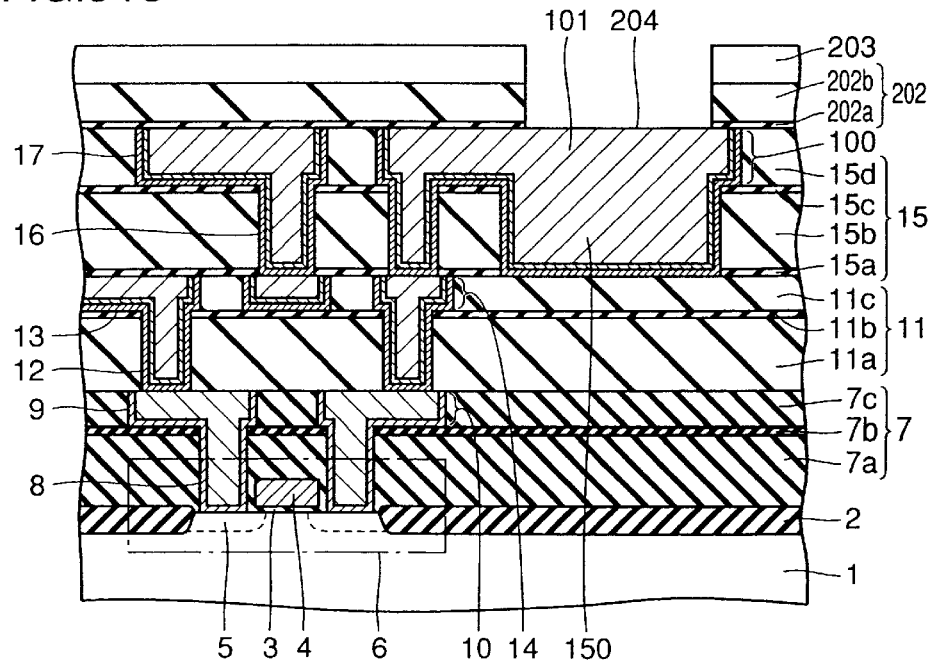

In FIGS. 54A to 54C, shown is a structure of the semiconductor device in this embodiment of such a structure. A pad section includes a lower protruding section 150. The lower protruding section 150 includes a stress buffer insulating partition 311 by which a corner portion is separated as a stress buffer metal layer 310 in the corner region thereof.

According to this embodiment, as shown in FIGS. 54A to 54C, the structure is such that the stress buffer metal (Cu) layer 310 is formed at a corner of the lower protruding section of the pad electrode and the stress buffer insulating partition 311 is interposed between the lower protruding section 150 of the pad electrode and the stress buffer metal(Cu) layer 310.

With such a structure adopted, when a load or impact force is imposed on the lower protruding section 150 of the pad electrode in connection to an external terminal by means of wire bonding or the like, a stress is buffered at a corner of the lower protruding section where the stress is especially concentrated with ease by a slight elastic deformation of the stress buffer insulating partition 311, such that only a small stress (impact force) acts on the interlayer insulation film around the corner of the lower protruding section. Accordingly, cracking can be prevented from occurring in the interlayer insulating film around the corner of a thicker section 150 of the pad electrode.

While in FIGS. 54A to 54C, the stress buffer insulating partition 311 is formed by providing the stress buffer metal layer 310 of a shape of a triangle at a corner of the thicker section 150 of the pad electrode, a similar effect is also exerted with an insulating partition of another shape. A plurality of stress buffer insulating partitions may be formed.

Figure 55:
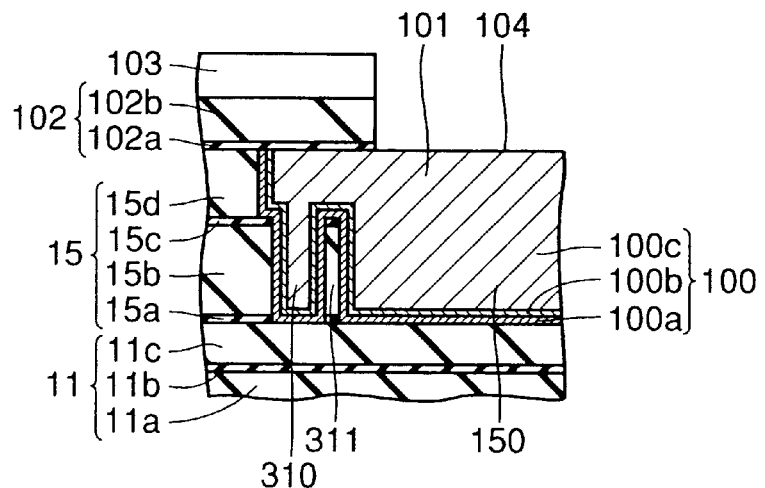
FIG. 55 is a sectional view, taken,on line XLVIII—XLVIII of FIG. 49 as viewed in the direction of arrows of a main part of a semiconductor device in the seventh embodiment according to the invention.
Figure 56:
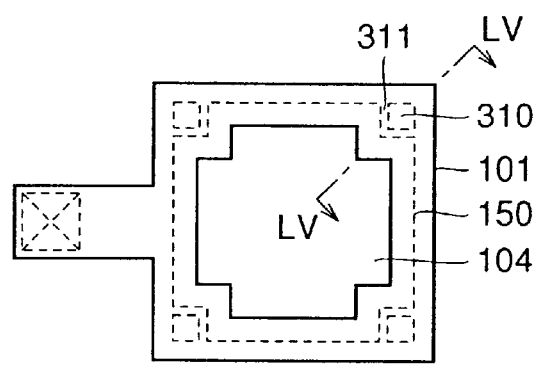
FIG. 56 is a plan view of a main part of a first other example of the semiconductor device in the seventh embodiment according to the invention.
Figure 57:
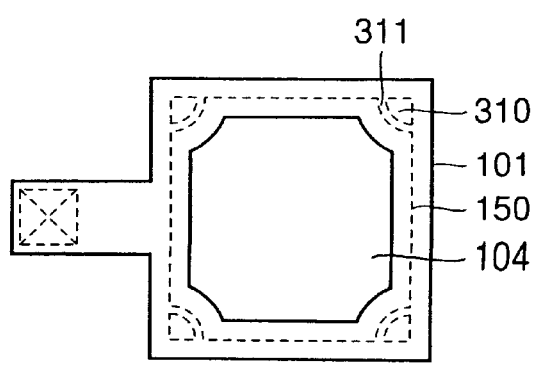
FIG. 57 is a plan view of a main part of a second other example of the semiconductor device in the seventh embodiment according to the invention.

For example, as shown in FIGS. 55 to 57, a tetragon, a quartered circle and the like can be adopted as a shape of a stress buffer metal (Cu) layer 310 placed at a corner of the thicker section 150 of the pad electrode.

Figure 58:
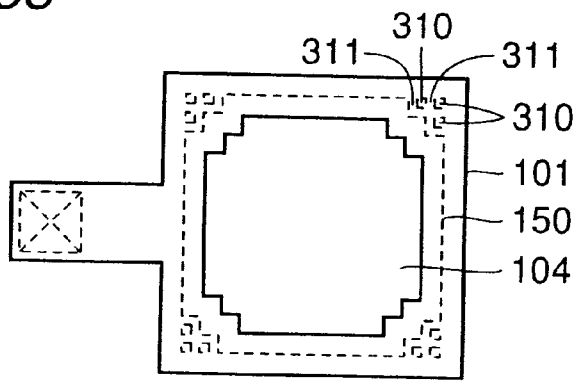
FIG. 58 is a plan view of a main part of a third other example of the semiconductor device in the seventh embodiment according to the invention.
Figure 59A:
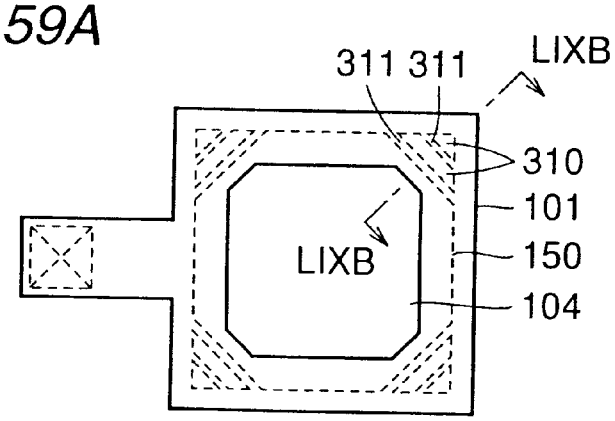
FIG. 59A is a plan view of a main part of a fourth other example of the semiconductor device in the seventh embodiment according to the invention and FIG. 59B is a sectional view taken on line LIXB—LIXB of FIG. 59A as viewed in the direction of arrows.
Figure 59B:
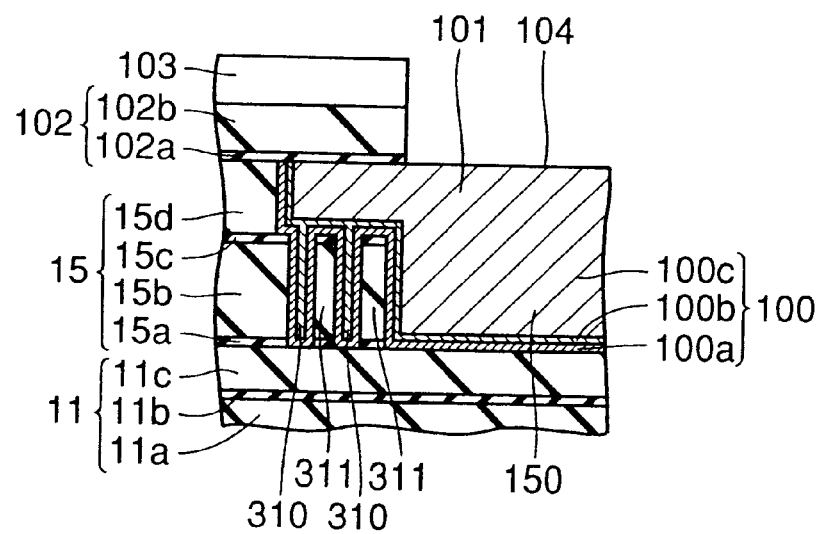

As shown in FIGS. 58, 59A and 59B, more of the effect can be exerted using a plurality of stress buffer insulating partitions 311 together with a plurality of stress buffer metal (Cu) layers 310 located at corners of a thicker section 150 of the pad electrode.

Figure 60A:
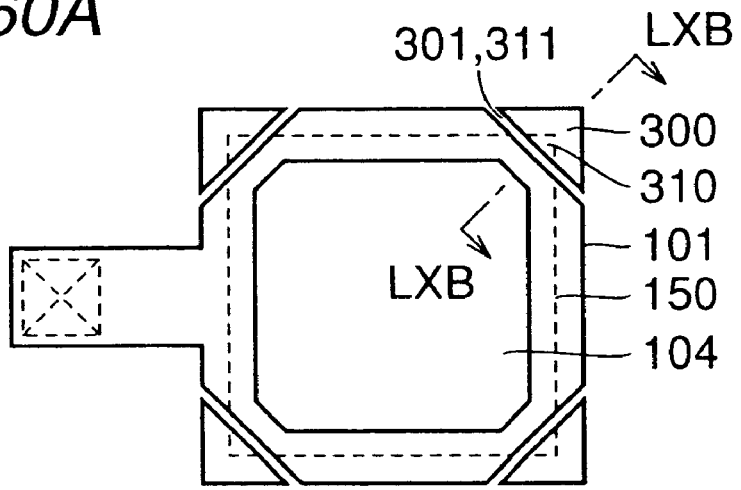
FIG. 60A is a plan view of a main part of a fifth other example of the semiconductor device in the seventh embodiment according to the invention and FIG. 60B is a sectional view taken on line LXB—LXB of FIG. 60A as viewed in the direction of arrows.
Figure 60B:
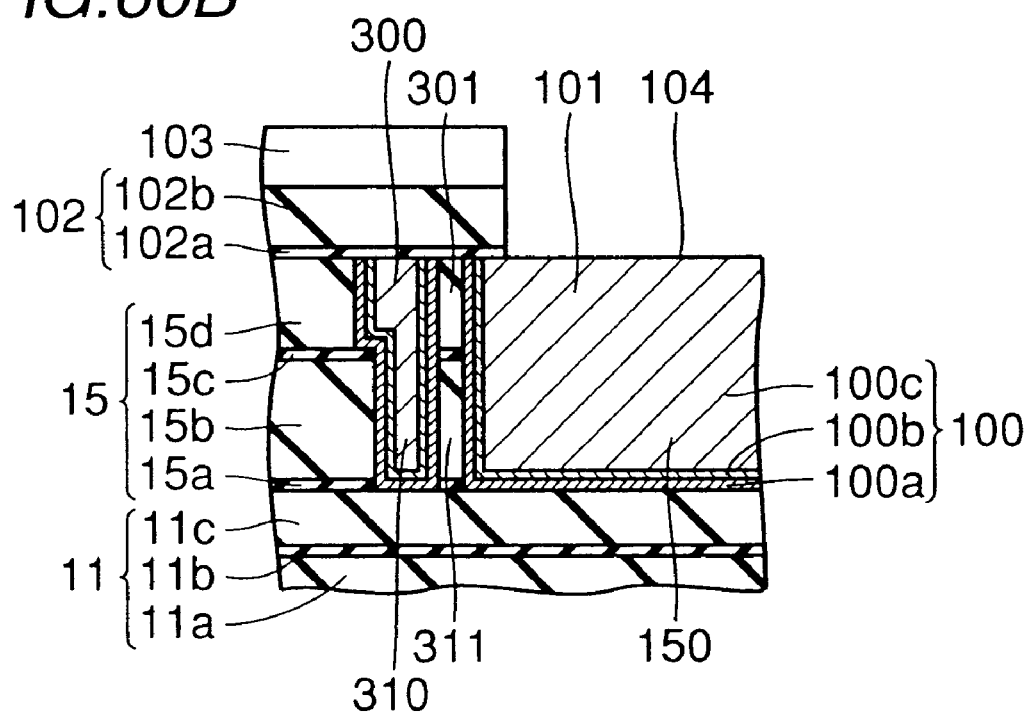

A further modification may be available: as shown in FIGS. 60A and 60B, a stress buffer metal (Cu) layer 310 placed at a corner of the lower protruding section 150 and a stress buffer metal layer placed at a corner of the pad electrode 101 as the upper portion are superimposed on each other and thereby, as shown in FIG. 60B, formed is an insulating partition layers 301 and 311 combined extending up to a surface of the pad electrode.

Eighth Embodiment

Figure 61A:
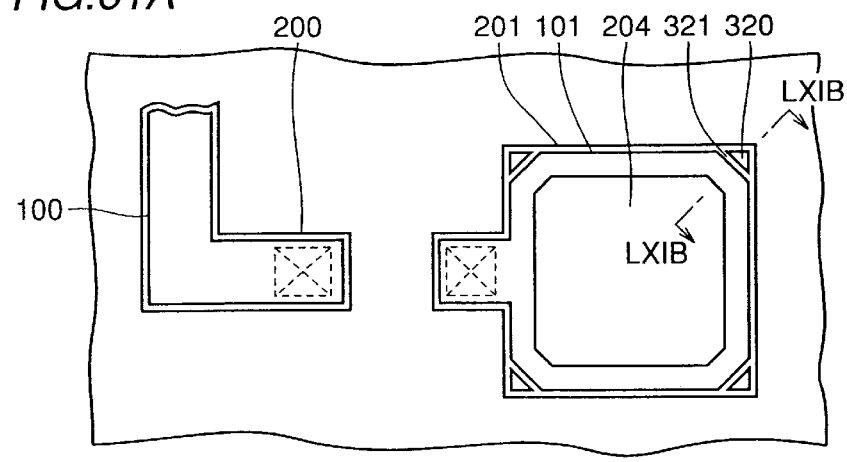
FIG. 61A is a plan view of a semiconductor device in an eighth embodiment according to the invention.
Figure 61B:
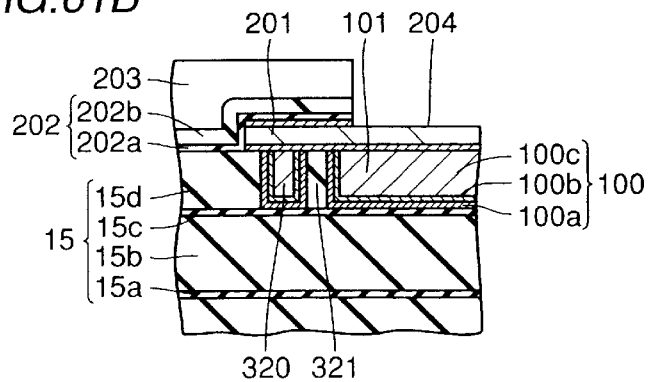
FIG. 61B is a sectional view taken on line LXIB—LXIB of FIG. 61A as viewed in the direction of arrows.
Figure 61C:
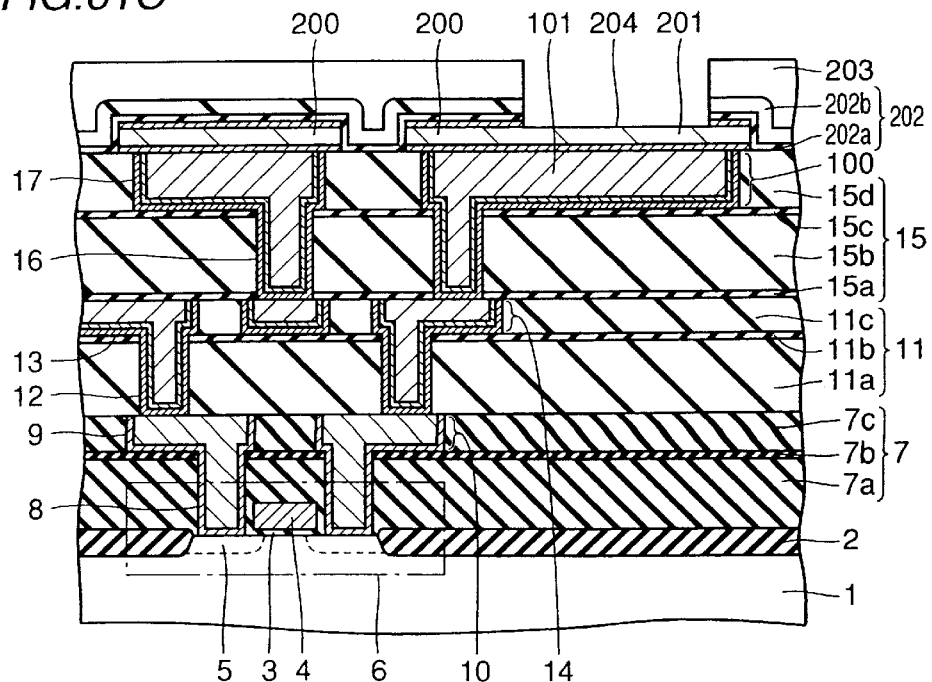
FIG. 61C is a sectional view of the semiconductor device.

A similar effect is also exerted in a structure of a pad electrode in which at least part is made of a buried metal interconnect layer, and a main electrode layer 101 and an upper electrode layer 201 formed on the main electrode layer 101 are included, and as shown in FIGS. 61A to 61C, a stress buffer insulating partition 321 is provided at a corner of the main electrode layer 101. The structure is similar to that in the third embodiment (see FIGS. 19A and 19B) with the exception that the stress buffer insulating partition 321 is at a corner of the main electrode 101.

According to this embodiment, as shown in FIGS. 61A to 61C, the stress buffer insulating partition 321 is interposed between the main electrode layer 101 and the stress buffer metal layer 320 located at a corner of the main electrode layer 101.

With such a structure adopted, when a load or impact force is imposed on the pad electrode in connection to an external terminal by means of wire bonding or the like, a stress is buffered at a corner of the main electrode layer 101 where the stress is especially concentrated with ease by a slight elastic deformation of the stress buffer insulating partition 321, such that only a small stress (impact force) acts on the interlayer insulation film around the corner of the main electrode layer 101. Accordingly, cracking can be prevented from occurring in the interlayer insulating film around the corner of the main electrode layer 101.

While in FIGS. 61A to 61C, the stress buffer insulating partition 321 is formed by providing the stress buffer metal layer 320 of a shape of a triangle at a corner of the main electrode layer 101, a similar effect is also exerted with an insulating partition of another shape. A plurality of stress buffer insulating partitions may be formed.

Figure 62:
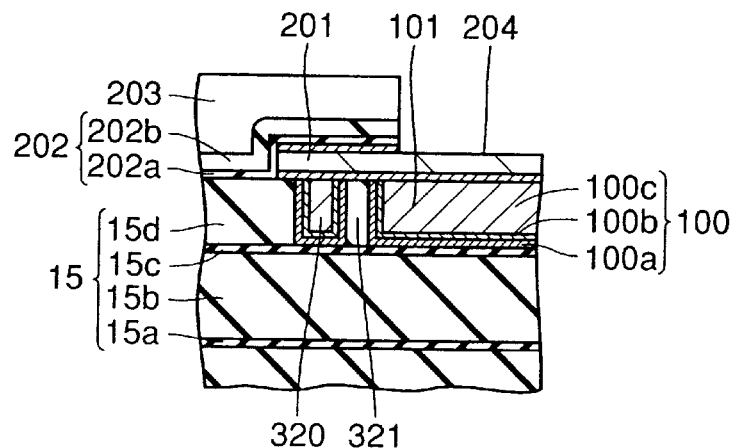
FIG. 62 is a sectional view, taken on line LXII—LXII of FIG. 63 as viewed in the direction of arrows, of a main part of a semiconductor device in the eighth embodiment according to the invention.
Figure 63:
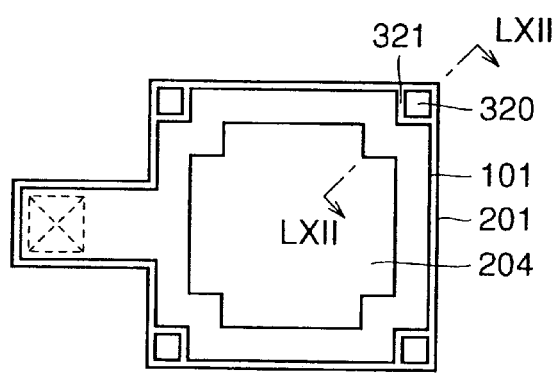
FIG. 63 is a plan view of a main part of a first other example of the semiconductor device in the eighth embodiment according to the invention.
Figure 64:
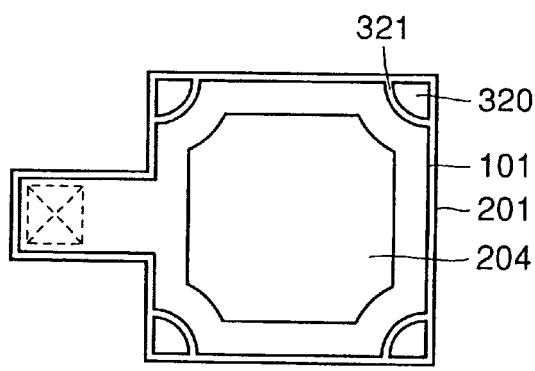
FIG. 64 is a plan view of a main part of a second other example of the semiconductor device in the eighth embodiment according to the invention.

For example, as shown in a sectional view of FIG. 62 and plan views of FIGS. 63 and 64, a tetragon, a quartered circle and the like can be adopted as a shape of a stress buffer metal layer 320 placed at a corner of the main electrode layer 101.

Figure 65:
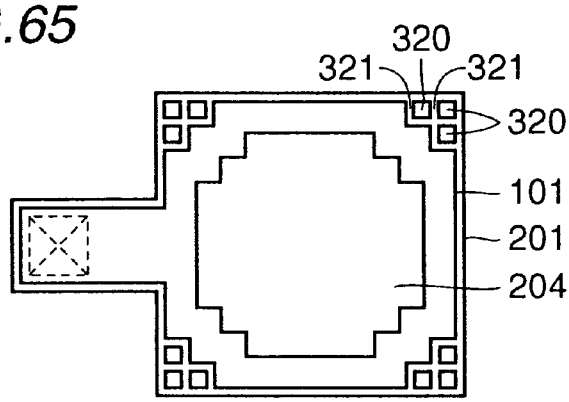
FIG. 65 is a plan view of a main part of a third other example of the semiconductor device in the eighth embodiment according to the invention.
Figure 66A:
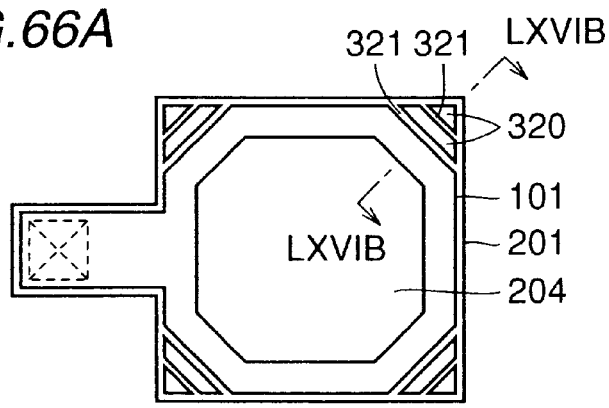
FIG. 66A is a plan view of a main part of a fourth other example of the semiconductor device in the eighth embodiment according to the invention and FIG. 66B is a sectional view taken on line LXVIB—LXVIB of FIG. 66A as viewed in the direction of arrows.
Figure 66B:
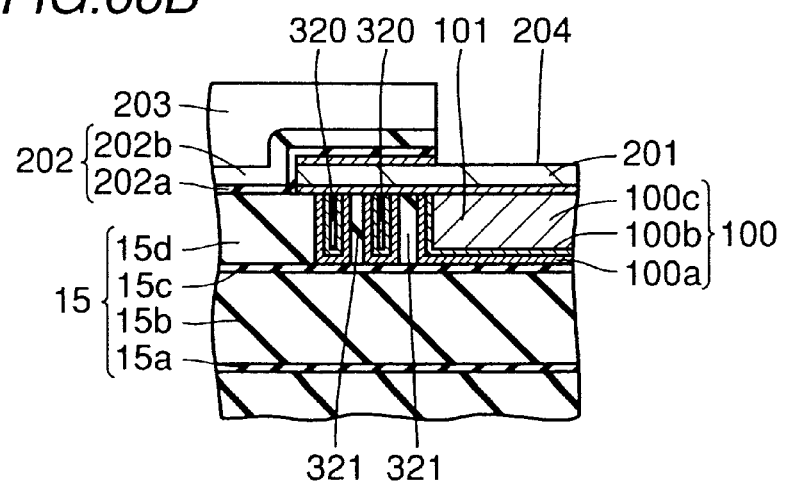
Figure 67A:
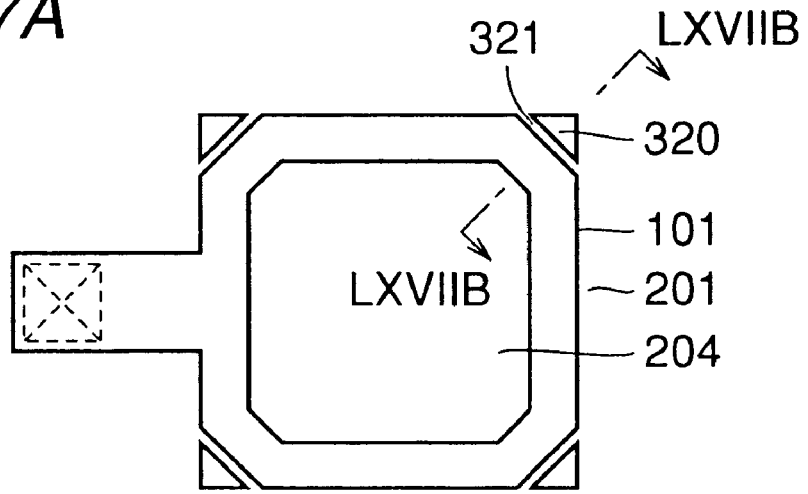
FIG. 67A is a plan view of a main part of a fifth other example of the semiconductor device in the eighth embodiment according to the invention and FIG. 67B is a sectional view taken on line LXVIIB—LXVIIB of FIG. 67A as viewed in the direction of arrows.
Figure 67B:
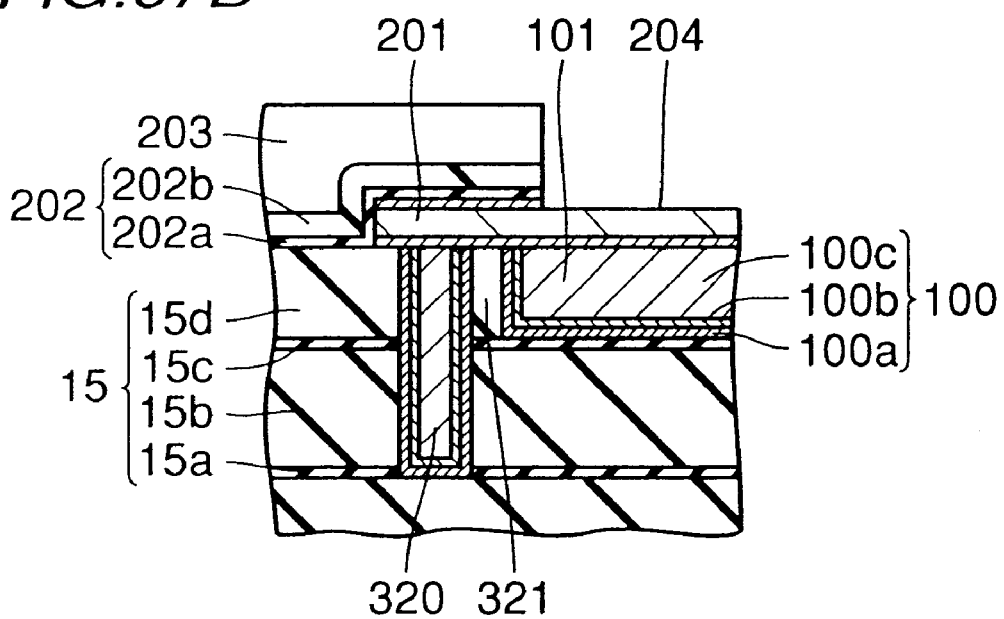

More of the effect can be exerted using a plurality of stress buffer insulating partitions 321 by providing plurality of stress buffer metal (Cu) layers 320 located at corners of the main electrode layer 101 as shown in FIGS. 65, 66A and 66B. A further modification may be available: As shown in FIGS. 67A and 67B, a thickness downward of the stress buffer metal layer 320 placed at a corner of the main electrode layer 101 is changed to be different from a depth of the rest of the main electrode layer 101.

Ninth Embodiment

A similar effect is also exerted in a structure of a pad electrode in which at least part is made of a buried metal interconnect layer, and an lower electrode layer and a main electrode layer are superimposed on each other with a large-area connection hole interposed therebetween, and stress buffer insulating partitions are provided at corners of the lower electrode layer and the connection hole. The structure of the semiconductor device in this embodiment is shown in FIGS. 68A to 68C.

The structure is similar to that of the structure (see FIGS. 27A and 27B) in the fourth embodiment with the exception that the stress buffer insulating partition is provided at at least one of corners of the lower electrode layer and the connection hole.

Figure 68A:
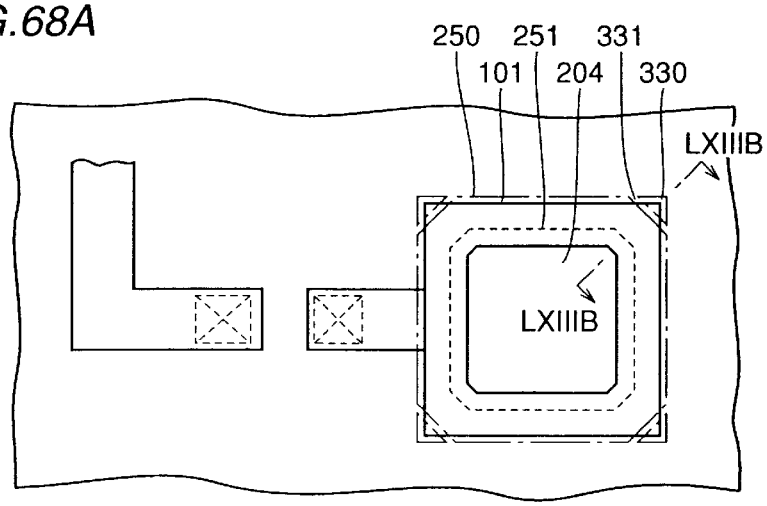
FIG. 68A is a plan view of a semiconductor device in a ninth embodiment according to the invention.
Figure 68B:
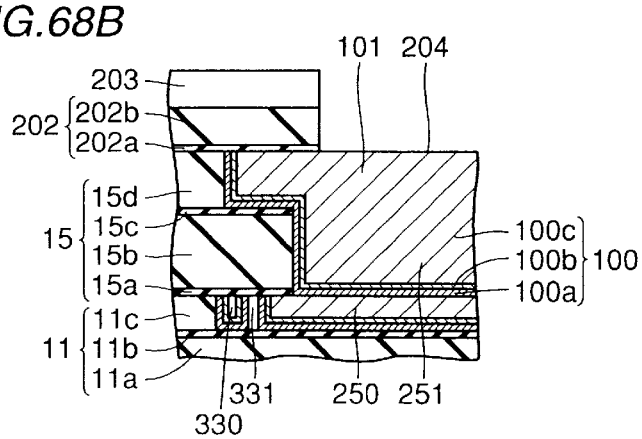
FIG. 68B is a sectional view taken on line LXIIIB—LXIIIB of FIG. 68A as viewed in the direction of arrows and FIG. 68C is a sectional view of the semiconductor device.
Figure 68C:
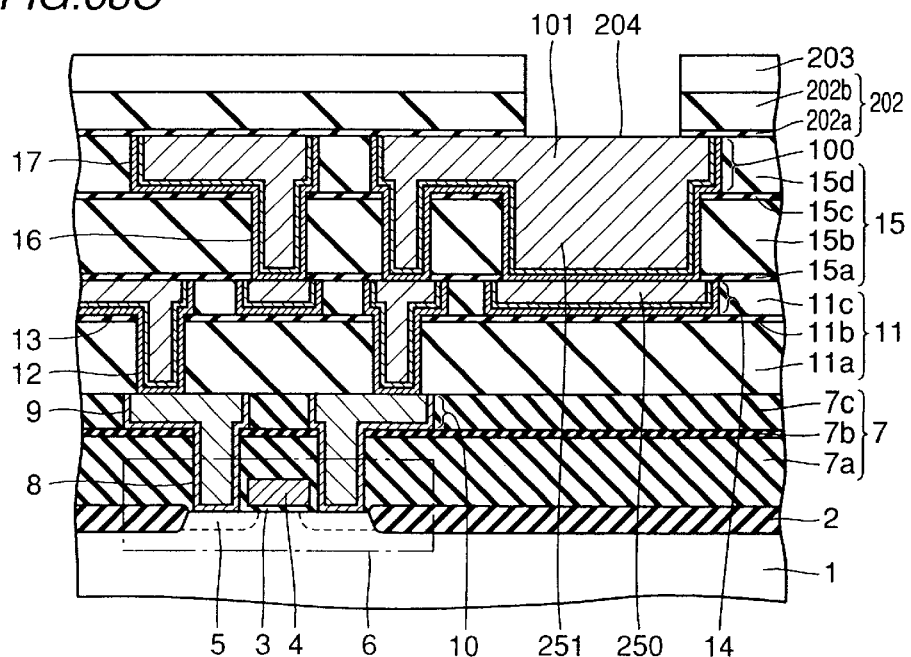

According to this embodiment, as shown in FIGS. 68A to 68C, a stress buffer metal layer 330 is placed at an corner of a lower electrode layer 250 and the stress buffer insulating partition 331 is interposed between the lower electrode layer 250 and the stress buffer metal layer 330.

With such a structure adopted, when a load or impact force is imposed on the pad electrode in connection to an external terminal by means of wire bonding or the like, a stress is buffered at a corner of the lower electrode layer 250 where the stress is especially concentrated with ease by a slight elastic deformation of the stress buffer insulating partition 331, such that only a small stress (impact force) acts on the interlayer insulation film around the corner of the lower electrode layer 250. Accordingly, cracking can be prevented from occurring in the interlayer insulating film around the corner of the lower electrode layer 250.

While in FIGS. 68A to 68C, the stress buffer insulating partition 331 is formed by providing the stress buffer metal layer 330 of a shape of a triangle at a corner of the lower electrode layer 250, a similar effect is also exerted with an insulating partition of another shape. A plurality of stress buffer insulating partitions may be formed.

Figure 69:
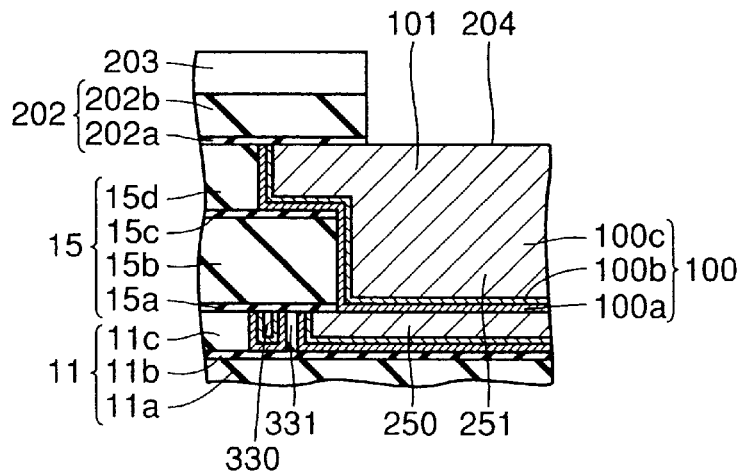
FIG. 69 is a sectional view, taken oh line LXIX—LXIX of FIG. 70 as viewed in the direction of arrows, of a main part of a semiconductor device in the ninth embodiment according to the invention.
Figure 70:
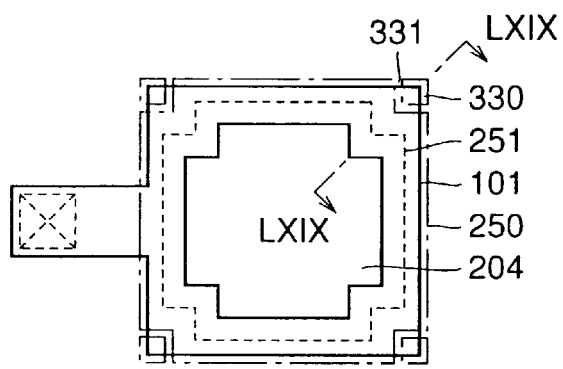
FIG. 70 is a plan view of a main part of a first other example of the semiconductor device in the ninth embodiment according to the invention.
Figure 71:
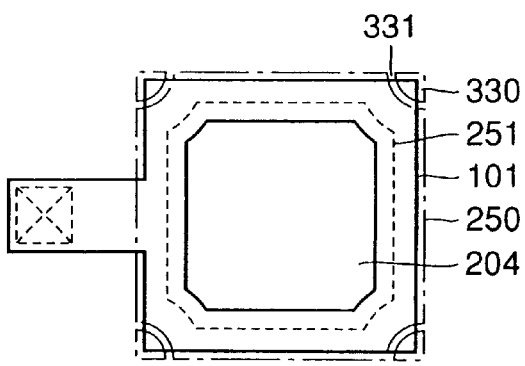
FIG. 71 is a plan view of a main part of a second other example of the semiconductor device in the ninth embodiment according to the invention.
Figure 72:
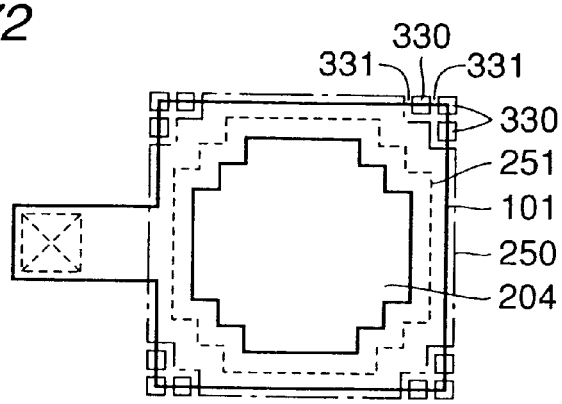
FIG. 72 is a plan view of a main part of a third other example of the semiconductor device in the ninth embodiment according to the invention.
Figure 73A:
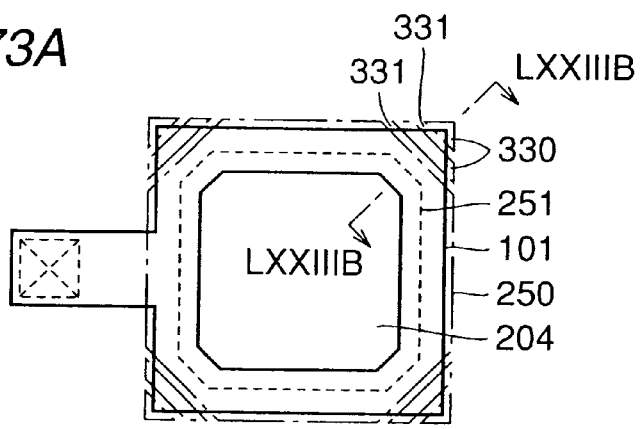
FIG. 73A is a plan view of a main part of a fourth other example of the semiconductor device in the ninth embodiment according to the invention and FIG. 73B is a sectional view taken on line LXXIIIB—LXXIIIB of FIG. 73A as viewed in the direction of arrows.
Figure 73B:
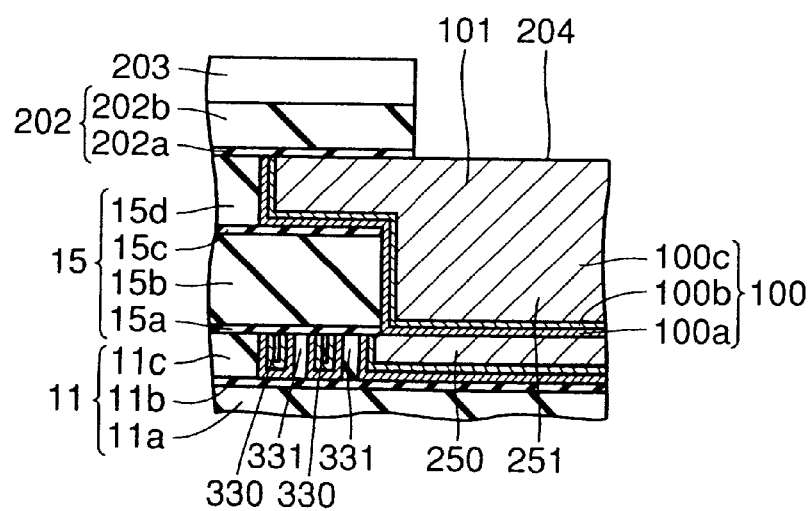
Figure 74A:
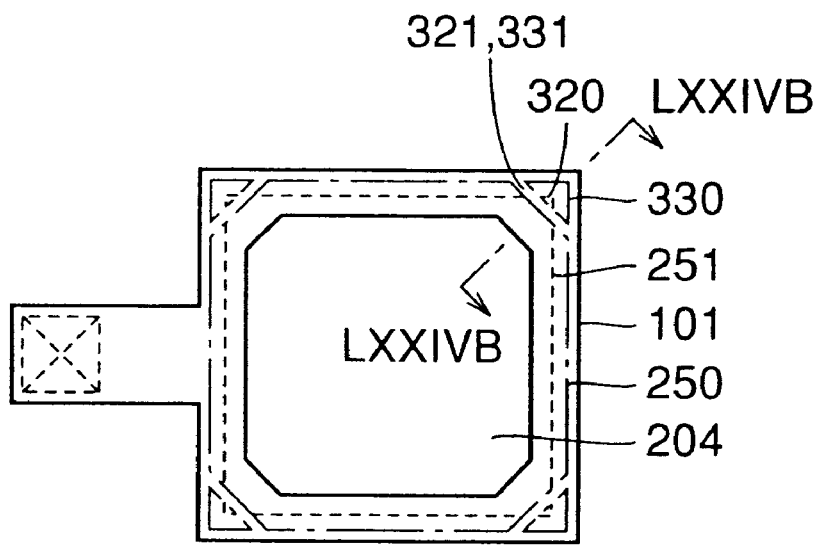
FIG. 74A is a plan view of a main part of a fifth other example of the semiconductor device in the ninth embodiment according to the invention and FIG. 74B is a sectional view taken on line LXXIVB—LXXIVB of FIG. 74A as viewed in the direction of arrows.
Figure 74B:
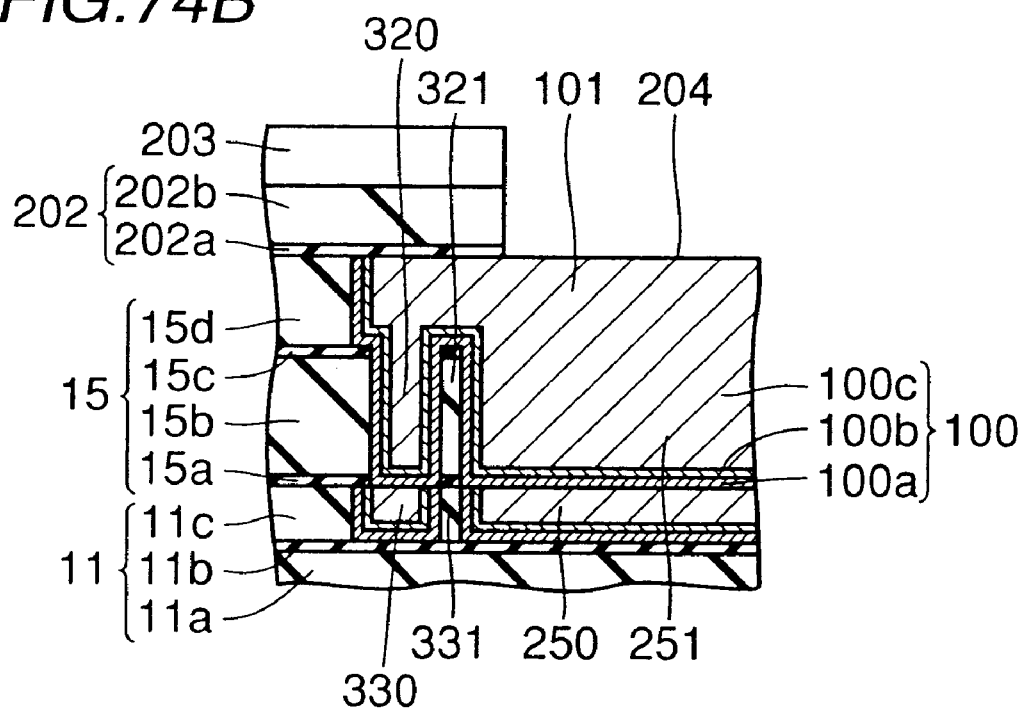
Figure 75A:
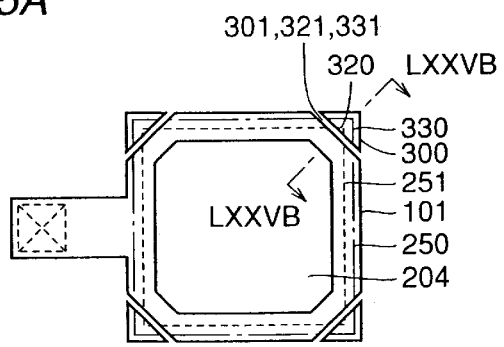
FIG. 75A is a plan view of a main part of a sixth other example of the semiconductor device in the ninth embodiment according to the invention and FIG. 75B is a sectional view taken on line LXXVB—LXXVB of FIG. 75A as viewed in the direction of arrows.
Figure 75B:
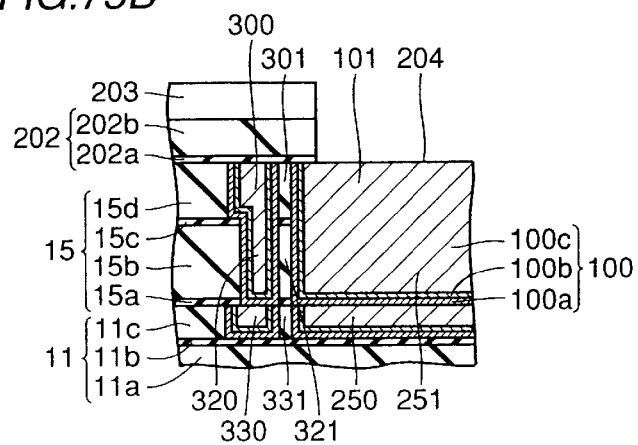

For example, as shown in a sectional view of FIG. 69 and plan views of FIGS. 70 and 71, a tetragon, a quartered circle and the like can be adopted as a shape of a stress buffer metal layer 330 placed at a corner of the lower electrode layer 250. More of the effect can be exerted using a plurality of stress buffer insulating partitions 331 by providing a plurality of stress buffer metal layers 330 located at corners of the lower electrode layer 250 a shown in FIGS. 72, 73A and 73B. Another modification may be available: as shown in FIGS. 74A and 74B, and 75A and 75B, not only is a stress buffer metal layer 330 provided at a corner of the lower electrode layer 250, but stress buffer metal layers 320 and 300, similar to the stress buffer metal layer 330, are also provided at corners of the connection hole 251 and the main electrode layer 101 so as to be integrally superimposed on one another to form stress buffer insulating partitions 331, 321 and 301.

Figure 76A:
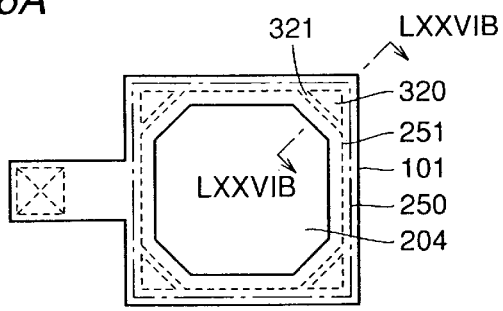
FIG. 76A is a plan view of a main part of a seventh other example of the semiconductor device in the ninth embodiment according to the invention and FIG. 76B is a sectional view taken on line LXXVIB—LXXVIB of FIG. 76A as viewed in the direction of arrows.
Figure 76B:
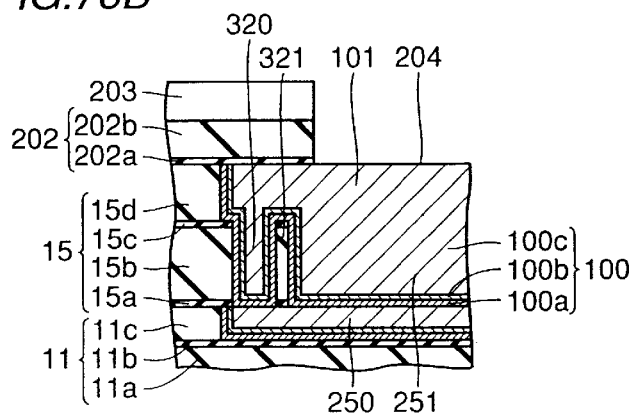

A still another modification may also be available: As shown in FIG. 76A and 76B, a stress buffer metal layer 320 is provided only at a corner of a large-area connection hole 251 and a stress buffer insulating partition 321 is provided only between the connection hole 251 and the stress buffer metal layer 320.

Tenth Embodiment

A similar effect is also exerted in a structure of a pad electrode in which at least part is made of a buried metal interconnect layer, a lower electrode layer and a main electrode layer are superimposed on each other and a thickness of the lower electrode layer is partially larger so as to form a lower protruding section, wherein a stress buffer insulating partition is provided at corner of the lower protruding section. The structure of the semiconductor device in this embodiment is shown in FIGS. 77A to 77C.

The structure is similar to that of the structure (see FIGS. 36A and 36B) in the fifth embodiment with the exception that the stress buffer insulating partition is provided at a corner of the lower protruding section.

Figure 77A:
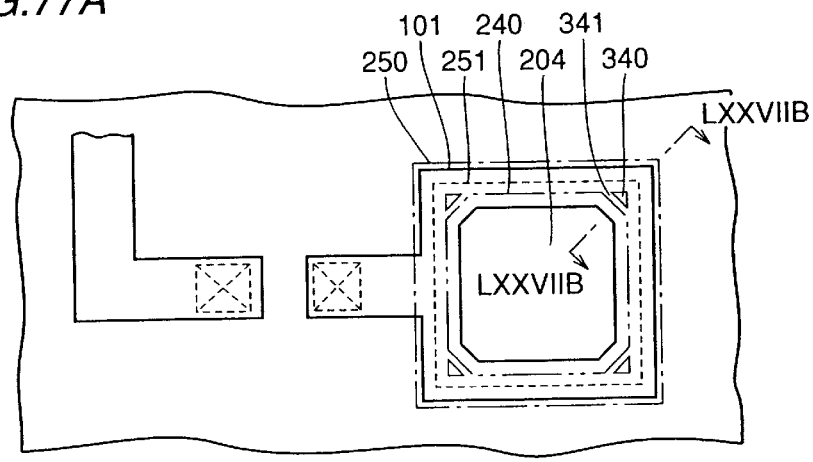
FIG. 77A is a plan view of a semiconductor device in a tenth embodiment according to the invention.
Figure 77B:
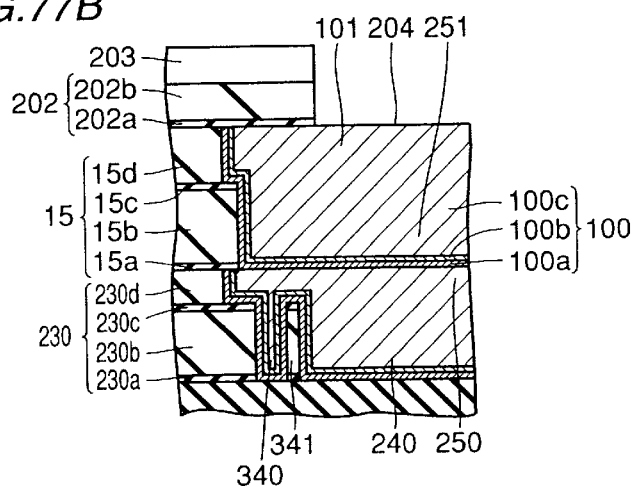
FIG. 77B is a sectional view taken on line LXXVIIB—LXXVIIB of FIG. 77A as viewed in the direction of arrows and FIG. 77C is a sectional view of the semiconductor device.
Figure 77C:
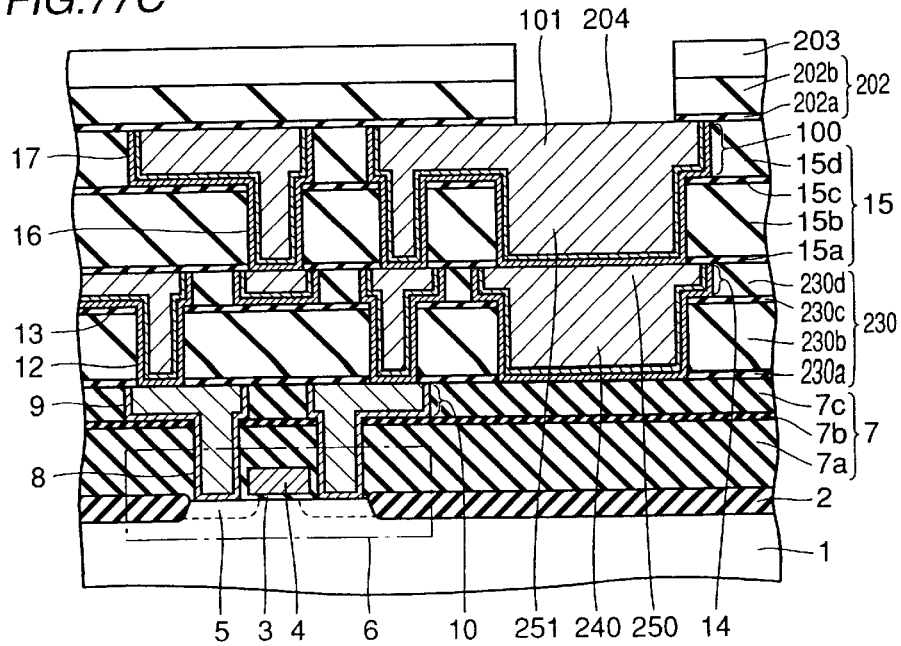

According to this embodiment, as shown in FIGS. 77A to 77C, a stress buffer metal layer 340 is placed at an corner of a lower protruding section 240 of a lower electrode layer 250 and the stress buffer insulating partition 341 is interposed between the lower protruding section 240 and the stress buffer metal layer 340. With such a structure adopted, when a load or impact force is imposed on a main electrode layer 101 in connection to an external terminal by means of wire bonding or the like, a stress is buffered at a corner of the lower protruding section 240 where the stress is especially concentrated with ease by a slight elastic deformation of the stress buffer insulating partition 341, such that only a small stress (impact force) acts on the interlayer insulation film around the corner of the lower protruding section 240.

Accordingly, cracking can be prevented from occurring in the interlayer insulating film around the corner of the lower protruding section 240.

While in FIGS. 77A to 77C, the stress buffer insulating partition 341 is formed by providing the stress buffer metal layer 340 of a shape of a triangle at a corner of the lower protruding section 240, a similar effect is also exerted with an insulating partition of another shape. A plurality of stress buffer insulating partitions may be formed.

Figure 78:
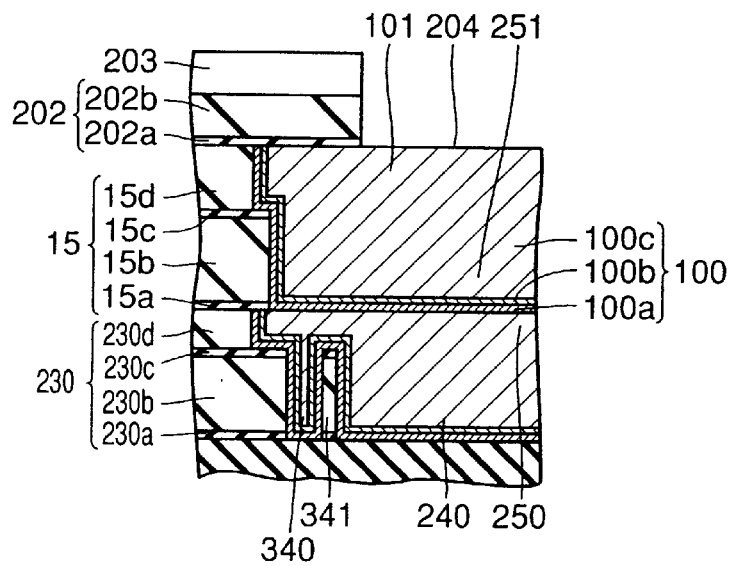
FIG. 78 is a sectional view, taken on line LXXVIII—LXXVIII of FIG. 79 as viewed in the direction of arrows, of a main part of a semiconductor device in the tenth embodiment according to the invention.
Figure 79:
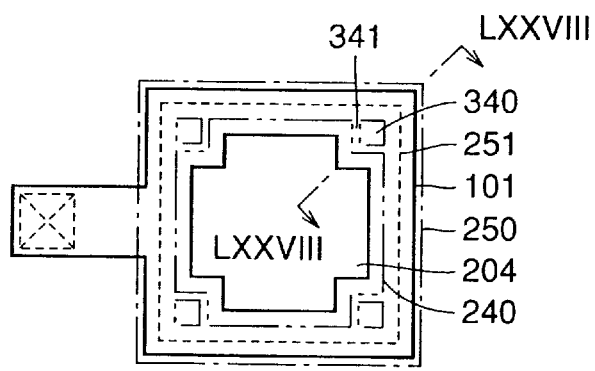
FIG. 79 is a plan view of a main part of a first other example of the semiconductor device in the tenth embodiment according to the invention.
Figure 80:
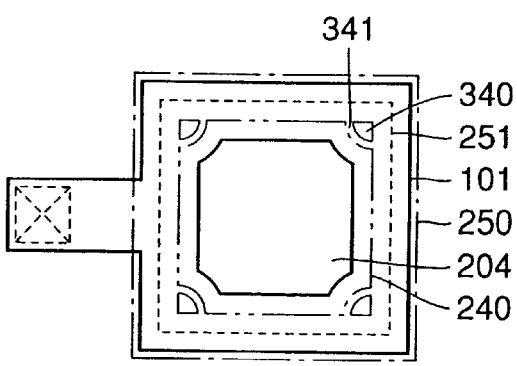
FIG. 80 is a plan view of a main part of a second other example of the semiconductor device in the tenth embodiment according to the invention.
Figure 81:
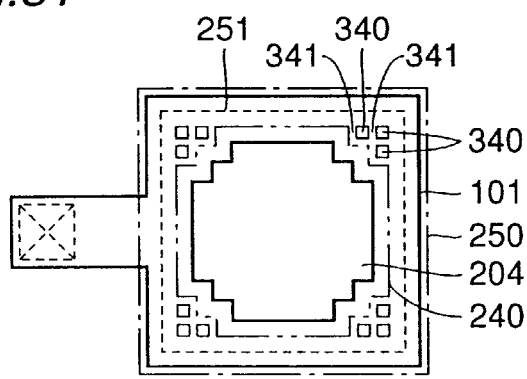
FIG. 81 is a plan view of a main part of a third other example of the semiconductor device in the tenth embodiment according to the invention.
Figure 82A:
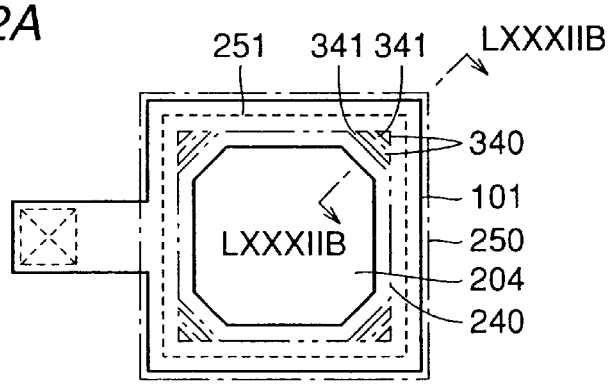
FIG. 82A is a plan view of a main part of a fourth other example of the semiconductor device in the tenth embodiment according to the invention and FIG. 82B is a sectional view taken on line LXXXIIB—LXXXIIB of FIG. 82A as viewed in the direction of arrows.
Figure 82B:
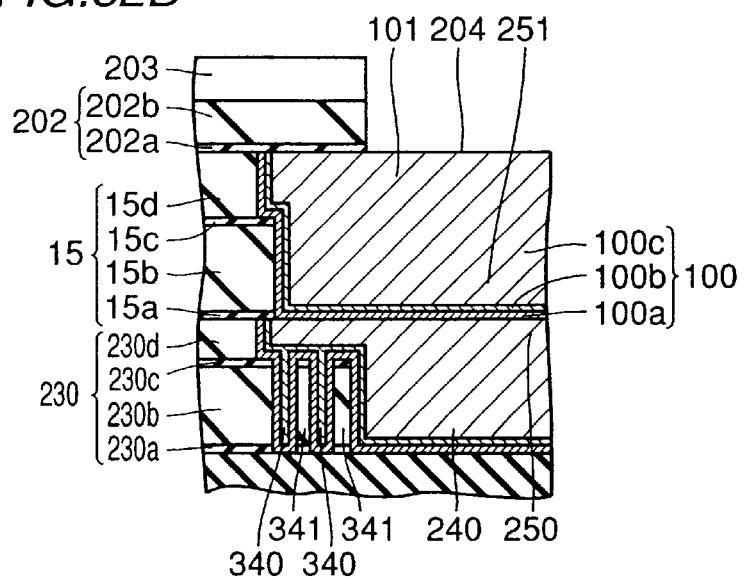
Figure 83A:
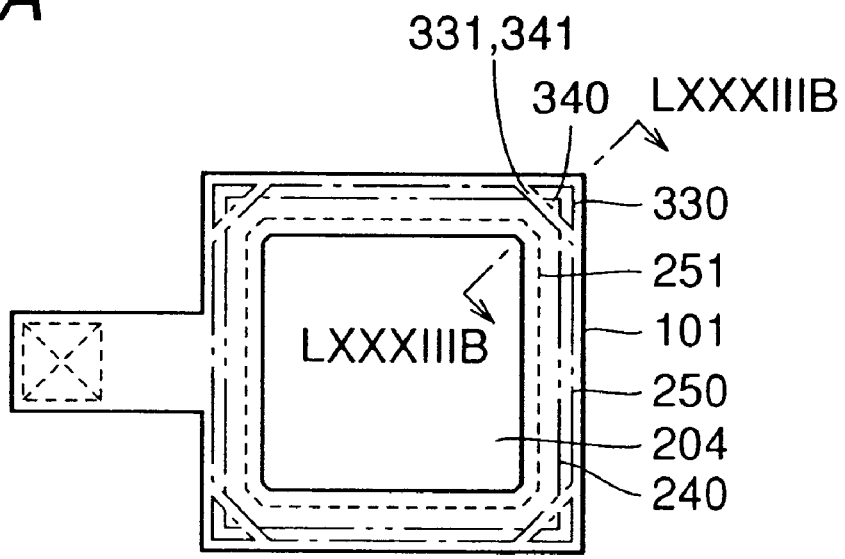
FIG. 83A is a plan view of a main part of a fifth other example of the semiconductor device in the tenth embodiment according to the invention and FIG. 83B is a sectional view taken on line LXXXIIIB—LXXXIIIB of FIG. 83A as viewed in the direction of arrows.
Figure 83B:
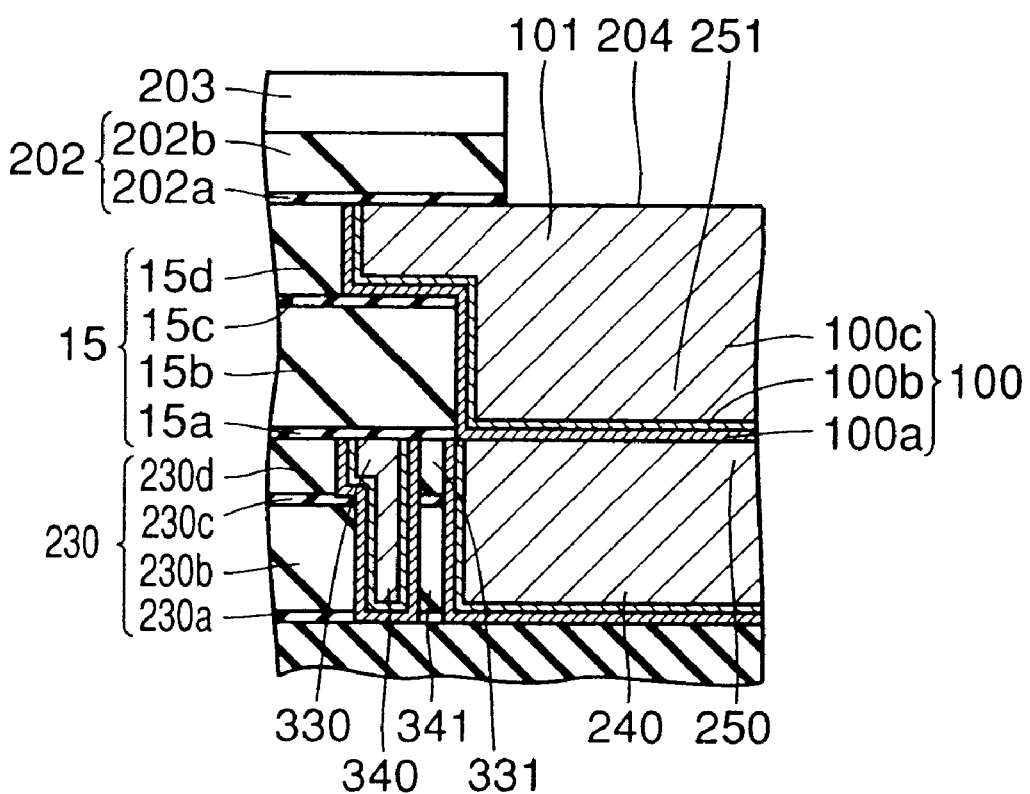
Figure 84A:
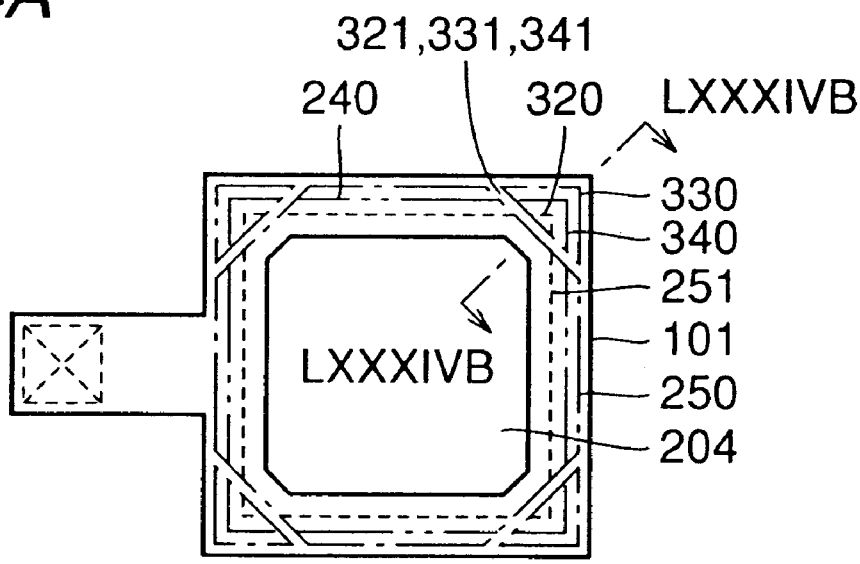
FIG. 84A is a plan view of a main part of a sixth other example of the semiconductor device in the tenth embodiment according to the invention and FIG. 84B is a sectional view taken on line LXXXIVB—LXXXIVB of FIG. 84A as viewed in the direction of arrows.
Figure 84B:
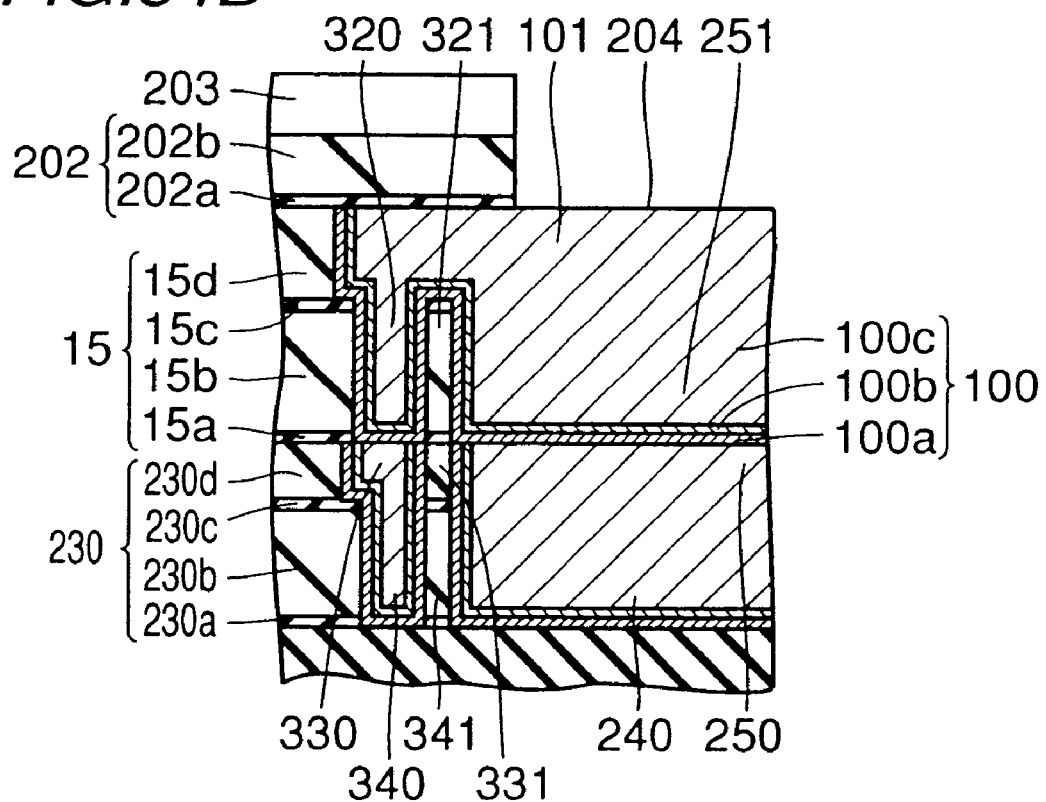
Figure 85A:
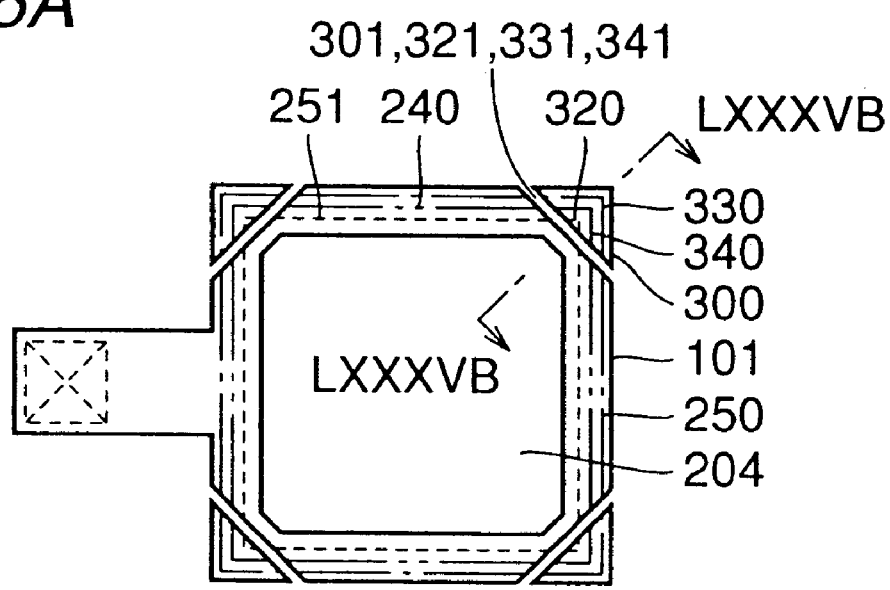
FIG. 85A is a plan view of a main part of a seventh other example of the semiconductor device in the tenth embodiment according to the invention and FIG. 85B is a sectional view taken on line LXXXVB—LXXXVB of FIG. 85A as viewed in the direction of arrows.
Figure 85B:
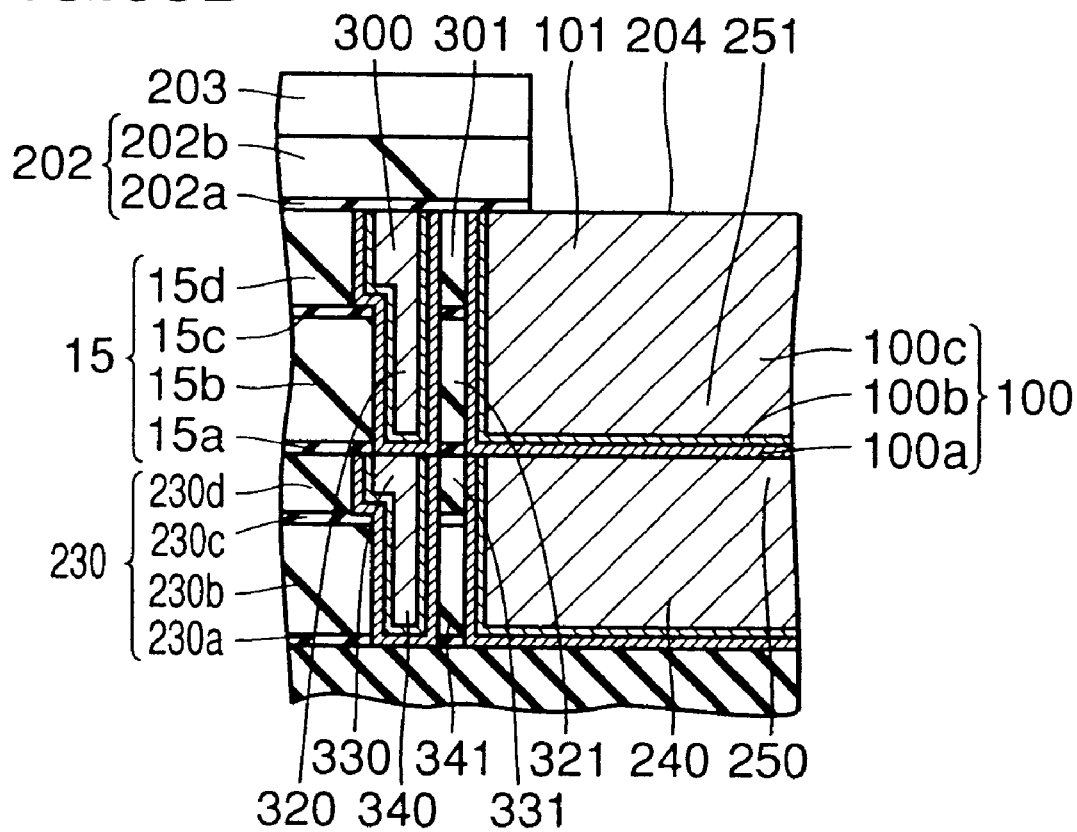

For example, as shown in a sectional view of FIGS. 78 to 80, a tetragon, a quartered circle and the like can be adopted as a shape of a stress buffer metal layer 340 placed at a corner of the first pad electrode thick film section 240. More of the effect, as shown in FIGS. 81 and 82, can be exerted using a plurality of stress buffer insulating partitions 341 by providing a plurality of stress buffer metal layers 340 located at corners of the first pad electrode thick film section 240. Another modification may be available: As shown in FIGS. 83A and 83B, 84A and 84B, and 85A and 85B, not only is a stress buffer metal layer 340 provided at a corner of the lower protruding section 240, but stress buffer metal layers 330, 320 and 300, similar to the stress buffer metal layer 340, are also provided at corners of the lower electrode layer 250, the connection hole 251 and the main electrode layer 101 so as to be integrally superimposed on one another to form stress buffer insulating partitions 341, 331, 321 and 301.

Eleventh Embodiment

A similar effect is also exerted in a structure of a pad electrode in which at least part thereof is made of a buried metal interconnect layer and a stress buffer protruding section is provided at a corner thereof. The structure of the semiconductor device in this embodiment is shown in FIGS. 86A to 86C.

The structure is similar to that of the structure (FIGS. 1A and 1B) in the first embodiment with the exception that the stress buffer protruding section 400 is provided at a corner of the pad electrode 101.

Figure 86A:
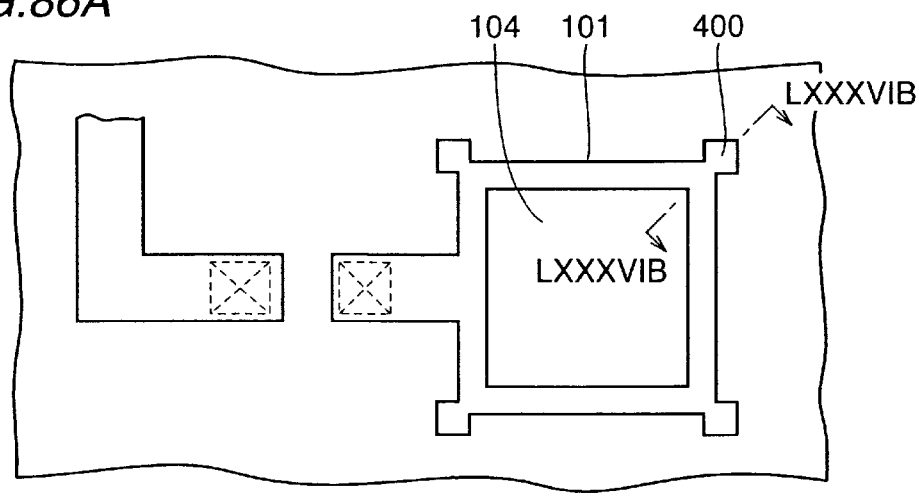
FIG. 86A is a plan view of a semiconductor device in an eleventh embodiment according to the invention.
Figure 86B:
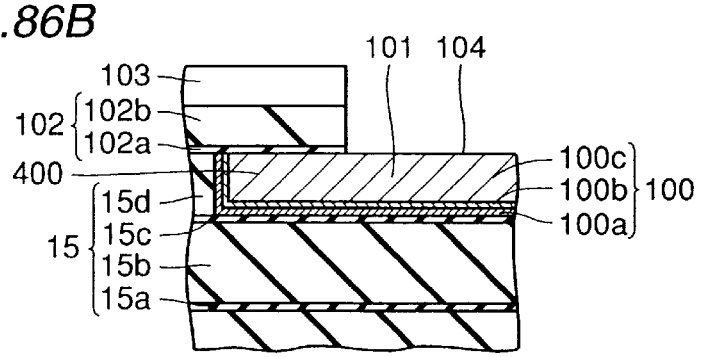
Figure 86C:
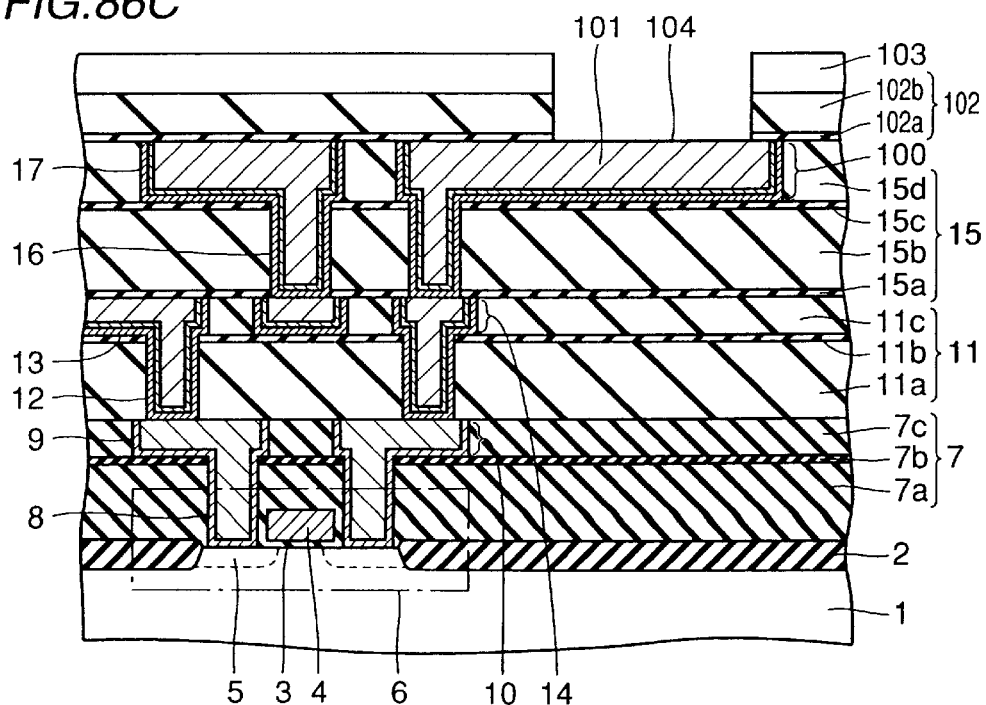

A fabrication process for the semiconductor device shown in FIGS. 86A to 86C is similar to that in the first embodiment shown in FIGS. 1A and 1B.

That is, after the structure shown in FIG. 129 is fabricated based on a conventional technique, on a second metal (Cu) interconnect layer 14, as shown in FIG. 2, stacked is a second interlayer insulating film 15 of a four-layer structure composed of a silicon nitride (SiN) 15a as a copper(Cu)-diffusion preventive layer, an insulating film 15b such as a silicon oxide film (SiO), a silicon nitride film (SiN) 15c and an insulating film 15d such as a silicon oxide film (SiO) by means of a plasma CVD method or the like method.

A recess as the second via hole 16 and the third interconnect trench 17 is formed in the interlayer insulating film 15 at a desired site thereon using photolithography and an etching technique. At this time, a recess is also formed at a site where a pad electrode is provided and a buffer recess for forming a stress buffet protrusion is formed at a corner of the recess. The buffer recess is a recess used for forming the stress buffer protruding section 400 of FIGS. 86A and 86B, and FIG. 89, having a plan view like stress buffer protruding sections 400, 401 and 402 exemplified in FIGS. 90 to 92 and 93A.

An underlying film 100a, a copper seed film 100b and a copper plated film 100c are deposited over all the surface to a thickness approximately in the range of 1.5 to 3.0 μm, such that the second via hole 16 and the third interconnect trench 17 are filled with the films 100a, 100b and 100c by means of a method similar to the above described. Thereafter, unnecessary portions of the copper films 100c and 100b, and the underlying film 100a are removed by means of a chemical mechanical polishing process to form a third buried metal (Cu) interconnect layer 100, a pad electrode 101 and stress buffer protruding sections 400, 401 and 402.

Process steps following the last step in the above described procedure are the same as those described in the first embodiment.

Figure 87:
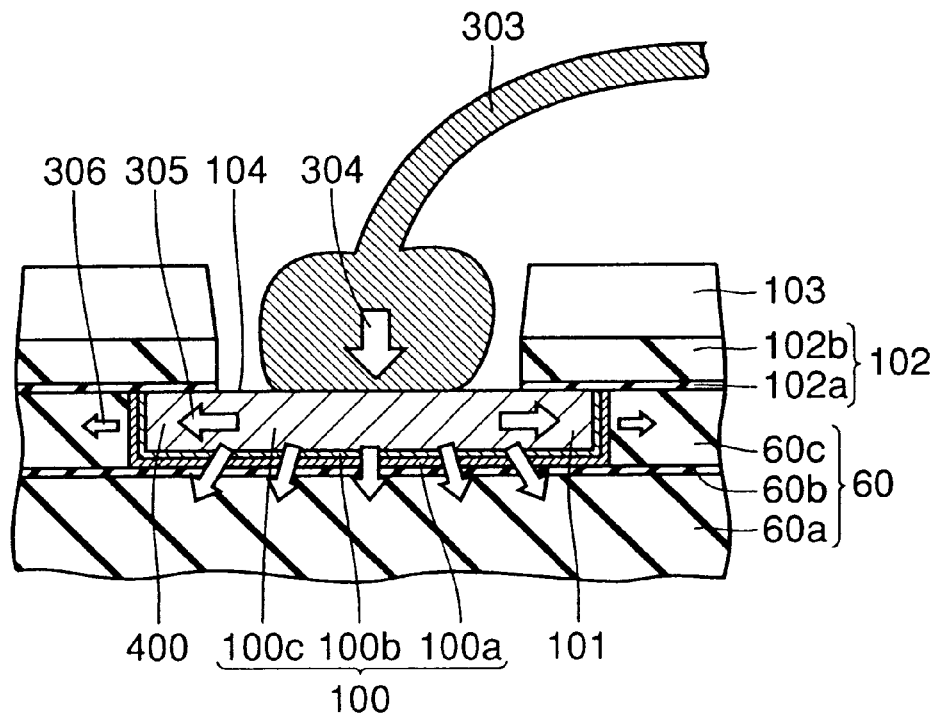
FIG. 87 is a sectional view illustrating a way to transmit an impact force to a semiconductor device in the eleventh embodiment according to the invention.
Figure 88:
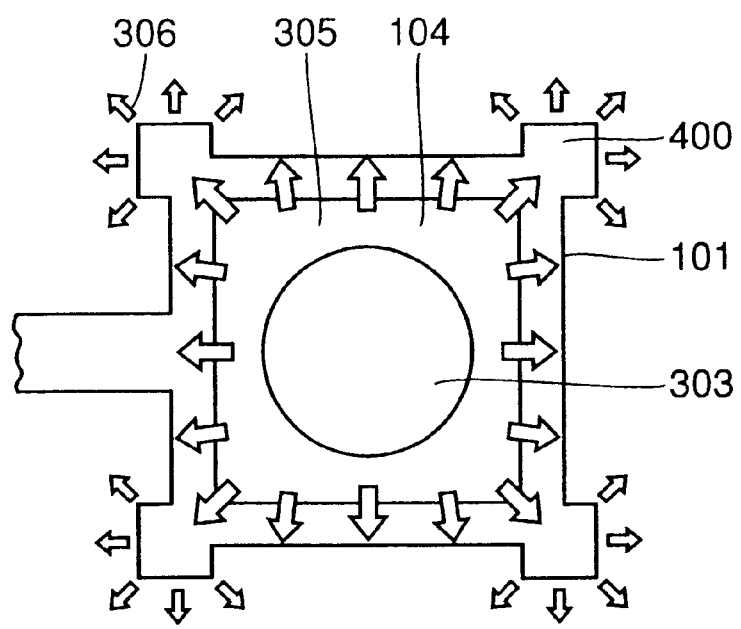
FIG. 88 is a plan view illustrating the way to transmit an impact force to a semiconductor device in the eleventh embodiment according to the invention.

According to this embodiment, as shown in FIGS. 86A to 86C, a stress buffer protruding section 400 is placed at an corner of the pad electrode 101. With such a structure adopted, when a load 304 or impact force 305 is imposed on a pad electrode 101 in connection to an external terminal by means of wire bonding or the like, a stress (impact force) is buffered at a corner of the pad electrode 101 where the stress is especially concentrated with ease by a slight elastic deformation of the stress buffer protruding section 400 as shown in FIGS. 87 and 88, such that only a small stress (impact force) 306 acts on the interlayer insulation film around the corner of the pad electrode 101. Accordingly, cracking can be prevented from occurring in the interlayer insulating film around the corner of the pad electrode 101.

While in FIGS. 86A to 86C, the stress buffer protruding section 400 of a shape of a tetragon is formed at a corner of the pad electrode 101, a similar effect is also exerted with an stress buffer protruding section of another shape. A plurality of stress buffer protruding sections may be formed in combination.

Figure 89:
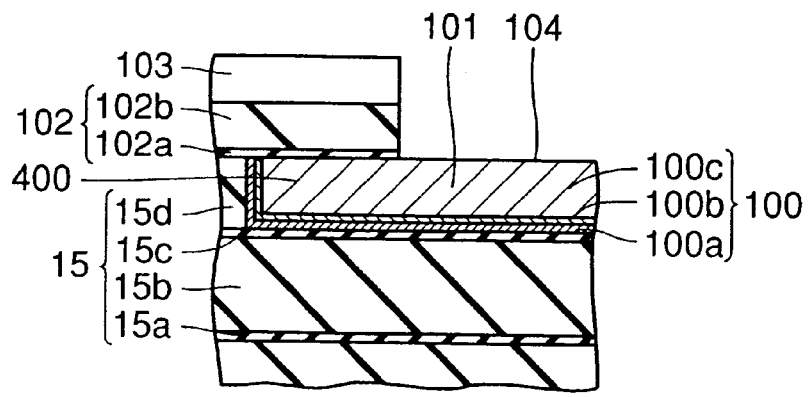
FIG. 89 is a sectional view, taken on line LXXXIX—LXXXIX of FIG. 90 as viewed in the direction of arrows, of a main part of a semiconductor device in the eleventh embodiment according to the invention.
Figure 90:
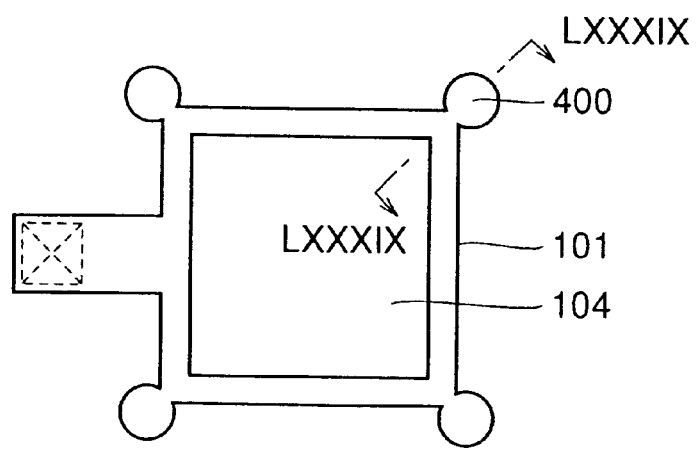
FIG. 90 is a plan view of a main part of a first other example of the semiconductor device in the eleventh embodiment according to the invention.
Figure 91:
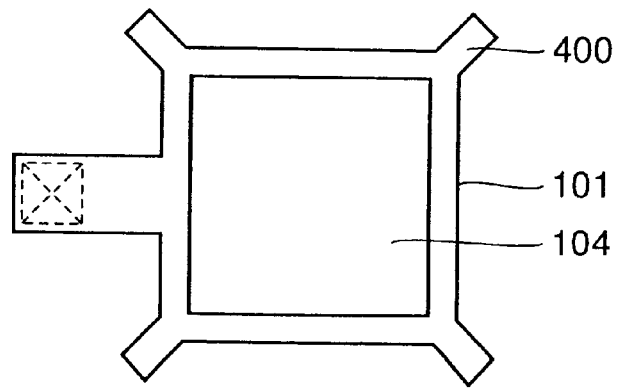
FIG. 91 is a plan view of a main part of a second other example of the semiconductor device in the eleventh embodiment according to the invention.
Figure 92:
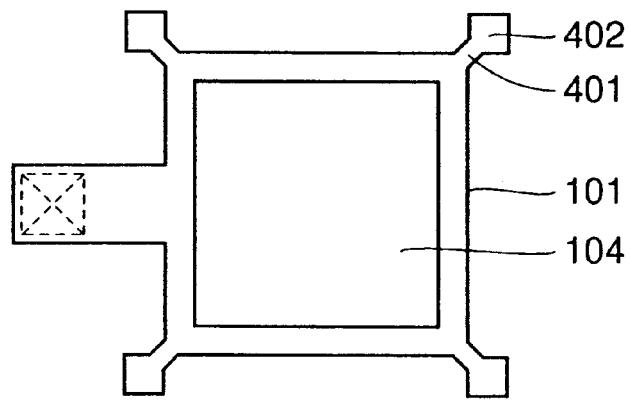
FIG. 92 is a plan view of a main part of a third other example of the semiconductor device in the eleventh embodiment according to the invention.
Figure 93A:
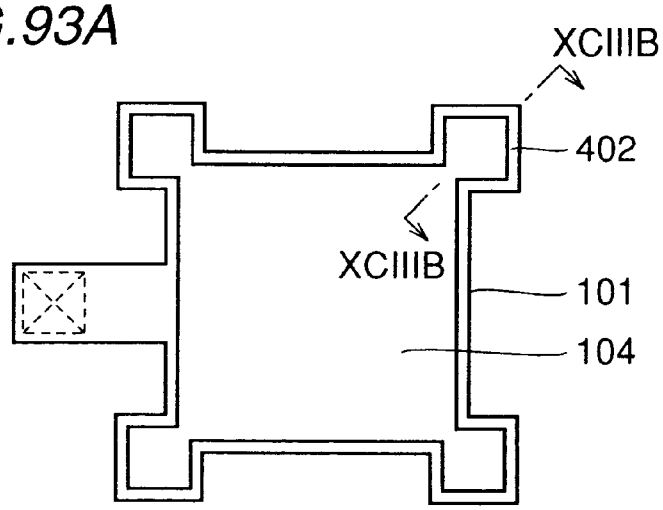
FIG. 93A is a plan view of a main part of a fourth other example of the semiconductor device in the eleventh embodiment according to the invention and FIG. 93B is a sectional view taken on line XCIIIB—XCIIIB of FIG. 93A as viewed in the direction of arrows.
Figure 93B:
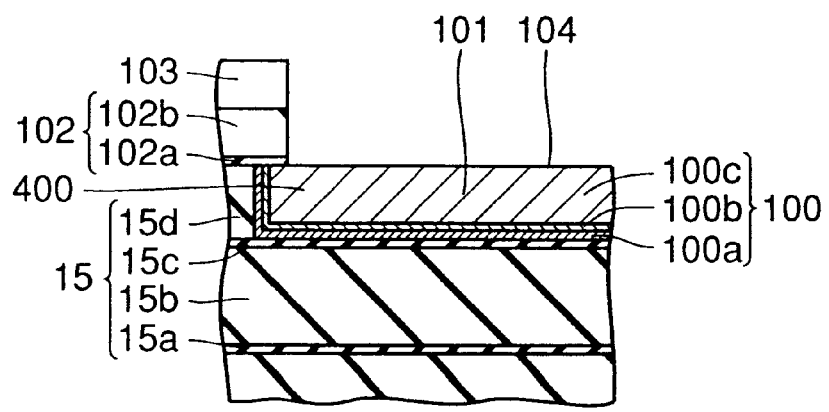

For example, as shown in FIGS. 89 to 91, other patterns such as parts of a circle and an ellipse and a part of a polygon can be adopted as a shape of a stress buffer protruding section 400 disposed at a corner of the pad electrode 101. The effect can be exerted using a plurality of stress buffer protruding sections 401 and 402 in combination located at corners of the pad electrode 101 as shown in FIG. 92. Another modification may be available with still more of the stress buffer effect: As shown in FIGS. 93A and 93B, the protective insulating films 102 and 103 on the stress buffer protruding section 400 are removed.

Twelfth Embodiment

A similar effect is also exerted in a structure of a pad electrode in which at least part thereof is made of a buried metal interconnect layer and a thickness of the pad electrode layer is partially larger downward so as to form a lower protruding section, :wherein a stress buffer protruding section is provided at corner of the lower protruding section. The structure of the semiconductor in this embodiment is shown in FIGS. 94A to 94C.

Figure 94A:
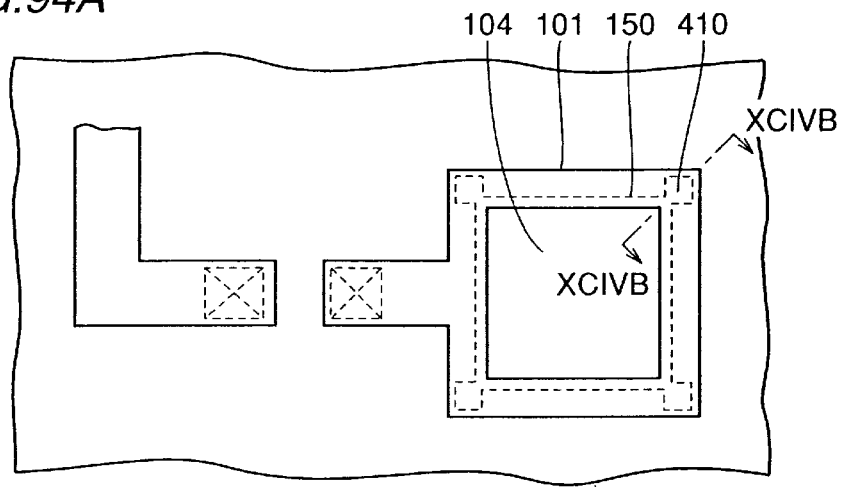
FIG. 94A is a plan view of a semiconductor device in a twelfth embodiment according to the invention.
Figure 94B:
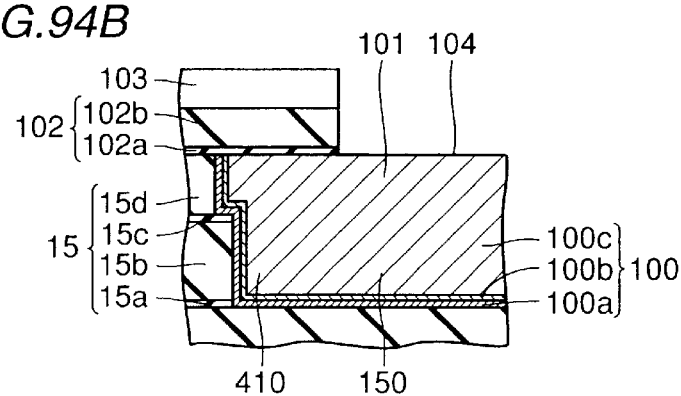
FIG. 94B is a sectional view taken on line XCIVB—XCIVB of FIG. 94A as viewed in the direction of arrows and FIG. 94C is a sectional view of the semiconductor device.
Figure 94C:
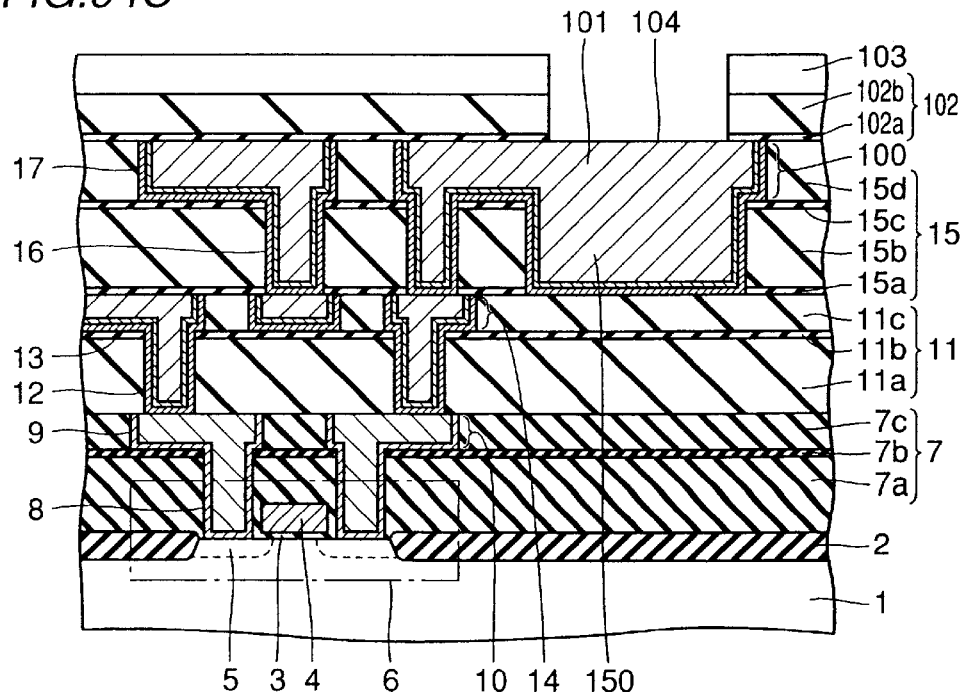

According to this embodiment, as shown in FIGS. 94A to 94C, a stress buffer protruding section 410 is placed at an corner of a lower protruding section 150. With such a structure adopted, when a load or impact force is imposed on a pad electrode 101 in connection to an external terminal by means of wire bonding or the like, a stress (impact force) is buffered at a corner of the lower protruding section 150 where the stress is especially concentrated with ease by a slight elastic deformation of the stress buffer protruding section, such that only a small stress (impact force) acts on the interlayer insulation film around the corner of the lower protruding section 150. Accordingly, cracking can prevented from occurring in the interlayer insulating film around the corner of the lower protruding section 150.

While in FIGS. 94A to 94C, the stress buffer protruding section 410 of a shape of a tetragon is formed at a corner of the lower protruding section 150, a similar effect is also exerted with an stress buffer protruding section of another shape. A plurality of stress buffer protruding sections may be formed in combination.

Figure 95:
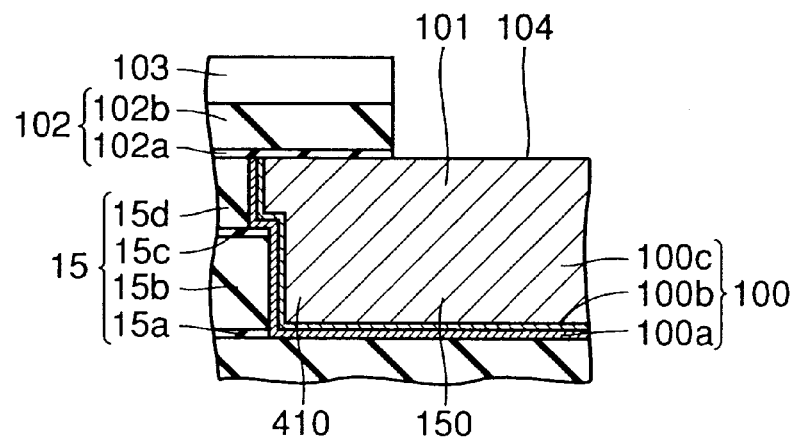
FIG. 95 is a sectional view, taken on line XCV—XCV of FIG. 96 as viewed in the direction of arrows, of a main part of a semiconductor device in the twelfth embodiment according to the invention.
Figure 96:
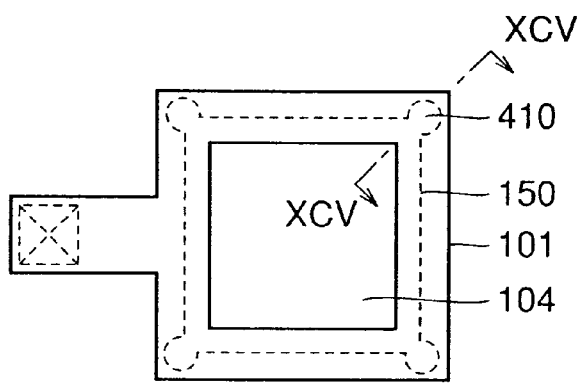
FIG. 96 is a plan view of a main part of a first other example of the semiconductor device in the twelfth embodiment according to the invention.
Figure 97:
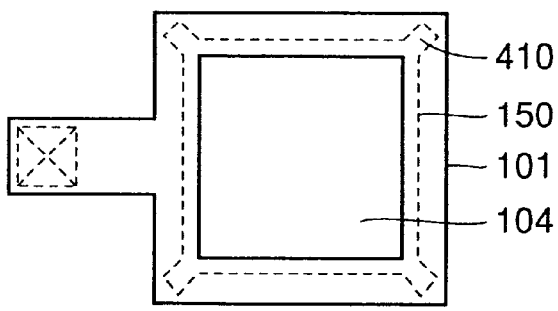
FIG. 97 is a plan view of a main part of a second other example of the semiconductor device in the twelfth embodiment according to the invention.
Figure 98:
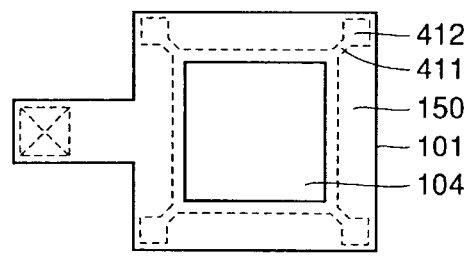
FIG. 98 is a plan view of a main part of a third other example of the semiconductor device in the twelfth embodiment according to the invention.
Figure 99A:
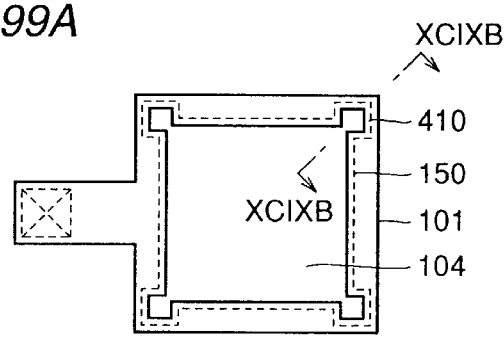
FIG. 99A is a plan view of a main part of a fourth other example of the semiconductor device in the twelfth embodiment according to the invention and FIG. 99B is a sectional view taken on line XCIXB—XCIXB of FIG. 99A as viewed in the direction of arrows.
Figure 99B:
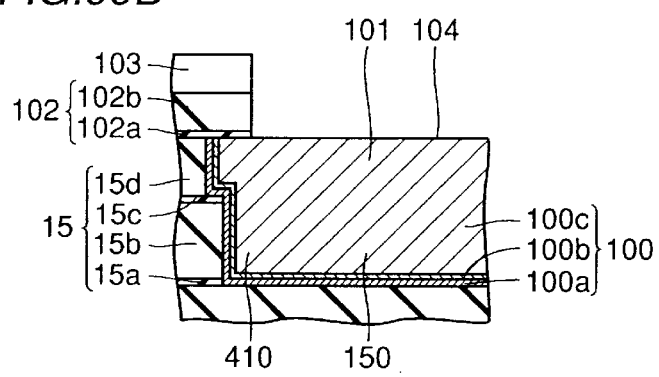
Figure 100:
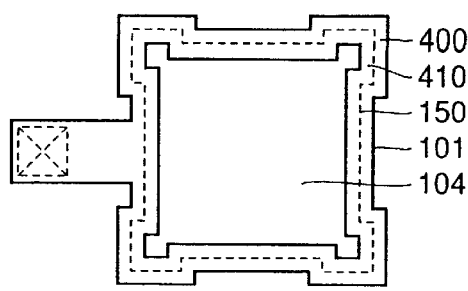
FIG. 100 is a plan view of a main part of a fifth other example of the semiconductor device in the twelfth embodiment according to the invention.

For example, as shown in a sectional view of FIGS. 95 to 97, other patterns such as parts of a circle and an ellipse, a part of a polygon and the like can be adopted as a shape of a stress buffer protruding section 410 disposed at a corner of the lower protruding section 150. Another structure may adopted: As shown in FIG. 98, a plurality of stress buffer protruding sections 421 and 412 are disposed at corners of the lower protruding section 150 in combination. In order to attain more of the stress buffering effect, a structure may be adopted in which protective insulating films 102 and 103 on the stress buffer protruding section 410 are removed as shown in FIG. 99A and 99B. Another modification may be available in combination of a plurality of countermeasures: As shown in FIG. 100, stress buffer protruding sections 410 and 400 are provided at corners of both of the lower protruding section 150 and the pad electrode 101 and in addition, the protective insulating films 102 and 103 on the stress buffer protruding section are removed.

Thirteenth Embodiment

Figure 101A:
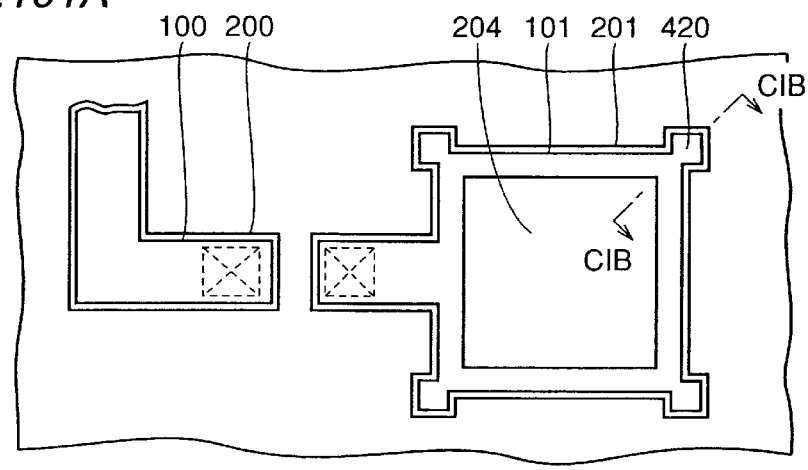
FIG. 101A is a plan view of a semiconductor device in a thirteenth embodiment according to the invention.
Figure 101B:
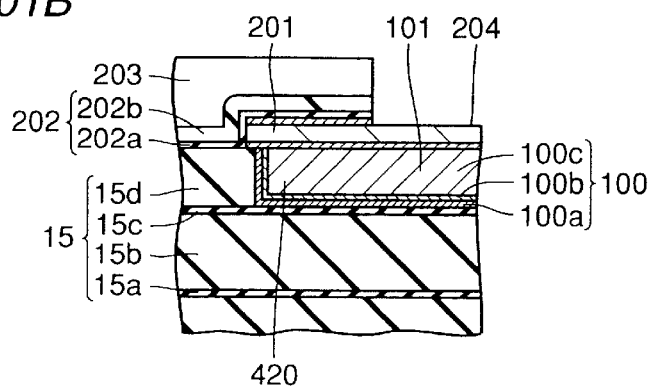
FIG. 101B is a sectional view taken on line CIB—CIB of FIG. 101A as viewed in the direction of arrows and FIG. 101C is a sectional view of the semiconductor device.
Figure 101C:
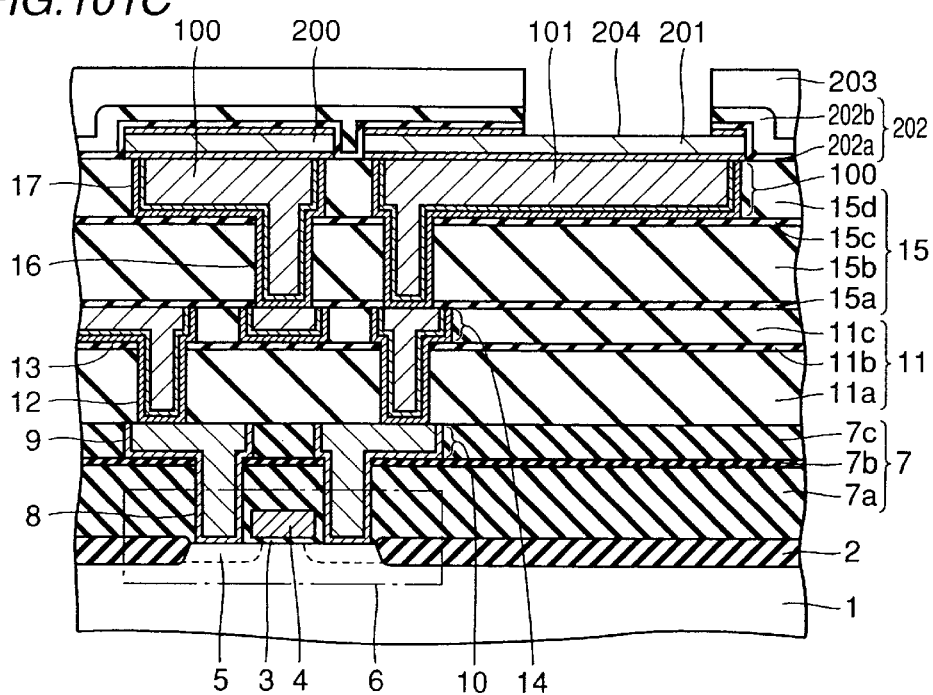

A similar effect is also exerted in a structure of a pad electrode in which at least part thereof is made of a buried metal interconnect layer and a main electrode layer and an upper electrode layer formed thereon are included, wherein a stress buffer protruding section is provided at a corner of the main electrode layer. The structure of the semiconductor device in this embodiment is shown in FIGS. 101A to 101C. The structure is similar to that in the third embodiment (see FIGS. 19A and 19B) with the exception that the stress buffer protruding section is disposed at a corner of the main electrode layer.

According to this embodiment, as shown in FIGS. 101A to 101C, a stress buffer protruding section 420 is placed at an corner of a main electrode layer 101. With such a structure adopted, when a load or impact force is imposed on an upper electrode layer 201 in connection to an external terminal by means of wire bonding or the like, a stress (impact force) is buffered at a corner of the main electrode layer 101 where the stress is especially concentrated with ease by a slight elastic deformation of the stress buffer protruding section 420, such that only a small stress (impact force) acts on the interlayer insulation film around the corner of the main electrode layer 101. Accordingly, cracking can prevented from occurring in the interlayer insulating film around the corner of the corner of the main electrode layer 101.

While in FIGS. 101A to 101C, the stress buffer protruding section 420 of a shape of a tetragon is formed at: a corner of the main electrode layer 101, a similar effect is also exerted with an stress buffer protruding section of another shape. A plurality of stress buffer protruding sections may be formed in combination.

Figure 102:
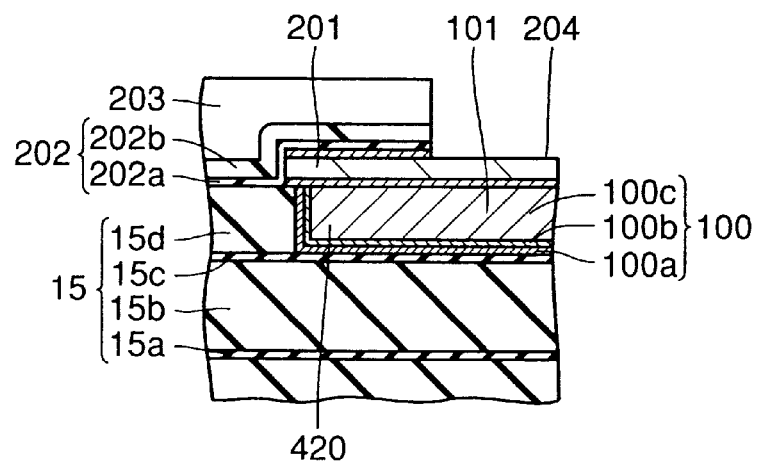
FIG. 102 is a sectional view, taken on line CII—CII of FIG. 103 as viewed in the direction of arrows, of a main part of a semiconductor device in the thirteenth embodiment according to the invention.
Figure 103:
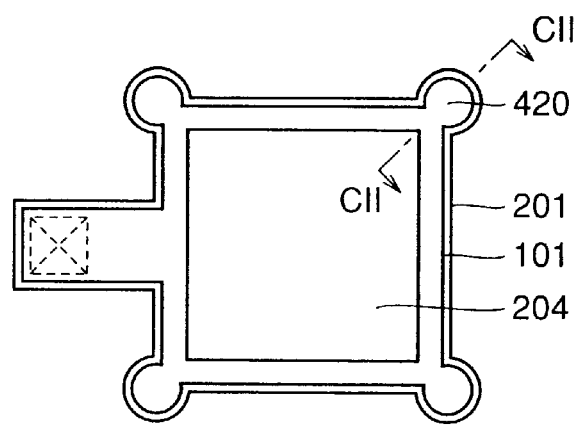
FIG. 103 is a plan view of a main part of a first other example of the semiconductor device in the thirteenth embodiment according to the invention.
Figure 104:
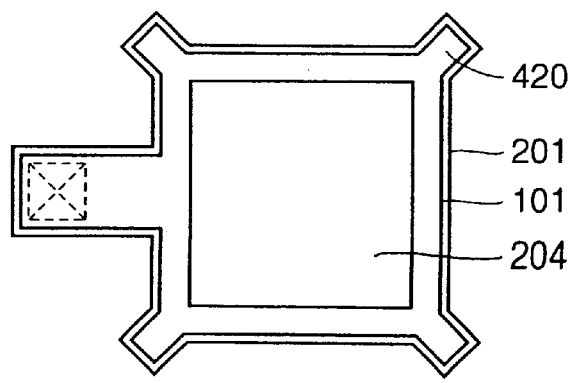
FIG. 104 is a plan view of a main part of a second other example of the semiconductor device in the thirteenth embodiment according to the invention.
Figure 105A:
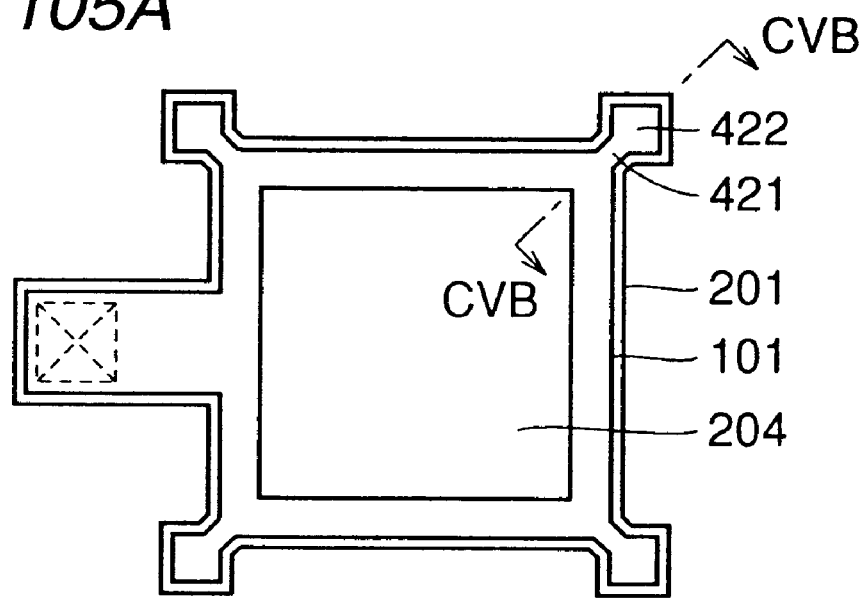
FIG. 105A is a plan view of a main part of a third other example of the semiconductor device in the thirteenth embodiment according to the invention and FIG. 105B is a sectional view taken on line CVB—CVB of FIG. 105A as viewed in the direction of arrows.
Figure 105B:
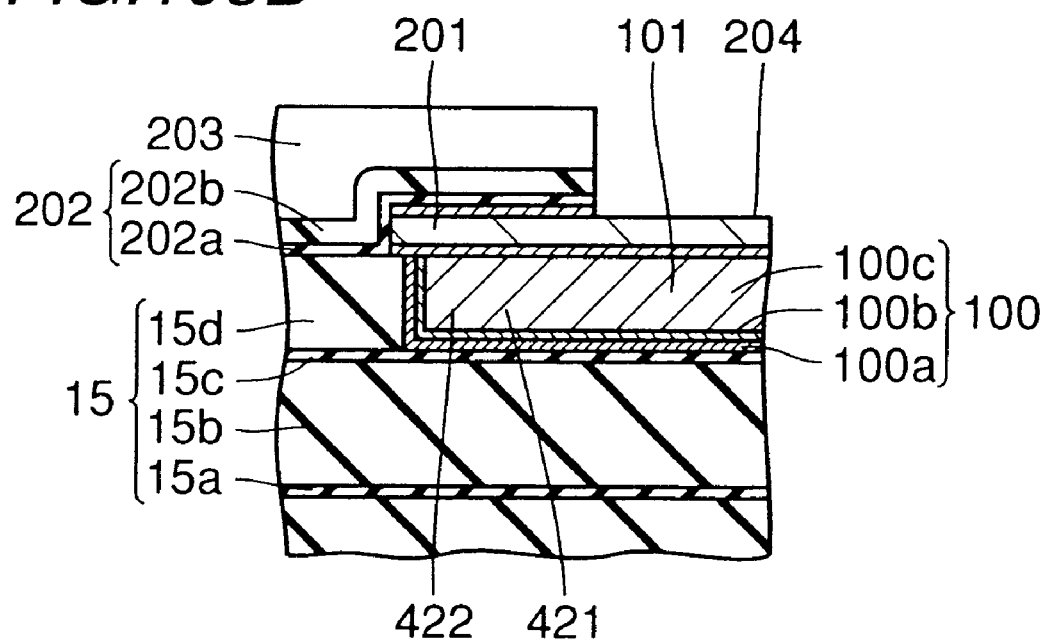
Figure 106A:
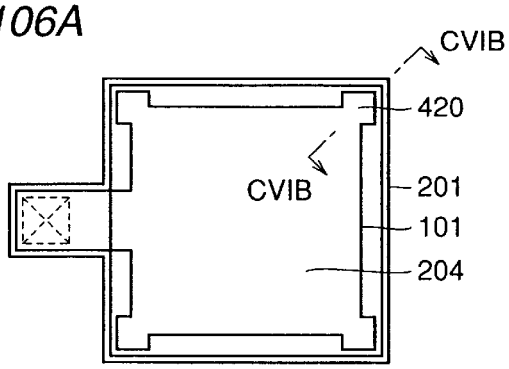
FIG. 106A is a plan view of a main part of a fourth other example of the semiconductor device in the thirteenth embodiment according to the invention and FIG. 106B is a sectional view taken on line CVIB—CVIB of FIG. 106A as viewed in the direction of arrows.
Figure 106B:
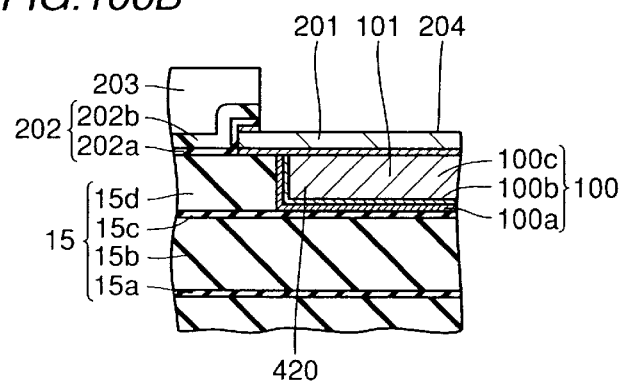
Figure 107A:
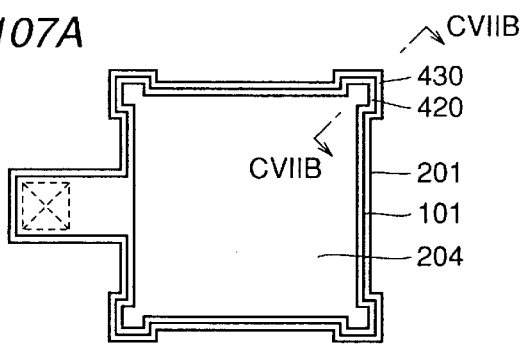
FIG. 107A is a plan view of a main part of a fifth other example of the semiconductor device in the thirteenth embodiment according to the invention and FIG. 107B is a sectional view taken on line CVIIB—CVIIB of FIG. 107A as viewed in the direction of arrows.
Figure 107B:
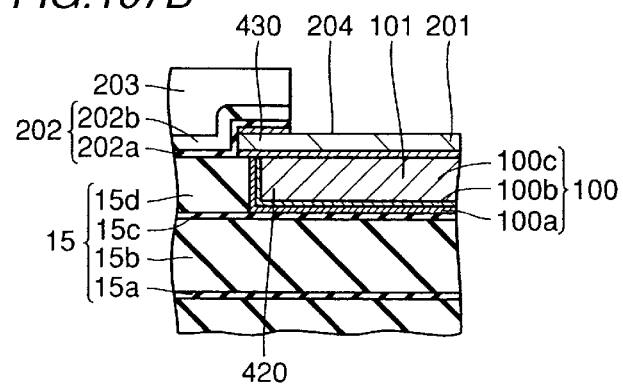

For example, as shown in FIGS. 102 to 104, other patterns such as parts of a circle and an ellipse, a part of a polygon and the like can be adopted as a shape of a stress buffer protruding section 420 disposed at a corner of the main electrode layer 101. Another structure may be adopted: as shown in FIGS. 105A and 105B, a plurality of stress buffer protruding sections 421 and 412 are disposed at corners of the main electrode layer 101 in combination. In order to attain more of the stress buffering effect, a structure may be adopted in which protective insulating films 202 and 203 on the stress buffer protruding section 420 are removed as shown in FIG. 106A and 106B. Another modification may be available in combination of a plurality of countermeasures: as shown in FIGS. 107A and 107B, stress buffer protruding sections 420 and 430 are provided at corners of both of the main electrode layer 101 and the upper electrode layer 201, respectively, and in addition, the protective insulating films 102 and 103 on the stress buffer protruding section 430 are removed.

Fourteenth Embodiment

Figure 108A:
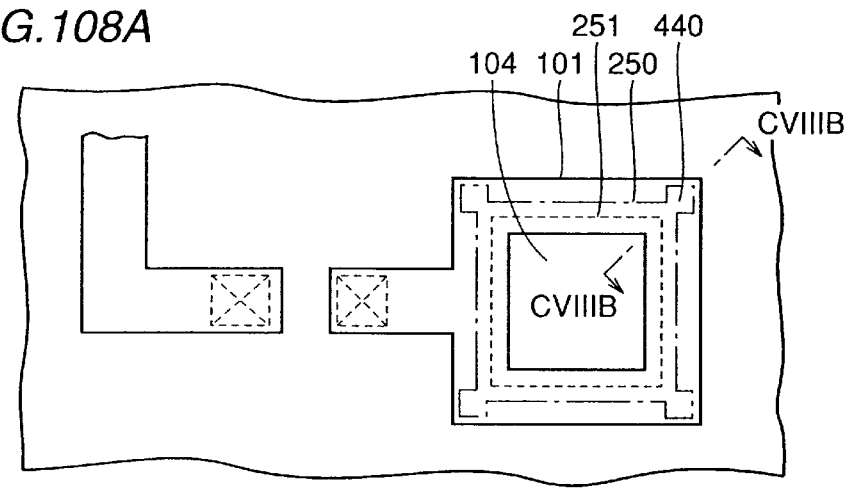
FIG. 108A is a plan view of a semiconductor device in a fourteenth embodiment according to the invention.
Figure 108B:
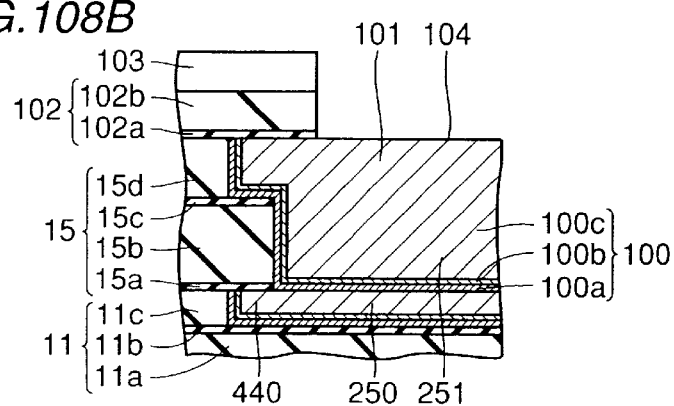
FIG. 108B is a sectional view taken on line CVIIIB—CVIIIB of FIG. 108A as viewed in the direction of arrows and FIG. 108C is a sectional view of the semiconductor device.
Figure 108C:
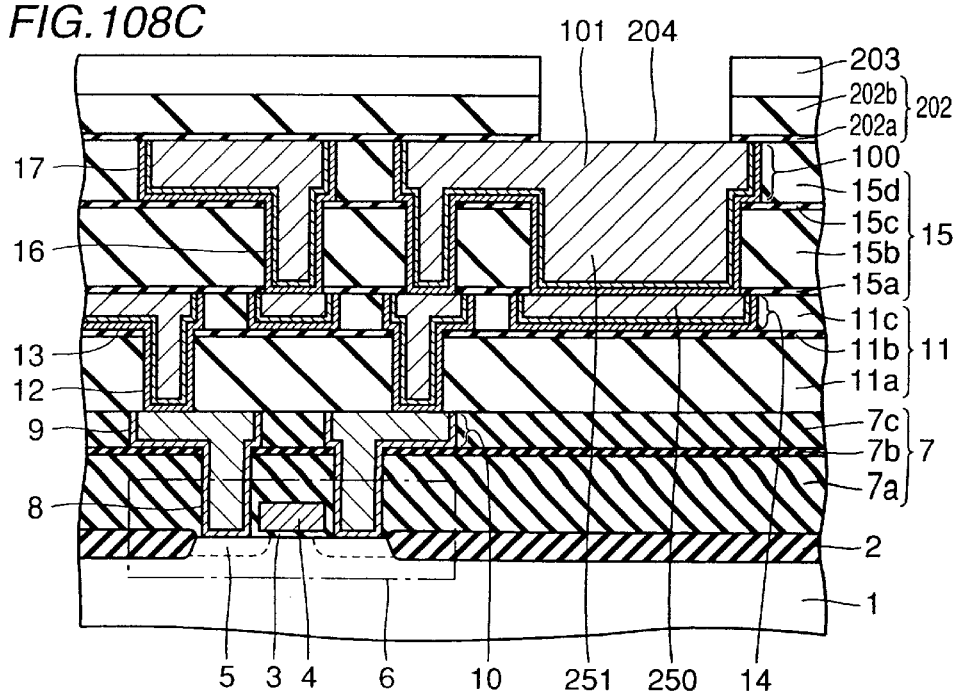

A similar effect is also exerted in a structure of a pad electrode in which at least part thereof is made of a buried metal interconnect layer, and a lower electrode layer and a main electrode layer are superimposed on each other with a connection hole interposed therebetween, wherein a stress buffer protruding section is provided at a corner of the lower electrode layer. The structure of the semiconductor device in this embodiment is shown in FIGS. 108A to 108C. The structure is similar to that in the fourth embodiment (see FIGS. 27A and 27B) with the exception that the stress buffer protruding section is disposed at a corner of the lower electrode layer.

According to this embodiment, as shown in FIGS. 108A to 108C, a stress buffer protruding section 440 is placed at an corner of a lower electrode layer 250.

With such a structure adopted, when a load or impact force is imposed on a main electrode layer 101 in connection to an external terminal by means of wire bonding or the like, a stress (impact force) is buffered at a corner of the lower electrode layer 250 where the stress is especially concentrated with ease by a slight elastic deformation of the stress buffer protruding section 440, such that only a small stress (a small impact force) acts on the interlayer insulation film around the corner of the lower electrode layer 250. Accordingly, cracking can be prevented from occurring in the interlayer insulating film around the corner of the lower electrode layer 250.

While in FIGS. 108A to 108C, the stress buffer protruding section 440 of a shape of a tetragon is formed at a corner of the lower electrode layer 250, a similar effect is also exerted with an stress buffer protruding section of another shape. A plurality of stress buffer protruding sections may be formed in combination.

Figure 109:
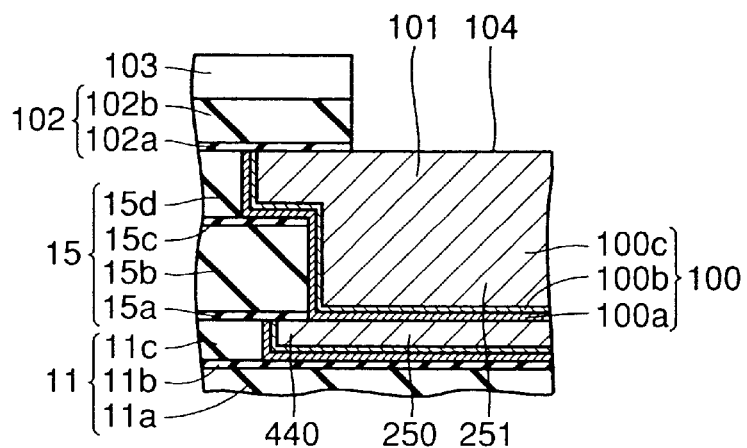
FIG. 109 is a sectional view, taken on line CIX—CIX of FIG. 110 as viewed in the direction of arrows, of a main part of a semiconductor device in the fourteenth embodiment according to the invention.
Figure 110:
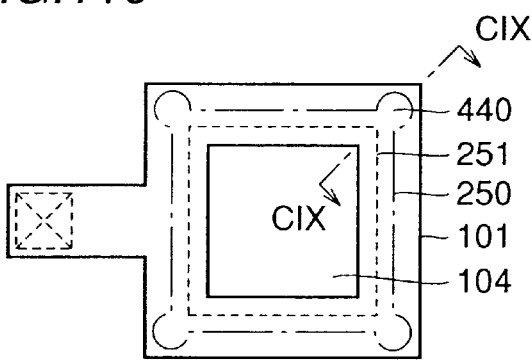
FIG. 110 is a plan view of a main part of a first other example of the semiconductor device in the fourteenth embodiment according to the invention.
Figure 111:
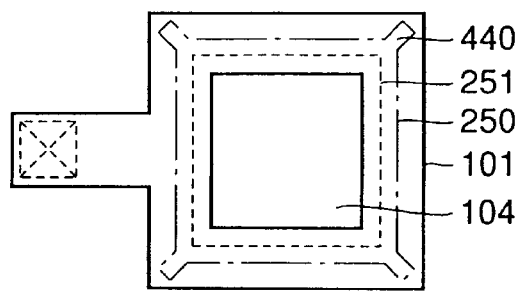
FIG. 111 is a plan view of a main part of a second other example of a semiconductor device in the fourteenth embodiment according to the invention.
Figure 112A:
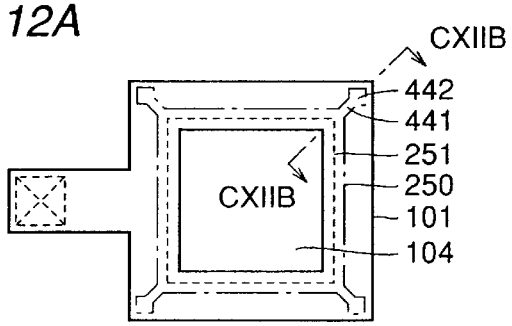
FIG. 112A is a plan view of a main part of a third other example of the semiconductor device in the fourteenth embodiment according to the invention and FIG. 112B is a sectional view taken on line CXIIB—CXIIB of FIG. 112A as viewed in the direction of arrows.
Figure 112B:
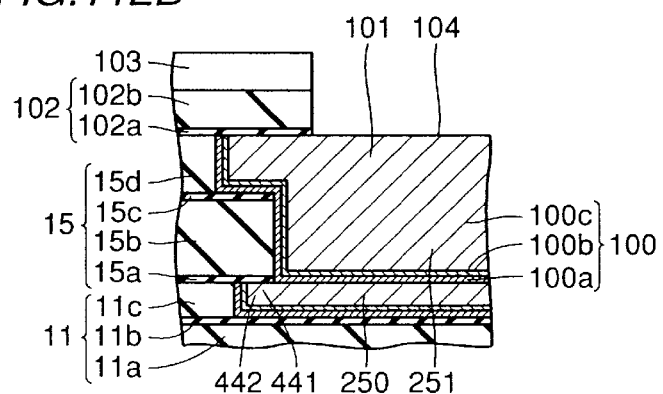
Figure 113A:
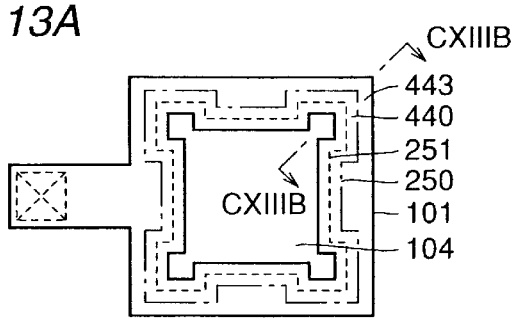
FIG. 113A is a plan view of a main part of a fourth other example of the semiconductor device in the fourteenth embodiment according to the invention and FIG. 113B is a sectional view taken on line CXIIIB—CXIIIB of FIG. 113A as viewed in the direction of arrows.
Figure 113B:
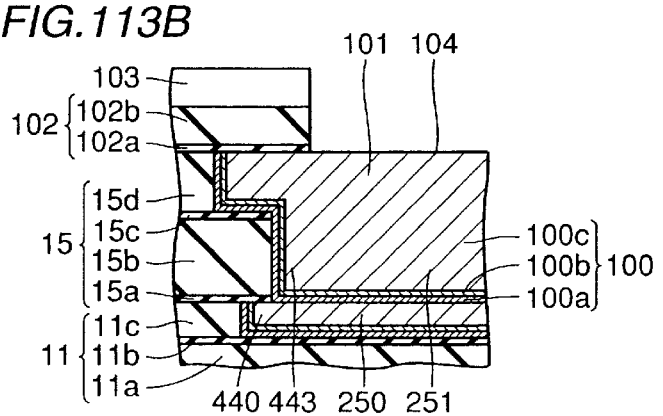

For example, as shown in FIGS. 109 to 111, other patterns such as parts of a circle and an ellipse, a part of a polygon and the like can be adopted as a shape of a stress buffer protruding section 440 disposed at a corner of the lower electrode layer 250. Another structure may be adopted: As shown in FIGS. 112A and 112B, a plurality of stress buffer protruding sections 441 and 442 are disposed at corners of the lower electrode layer 250 in combination. In order to attain more of the stress buffer effect, a structure may be adopted in which as shown in FIGS. 113A and 113B, the stress buffer protruding section 440 at a corner of the lower electrode layer and a stress buffer protruding section 443 at a corner of a connection hole 251 are superimposed on each other and in addition, protective insulating films 102 and 103 thereon are removed.

Figure 114A:
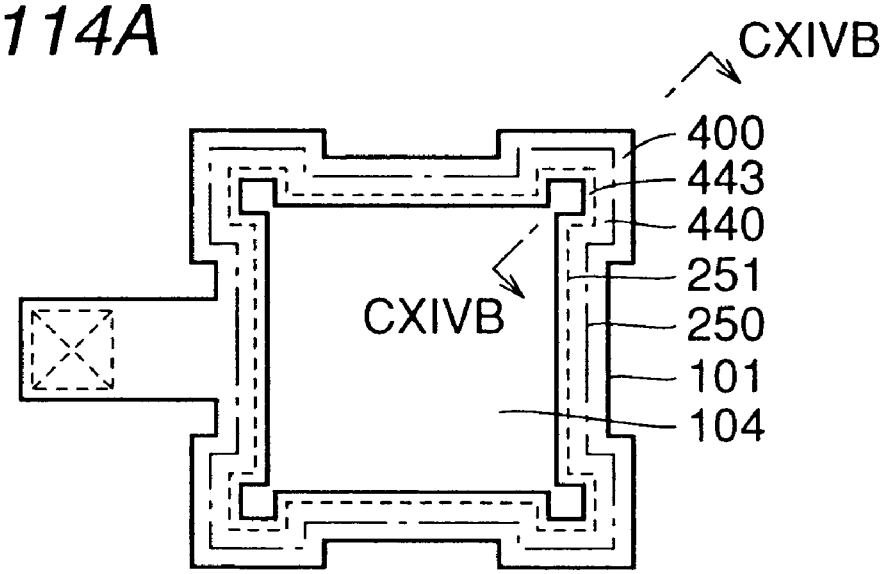
FIG. 114A is a plan view of a main part of a fifth other example of the semiconductor device in the fourteenth embodiment according to the invention and FIG. 114B is a sectional view taken on line CXIVB—CXIVB of FIG. 114A as viewed in the direction of arrows.
Figure 114B:
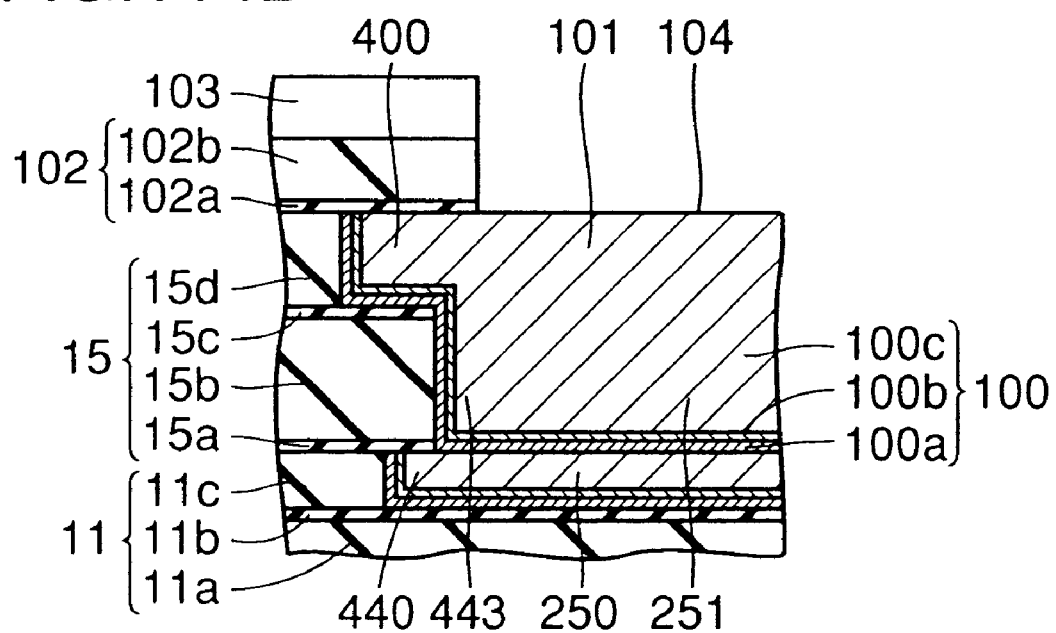

Another modification may be available in combination of a plurality of countermeasures: As shown in FIGS. 114A and 114B, stress buffer protruding sections 440, 443 and 400 are provided at corners of all of the lower electrode layer 250, the connection hole 251 and the main electrode layer 101, respectively, and in addition, the protective insulating films 102 and 103 on the stress buffer protruding section 400 are removed.

Fifteenth Embodiment

A similar effect is also exerted in a structure of a pad electrode in which at least part thereof is made of a buried metal interconnect layer, a lower electrode layer and a main electrode layer are superimposed on each other with a connection hole interposed therebetween and a thickness of the lower electrode layer is partially larger downward so as to form a lower protruding section, wherein a stress buffer protruding section is provided at a corner of the lower protruding section. The structure of the semiconductor device in this embodiment is shown in FIGS. 115A to 115C.

The structure is similar to that in the fifth embodiment (see FIGS. 36A and 36B) with the exception that the stress buffer protruding section is disposed at a corner of the lower protruding section.

Figure 115A:
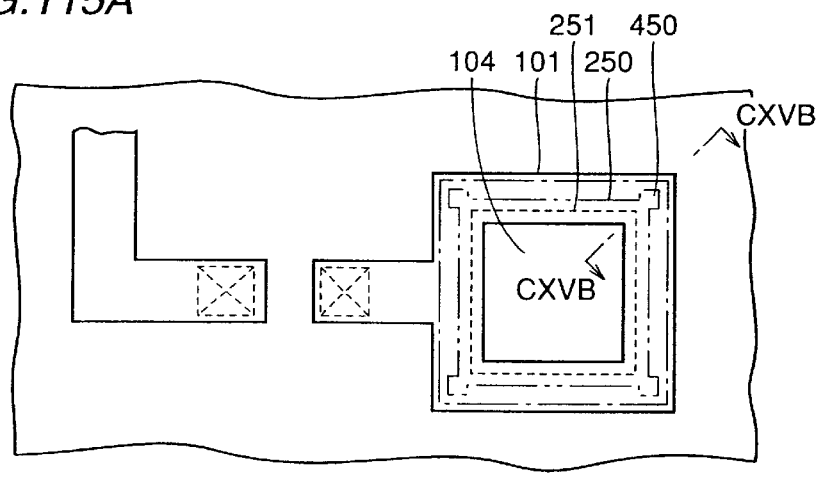
FIG. 115A is a plan view of a semiconductor device in a fifteenth embodiment according to the invention.
Figure 115B:
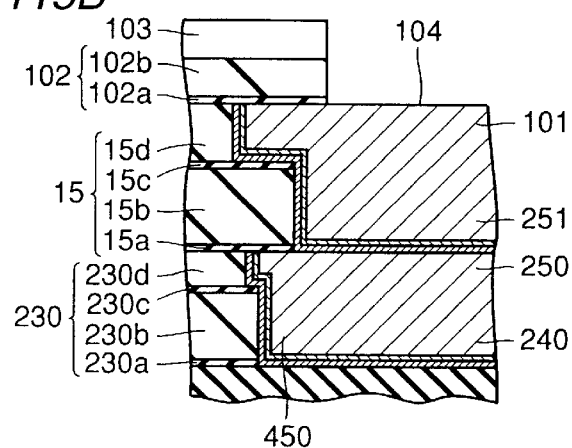
FIG. 115B is a sectional view taken on line CXVB—CXVB of FIG. 115A as viewed in the direction of arrows and FIG. 115C is a sectional view of the semiconductor device.
Figure 115C:
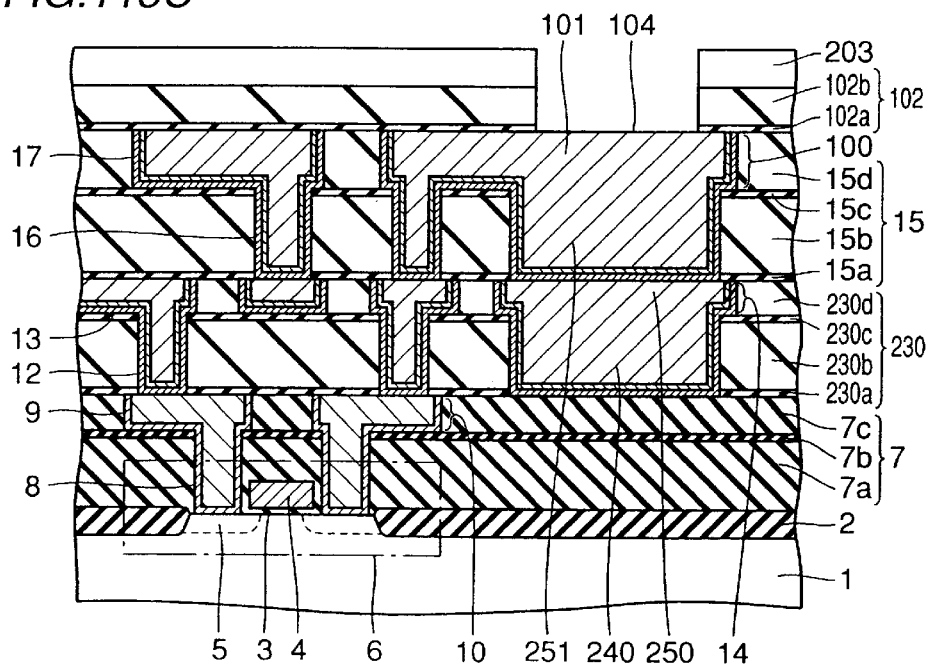

According to this embodiment, as shown in FIGS. 115A to 115C, a stress buffer protruding section 450 is placed at an corner of a lower protruding section 240 of the lower electrode layer.

With such a structure adopted, when a load or impact force is imposed on a main electrode layer 101 in connection to an external terminal by means of wire bonding or the like, a stress (impact force) is buffered at a corner of the lower protruding section 240 where the stress is especially concentrated with ease by a slight elastic deformation of the stress buffer protruding section 450, such that only a small stress (impact force) acts on the interlayer insulation film around the corner of the lower protruding section 240. Accordingly, cracking can be prevented from occurring in the interlayer insulating film around the corner of the lower protruding section 240.

While in FIGS. 115A to 115C, the stress buffer protruding section 450 of a shape of a tetragon is formed at a corner of the lower protruding section 240, a similar effect is also exerted with an stress buffer protruding section of another shape. A plurality of stress buffer protruding sections may be formed in combination.

Figure 116:
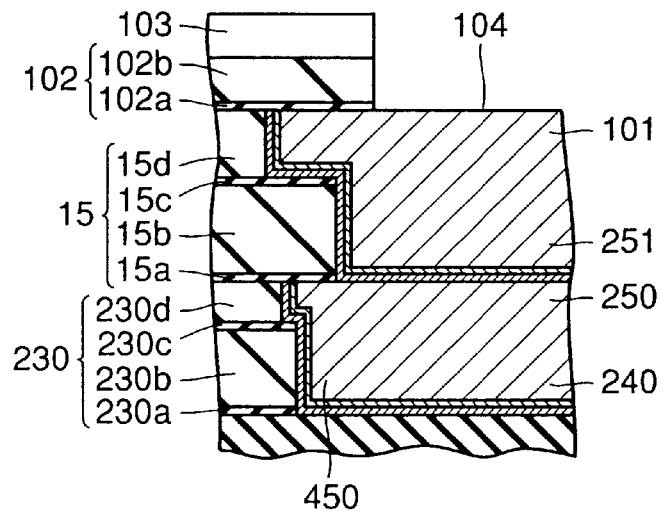
FIG. 116 is a sectional view, taken on line CXVI—CXVI of FIG. 117 as viewed in the direction of arrows, of a main part of a semiconductor device in the fifteenth embodiment according to the invention.
Figure 117:
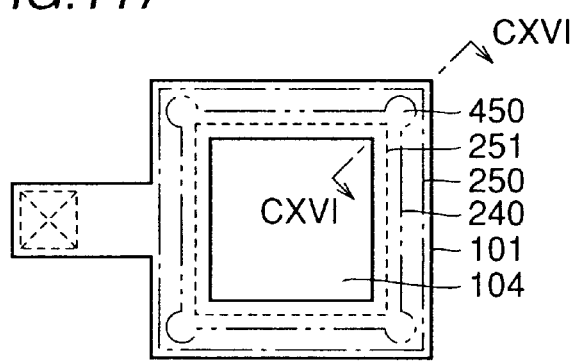
FIG. 117 is a plan view of a main part of a first other example of the semiconductor device in the fifteenth embodiment according to the invention.
Figure 118:
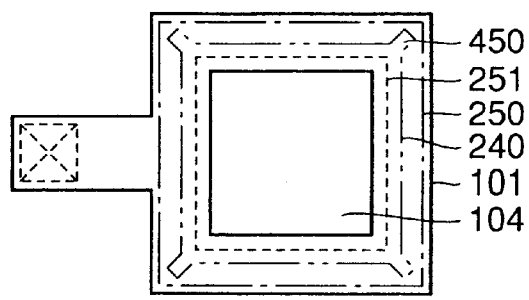
FIG. 118 is a plan view of a main part of a second other example of the semiconductor device in the fifteenth embodiment according to the invention.

For example, as shown in FIGS. 116 to 118, other patterns such as parts of a circle and an ellipse, a part of a polygon and the like can be adopted as a shape of a stress buffer protruding section 450 disposed at a corner of the lower protruding section 240.

Figure 119:
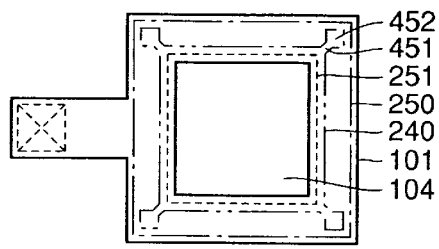
Figure 120A:
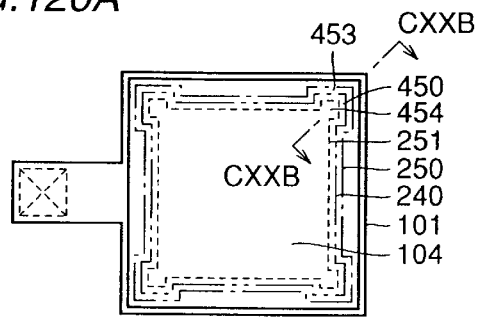
Figure 120B:
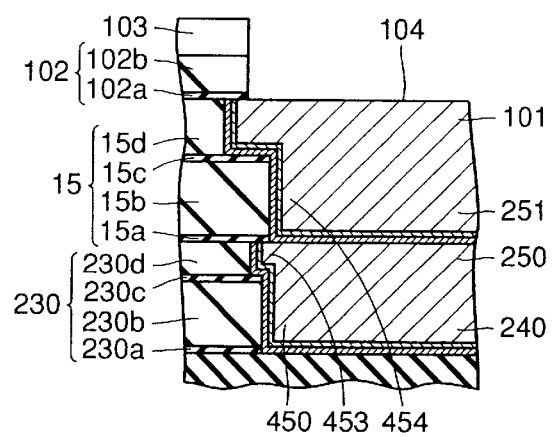

Another structure may be adopted: As shown in FIG. 119, a plurality of stress buffer protruding sections 451 and 452 are disposed at corners of the lower protruding section 240 in combination. In order to attain more of the stress buffer effect,. a structure may be adopted in which as shown in FIGS. 120A and 120B, a stress buffer protruding section 450 at a corner of the lower protruding section 240, a stress buffer protruding section 453 at a corner of the lower electrode layer 250 and a stress buffer protruding section 454 at a corner of a connection hole 251 are superimposed on one another and in addition, protective insulating films 102 and 103 thereon are removed.

Figure 121:
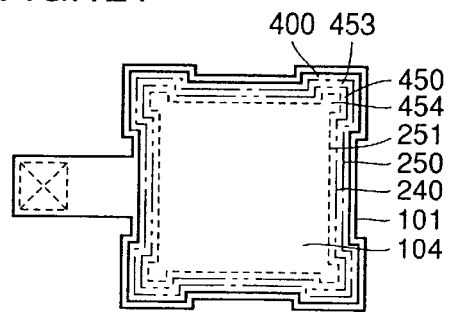

Another modification may be available in combination of a plurality of countermeasures: As shown in FIG. 121, stress buffer protruding sections 450, 453, 454 and 400 are provided at corners of all of the lower protruding section 240, the lower electrode layer 250, the connection hole 251 and the main electrode layer 101, respectively, and in addition, the protective insulating films 102 and 103 on the stress buffer protruding section 400 are removed.

According to the invention, since a pad electrode has a prescribed plan view shape and includes a lower protruding section, a stress buffer insulating partition, a stress buffer protruding section and the like in a proper combination, when a load or impact force is imposed on the pad electrode in connection to an external terminal by means of wire bonding or the like, a stress concentration is alleviated around a corner of the pad electrode. Accordingly, cracking can prevented from occurring in the interlayer insulating film around a corner of the pad electrode. With such a structure adopted, since a load and impact allowable in wire bonding increases, the wire bonding can be effected so as to attain a sufficient connection strength, thereby enabling a semiconductor device with high reliability to be realized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a pad electrode comprising: a pad section made of substantially a conductive electrode material; and
   an underlying film covering at least part of said pad section at least at a bottom and a side wall of said pad section, wherein
      a material of said underlying film is harder than said electrode material and at least part of an upper surface of said pad section is exposed for connection to a wire,
      a shape of a plan view of said pad electrode is one selected from the group consisting of a near circle, a near ellipse, a near polygon with at least one internal angle larger than 90 degrees and a near polygon with at least one corner chamfered or rounded,
      said pad electrode comprises: a lower protruding section protruding downward from said pad electrode, said lower protruding section having a cross-sectional area smaller than said pad electrode and
      a shape of a plan view of said lower protruding section is one selected from the group consisting of a near circle, a near ellipse, a near polygon with at least one internal angle larger than 90 degrees and a near polygon with at least one corner chamfered or rounded.

2. A semiconductor device according to claim 1, wherein said lower protruding section comprises: a stress buffer insulating partition dividing said pad section in a corner region thereof.

3. A semiconductor device according to claim 1, wherein said lower protruding section comprises: a stress buffer protruding section protruding at a corner thereof.

4. A semiconductor device comprising:
   a pad electrode comprising: a pad section made of substantially a conductive electrode material; and
   an underlying film covering at least part of said pad section at least at a bottom and a side wall of said pad section, wherein
      a material of said underlying film is harder than said electrode material and at least part of an upper surface of said pad section is exposed for connection to a wire,
      a shape of a plan view of said pad electrode is one selected from the group consisting of a near circle, a near ellipse, a near polygon with at least one internal angle larger than 90 degrees and a near polygon with at least one corner chamfered or rounded,
      said pad electrode includes a main electrode layer made of said electrode material and an upper electrode layer contacting an upper surface of said main electrode layer, and a shape of a plan view of said upper electrode layer is one selected from the group consisting of a near circle, a near ellipse, a near polygon with at least one internal angle larger than 90 degrees and a near polygon with at least one corner chamfered or rounded.

5. A semiconductor device according to claim 4, wherein said main electrode layer comprises: a stress buffer insulating partition dividing said pad section in a corner region thereof.

6. A semiconductor device according to claim 4, wherein said main electrode layer comprises: a stress buffer protruding section protruding at a corner thereof.

7. A semiconductor device comprising:

a pad electrode comprising: a pad section made of substantially a conductive electrode material; and an underlying film covering at least part of the pad section at least at a bottom and a side wall of said pad section, wherein a material of the underlying film is harder than said electrode material and at least part of an upper surface of the pad section is exposed for connection to a wire, a shape of a plan view of said pad electrode is one selected from the group consisting of a near circle, a near ellipse, a near polygon with at least one internal angle larger than 90 degrees and a near polygon with at least one corner chamfered or rounded, said pad electrode comprises: a main electrode layer made of said electrode material; and a lower electrode layer connected to said main electrode layer, on a lower side of said main electrode layer, via a connection hole interposed therebetween, said connection hole having an outer periphery of a shape along and in the inside vicinity of an outer periphery of a shape of a plan view of said main electrode layer, and a shape of a plan view of at least one of said lower electrode layer and said connection hole is one selected from the group consisting of a near circle, a near ellipse, a near polygon with at least one internal angle larger than 90 degrees and a near polygon with at least one corner chamfered or rounded.

8. A semiconductor device according to claim 7, wherein at least one of said lower electrode layer and said connection hole comprises: a stress buffer insulating partition dividing said pad section in an corner region thereof.

9. A semiconductor device according to claim 7, wherein at least one of said lower electrode layer and said connection hole comprises: a stress buffer protruding section protruding at a corner thereof.

10. A semiconductor device according to claim 7, wherein said lower electrode layer comprises: a lower protruding section protruding downward from said lower electrode layer, said lower protruding section having a cross-sectional area smaller than said lower electrode layer and a shape of a plan view of said lower protruding section being one selected from the group consisting of a near circle, a near ellipse, a near polygon with at least one internal angle larger than 90 degrees and a near polygon with at least one corner chamfered or rounded.

11. A semiconductor device according to claim 10, wherein said lower protruding section comprises: a stress buffer insulating partition dividing said pad section in a corner region thereof.

12. A semiconductor device according to claim 10, wherein said lower protruding section comprises: a stress buffer protruding section protruding at a corner thereof.

* * * * *